US011774653B2

(12) United States Patent
Watanabe et al.

(10) Patent No.: US 11,774,653 B2
(45) Date of Patent: Oct. 3, 2023

(54) WAVELENGTH CONVERSION FILM, LIGHT-EMITTING MEMBER, AUTHENTICATION DEVICE, WRISTBAND TYPE ELECTRONIC APPARATUS AND BIOMETRIC DEVICE

(71) Applicant: Konica Minolta, Inc., Tokyo (JP)

(72) Inventors: Mio Watanabe, Hino (JP); Kenichi Tabata, Inagi (JP); Ryo Nakabayashi, Hachioji (JP); Yasuo Miyata, Yokohama (JP)

(73) Assignee: KONICA MINOLTA, INC., Tokyo (JP)

( * ) Notice: Subject to any disclaimer, the term of this patent is extended or adjusted under 35 U.S.C. 154(b) by 229 days.

(21) Appl. No.: 17/420,631

(22) PCT Filed: Jan. 16, 2020

(86) PCT No.: PCT/JP2020/001313
§ 371 (c)(1),
(2) Date: Jul. 2, 2021

(87) PCT Pub. No.: WO2020/149368
PCT Pub. Date: Jul. 23, 2020

(65) Prior Publication Data
US 2022/0082740 A1 Mar. 17, 2022

(30) Foreign Application Priority Data
Jan. 16, 2019 (JP) ................................ 2019-005054

(51) Int. Cl.
*G02B 5/22* (2006.01)
*G06V 40/10* (2022.01)
(Continued)

(52) U.S. Cl.
CPC ............. *G02B 5/223* (2013.01); *G06F 1/163* (2013.01); *G06V 40/10* (2022.01); *H10K 50/12* (2023.02); *G06V 40/117* (2022.01)

(58) Field of Classification Search
CPC ........ G02B 5/223; G06F 1/163; G06V 40/10; G06V 40/117; H10K 50/12; H10K 59/38; C09B 57/00; C09K 11/06; H05B 33/12
See application file for complete search history.

(56) References Cited

U.S. PATENT DOCUMENTS

2008/0252198 A1* 10/2008 Katano .................. C09K 11/06 252/301.16
2010/0289632 A1* 11/2010 Seder ..................... G06V 10/95 382/104
2021/0113076 A1* 4/2021 Abe ......................... A61B 1/07

FOREIGN PATENT DOCUMENTS

JP 2000230172 A * 8/2000
JP 2007-157550 A 6/2007
(Continued)

OTHER PUBLICATIONS

PCT, International Search Report for the corresponding application No. PCT/JP2020/001313, dated Mar. 24, 2020, with English translation.

(Continued)

*Primary Examiner* — Brent D Castiaux
(74) *Attorney, Agent, or Firm* — LUCAS & MERCANTI, LLP

(57) ABSTRACT

Disclosed is a wavelength conversion film including at least two or more dyes and absorbing irradiation light to emit light at a longer wavelength than that of the irradiation light. The wavelength conversion film includes a first dye having a maximum absorption wavelength in a red light region, and
(Continued)

a second dye absorbing excitation energy of the first dye to emit light in a near infrared region.

12 Claims, 6 Drawing Sheets

(51) Int. Cl.

| | |
|---|---|
| ***H10K 50/12*** | (2023.01) |
| ***G06F 1/16*** | (2006.01) |

(56) References Cited

FOREIGN PATENT DOCUMENTS

| | | | | |
|---|---|---|---|---|
| JP | 2018-111674 | A | | 7/2018 |
| WO | WO 2019187637 | A1 | * | 3/2019 |
| WO | 2019/187637 | A1 | | 10/2019 |

OTHER PUBLICATIONS

PCT, Written Opinion of ISA for the corresponding application No. PCT/JP2020/001313, dated Mar. 24, 2020, with English translation.
Office Action dated Aug. 22, 2023, for the corresponding Japanese Patent Application No. 2020-566476, with English translation.

* cited by examiner

WAVELENGTH CONVERSION FILM, LIGHT-EMITTING MEMBER, AUTHENTICATION DEVICE, WRISTBAND TYPE ELECTRONIC APPARATUS AND BIOMETRIC DEVICE

CROSS REFERENCE TO RELATED APPLICATION

This Application is a 371 of PCT/JP2020/001313 filed on Jan. 16, 2020, which claims priority of Japanese Patent Applications No. 2019-005054 filed Jan. 16, 2019, the above applications are incorporated herein by reference.

TECHNICAL FIELD

The present invention relates to a wavelength conversion film, a light-emitting member, an authentication device, a wristband-type electronic apparatus and a biometric device, and particularly relates to a wavelength conversion film excellent in light emission in the near-infrared region and in weather resistance of the film, and the others.

BACKGROUND ART

An organic electroluminescence element (hereinafter, also referred to as "organic EL element" or "OLED") is currently actively developed that uniformly emits light on the entire surface and is a self-light emitting type of an all solid-state light emitting element.

An organic EL element for use in an illumination or a display can emit light of any color depending on the configuration thereof, and there is known not only an organic EL element that emits visible light, but also an organic EL element that emits invisible light such as near-infrared light. Near-infrared light is used for various analysis apparatuses and the like, and is also utilized in a biometric authentication application, which rapidly attracts attention in an information society, and in such an application, person's data (fingerprint, vein, iris, retina, palm shape, facial expression, body shape, voiceprint, and/or the like) that is inherent for an organism is used. Biometric authentication is characterized by being high in security and not causing any forgetting, loss, and the like as compared with keys and passwords, because of using features (biological information) of a portion and/or action of an organism. Accordingly, biometric authentication is very useful as a technique for preventing unauthorized access to and divulgation of corporate information and individual information, as importance of security countermeasures increases in, for example, a bank ATM (Automated Teller Machine, cash dispenser), a mobile phone, a PDA (Personal Data Assistant, portable information terminal), and a personal computer.

An imaging device for biometric authentication is progressively reduced in size in view of the degree of freedom of installation, and a case is known in which a surface light source (organic EL element) in the form of a thin film is used as a light source (see, for example, Patent Literature 1.).

However, there are still known only a few light emitters that thus emit near-infrared light.

While a technique for lengthening the wavelength of light emission with a wavelength conversion film in order to obtain an organic EL element for multicolor emission is widely known (see, for example, Patent Literature 2.), such a technique cannot achieve light emission in the near-infrared region and resistance to light, heat and the like in a compatible manner.

CITATION LIST

Patent Literature

Patent Literature 1: JP 2018-111674A
Patent Literature 2: JP 2007-157550A

SUMMARY OF INVENTION

Technical Problem

The present invention has been made in view of the above problems and circumstances, and an object thereof to be achieved is to provide a wavelength conversion film excellent in light emission in the near-infrared region and in resistance of the film against light and heat, namely, weather resistance. Another object is to use the wavelength conversion film to provide a light-emitting member excellent in weather resistance and excellent in intensity of light emission, and an authentication device, a wristband-type electronic apparatus and a biometric device each including the light-emitting member.

Solution to Problem

The present inventors have made studies about the cause of the problem in order to achieve the objects, and has found that a wavelength conversion film excellent in light emission in the near-infrared region and in durability and weather resistance of the film can be provided by incorporating the a first dye that has absorption in the red light region and a second dye that receives excitation energy of the first dye into wavelength conversion film to emit light in the near-infrared region, thereby leading to the present invention.

Specifically, the objects of the present invention are achieved by the following solution.

1. A wavelength conversion film including at least two or more dyes and absorbing irradiation light to emit light at a longer wavelength than that of the irradiation light, wherein the wavelength conversion film includes a first dye having a maximum absorption wavelength in a red light region, and a second dye absorbing excitation energy of the first dye to emit light in a near-infrared region.
2. The wavelength conversion film according to Item 1, wherein a maximum light emission wavelength of light in the near-infrared region emitted from the wavelength conversion film is in a range from 700 to 1500 in.
3. The wavelength conversion film according to Item 1 or Item 2, wherein a maximum light emission wavelength of light in the near-infrared region emitted from the wavelength conversion film is in a range from 750 to 1400 nm.
4. The wavelength conversion film according to any one of Item 1 to Item 3, wherein the first and second dyes are each a squarylium compound.
5. A light-emitting member including a surface light source that emits red light, and the wavelength conversion film according to any one of Item 1 to Item 4.
6. The light-emitting member according to Item 5, wherein the surface light source is an organic electroluminescence element.
7. An authentication device including the light-emitting member according to Item 5 or Item 6.
8. A wristband-type electronic apparatus including the authentication device according to Item 7, wherein the apparatus performs biometric authentication by imaging a wrist vein.

9. The wristband-type electronic apparatus according to Item 8, including a light source and an imager, wherein the light source is in any location on a wristband, and when worn, the location is on a plane other than a plane on which an imager is located.
10. A biometric device including the light-emitting member according to Item 5 or Item 6.
11. The biometric device according to Item 10, wherein the biometric device is a pulse oximeter for measurement on the wrist or the finger root.
12. The biometric device according to Item 10, wherein the biometric device is a pulse wave sensor for measurement on the wrist or the finger root.

Advantageous Effects of Invention

According to the above solution of the present invention, a wavelength conversion film is provided that is excellent in light emission in the near-infrared region and in resistance of the film against light and heat, namely, weather resistance. The wavelength conversion film can be used to provide a light-emitting member excellent in weather resistance and excellent in intensity of light emission, and an authentication device, a wristband-type electronic apparatus and a biometric device each including the light-emitting member.

The expression mechanism or action mechanism of the effects of the present invention is not clear but is presumed as follows.

It is presumed that the wavelength conversion film of the present invention, which contains a first dye using red light as excitation light in the film, can thus allow for use of a source of red light, which is light lower in energy than light commonly used in a conversion technique (blue to blue-green light), and that therefore degradation of the wavelength conversion film can be suppressed.

Moreover, degradation of the wavelength conversion film can be prevented by assigning roles of light absorption (excitation) and light emission to two dyes, the first and second dyes.

Furthermore, in a case where a dye very high in weather resistance is used for the first and second dyes, a wavelength conversion film including such dyes is also excellent in weather resistance.

DESCRIPTION OF EMBODIMENTS

Figure 1:
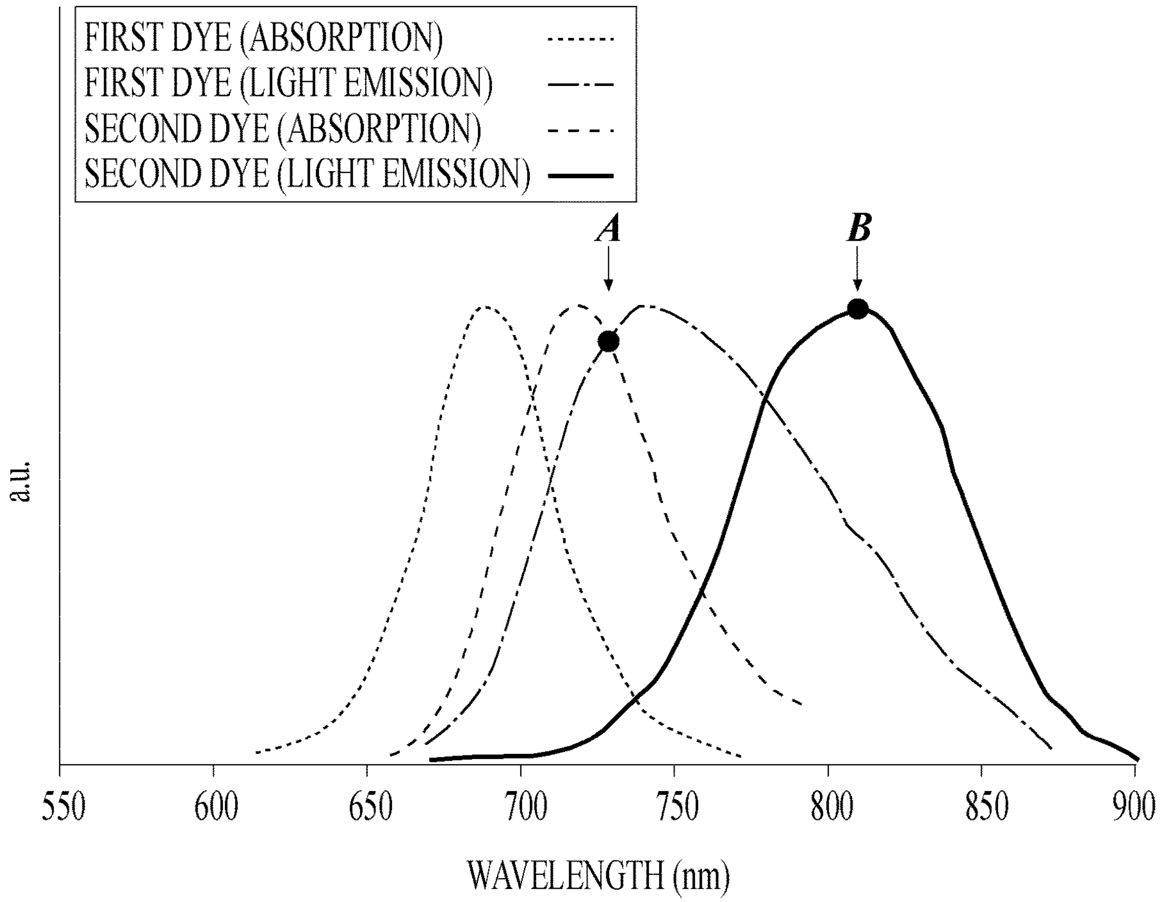
FIG. 1 A diagram illustrating a relationship between absorption spectra and light emission spectra of a first dye and a second dye in the wavelength conversion film of the present invention.

The wavelength conversion film of the present invention is a wavelength conversion film including at least two or more dyes and absorbing irradiation light to emit light at a longer wavelength than that of the irradiation light, wherein the wavelength conversion film includes a first dye having a maximum absorption wavelength in the red light region, and a second dye absorbing excitation energy of the first dye to emit light in the near-infrared region.

This feature is a technical feature common to or corresponding to embodiments described below.

In an embodiment of the present invention, the maximum light emission wavelength of light in the near-infrared region emitted from the wavelength conversion film is preferably in a range from 700 to 1500 nm, in view of obtaining light emission in the near-infrared region. In particular, the wavelength is preferably in a range from 750 nm to 1400 nm, and furthermore, is preferably in a range from 800 to 1000 mu in a case where the wavelength conversion film is used in an authentication device (for biometric authentication), a wristband-type electronic apparatus, and a biometric device (pulse oximeter, pulse wave sensor), in view of overlapping with the absorption region of hemoglobin and not overlapping with the absorption region of water. In other applications, the wavelength is preferably in a range of 900 mu or more, in which any absorption is observed, in aqueous solution examination, and preferably in a range of 1400 nm or more, which corresponds to an eye-safe band, in eyeball examination.

The intensity of light emission or absorption at the wavelength corresponding to the intersection between a light emission spectrum of the first dye and an absorption spectrum of the second dye is preferably one-quarter or more, further preferably one-third or more of the intensity of light emission at the maximum light emission wavelength in a light emission spectrum of the second dye, in view of the following: overlapping between the light emission spectrum of the first dye and the absorption spectrum of the second dye is increased, effective energy transfer from the first dye to the second dye can be made, and the intensity of light emission obtained from the second dye, namely, that obtained from the wavelength conversion film is increased.

The first and second dyes are each preferably a squarylium compound in view of very high weather resistance and also excellent weather resistance of a resulting wavelength conversion film containing the first and second dyes.

The wavelength conversion film of the present invention is suitably used in a light-emitting member including a surface light source that emits red light.

The surface light source is preferably an organic electroluminescence element in view of obtaining a light-emitting member which exhibits high luminance uniformity and also is a thin film excellent in flexibility and excellent in durability.

The light-emitting member of the present invention is suitably used in an authentication device.

Hereinafter, the present invention and components thereof, and embodiments/aspects of the present invention will be described. In the present application, the word "to" is used to mean that numerical values described before and after the word are included as the lower limit value and the upper limit value, respectively. In descriptions with reference to a drawing, a number noted in brackets at the end of a component is a symbol noted in the drawing to be described. Any dimensional ratio in each drawing is inflated for convenience of illustration, and may differ from an actual ratio.

[Summary of Wavelength Conversion Film of Present Invention]

The wavelength conversion film of the present invention is a wavelength conversion film including at least two or more dyes and absorbing irradiation light to emit light at a longer wavelength than that of the irradiation light, wherein the wavelength conversion film includes a first dye having a maximum absorption wavelength in the red light region, and a second dye absorbing excitation energy of the first dye to emit light in the near-infrared region.

The wavelength conversion film of the present invention is a film to be disposed on a surface light source that emits red light described below, for example, a red-light-emitting organic EL element, to convert visible light from the surface light source to near-infrared light (IR).

The maximum light emission wavelength obtained from the wavelength conversion film is preferably in a range from 700 to 1500 n, and is more preferably 750 nm or more in view of obtaining light emission in the near-infrared region.

The "maximum light emission wavelength" in the present invention refers to the wavelength at which a global maximum intensity of light emission is exhibited in a light emission spectrum obtained in measurement of a light emission spectrum of the wavelength conversion film with a spectrofluorophotometer (for example, F-7000 (manufactured by Hitachi High-Tech Science Corporation)). The "maximum absorption wavelength" refers to the wavelength at which a global maximum absorbance (intensity of absorption) is exhibited.

In a case where a light-emitting member including such a wavelength conversion film is used in a biometric authentication device, a range from 750 n to 1400 nm, furthermore, a range from 800 to 1000 nm is preferable in view of overlapping with the absorption region of hemoglobin and not overlapping with the absorption region of water.

The wavelength conversion film of the present invention is a wavelength conversion film including at least two or more dyes and absorbing irradiation light to emit light at a longer wavelength than that of the irradiation light, wherein the wavelength conversion film includes a first dye having a maximum absorption wavelength in the red light region, and a second dye absorbing excitation energy of the first dye to emit light in the near-infrared region.

The form and the production method of the wavelength conversion film of the present invention are not limited, and are appropriately determined depending on the intended use.

Figure 4:
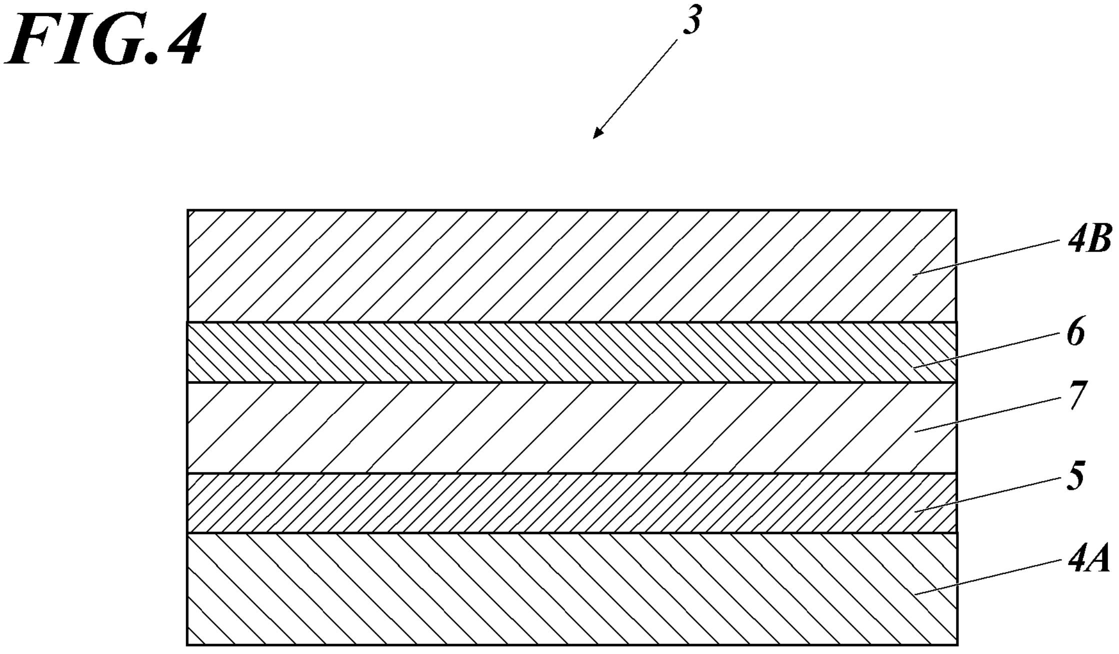
FIG. 4 A schematic cross-sectional view illustrating a configuration example of the wavelength conversion film according to the present invention, including a red light cut filter.

Regarding the form, the wavelength conversion film is produced on a support separately from the surface light source, followed by stacking the resultant on the surface light source, or the wavelength conversion film is layered on the surface light source. The wavelength conversion film may also concurrently serve as an adhesive and/or a sealing film. A red light cut filter for removal of red light that is not converted in wavelength but radiated may be layered or included, as illustrated in FIG. 4. The thickness is appropriately determined depending on the intended use, and is preferably in a range from 0.01 to 500 μm, mom preferably in a range from 0.1 to 200 μm, and further preferably 1 to 100 μm, in view of flexibility and a reduction in size.

Examples of the production method include a method which can temporarily or permanently provide a composition for forming a wavelength conversion film including the two or more dyes (light-emitting dyes) onto a support, including a vapor deposition method, a sputtering method, a spin coating method, a gravure coating method, and a dip coating method. In the case of production according to a wet method such as a spin coating method, a solvent used is not particularly limited, and examples thereof include water, and alcohol-based, diol-based, ketone-based, ester-based, ester-based, aromatic hydrocarbon-based (optionally containing halogen), and aliphatic or aliphatic hydrocarbon-based solvents.

A known resin material or the like may be used as a matrix material in order to dissolve or disperse the light-emitting dyes information of the composition for forming wavelength conversion film. A non-polar resin material is suitably used in view of having no effect on the wavelength of emission of the light-emitting dye, and examples include polystyrene, polyolefins such as polyethylene, polypropylene and polymethylpentene, acrylic resins such as polymethyl methacrylate, an ethylene-vinyl acetate copolymer (EVA), polyvinyl butyrate (PVB), and cellulose esters such as triacetyl cellulose (TAC) and nitrocellulose.

The two or more light-emitting dyes in the present invention may be all contained in one layer, or these dyes may be dissolved or dispersed in respective separate matrix materials and layered in a plurality of times.

In addition to the light-emitting dyes, any well-known various additives may be included, if necessary, such as a colorant, a light stabilizer, an antioxidant, a surfactant, a flame retardant, an inorganic additive, a transparentizing agent, an ultraviolet absorber, a filler, and/or a light-scattering particle.

(Light-Scattering Particle)

In particular, the light-scattering particle is a particle having a function of multiply scattering light coming into the wavelength conversion film. Such a particle is added to thereby allow light proceeding into the wavelength conversion film to be elongated in optical path length in the film and increased in opportunities for wavelength conversion in the wavelength conversion film, resulting in an enhancement in wavelength conversion efficiency. Furthermore, light returned into the wavelength conversion film due to reflection at the interface of the wavelength conversion film is again scattered, possibly resulting in an enhancement in light extraction efficiency.

The light-scattering particle preferably has an average particle size of 0.01 μm or more and 10 μm or less, more preferably 0.1 μm or more and 5 μm or less, further preferably 0.2 μm or more and 1 μm or less. If the light-scattering particle has an average particle size of less than 0.01 μm, sufficient light scattering properties cannot be obtained in the wavelength conversion film, and the amount of the light-scattering particle added is needed to be increased in order to impart sufficient light scattering properties. On the other hand, if the light-scattering particle has an average particle size of more than 10 μm, the number of the light-scattering particle is decreased even in the same amount (% by mass) added, resulting in a reduction in the number of scattering points to thereby fail to obtain the sufficient light-scattering effect.

The shape of the light-scattering particle is not particularly limited, and examples include a spherical shape (a true spherical shape, a substantially true spherical shape, an oval sphere, and the like), a polyhedron shape, a bar shape (a columnar shape, a prism shape, and the like), a plate shape, a scale-like shape, and an irregular shape. In a case where the shape of the light-scattering particle is a non-spherical shape, the particle size of the light-scattering particle can be a value with respect to a true spherical shape having the same volume as that of such a non-spherical shape.

The light-scattering particle may be an organic fine particle or an inorganic fine particle and can be appropriately selected depending on the object without particular limitation. In particular, the light-scattering particle is preferably an inorganic fine particle having a high refractive index because a particle having higher refractive index derivers enhanced scattering performance.

Examples of an organic fine particle having a high refractive index include polymethyl methacrylate beads, acrylic-styrene copolymer beads, melamine beads, polycarbonate beads, styrene beads, crosslinked polystyrene beads, polyvinyl chloride beads, and benzoguanamine-melamine formaldehyde beads.

Examples of such an inorganic fine particle having a high refractive index include an inorganic oxide particle including an oxide of at least one selected from silicon, zirconium, titanium, indium, zinc, antimony, cerium, niobium, and tungsten. Specific examples of the inorganic oxide particle include $SiO_2$, $ZrO_2$, $TiO_2$, $BaTiO_3$, $In_2O_3$, ZnO, $Sb_2O_3$, ITO, $CeO_2$, $Nb_2O_3$, and $WO_3$, and in particular. $TiO_2$, $BaTiO_3$, $ZrO_2$, $CeO_2$, and $Nb_2O_5$ are preferable, and $TiO_2$ is most preferable. Among $TiO_2$, rutile type $TiO_2$ is more preferable than anatase type $TiO_2$ because the former has lower catalytic activity to thereby increase weather resistance of the film and also has higher refractive index.

Which a particle that has been subjected to a surface treatment or not subjected to any surface treatment is used can be selected in view of enhancements in dispersibility and stability of a dispersion liquid to be formed for incorporating the particle into the wavelength conversion film.

In a case where a surface treatment is performed, examples of a specific material for the surface treatment include heterogeneous inorganic oxides such as silicon oxide and zirconium oxide, metal hydroxides such as aluminum hydroxide, organosiloxane, and organic acids such as stearic acid. These surface treatment materials may be used singly or in combinations of a plurality thereof. In particular, the surface treatment material is preferably heterogeneous inorganic oxide or a metal hydroxide, and more preferably a metal hydroxide, in view of stability of a dispersion liquid.

The content of the light-scattering particle is preferably 0.1% by mass or more and 20% by mass or less, and more preferably 0.2% by mass or more and 5% by mass or less, based on the mass of the total solid content in the wavelength conversion film. If the content of the light-scattering particle is less than 0.1% by mass, no sufficient light-scattering effect may be obtained, and if the content of the light-scattering particle is more than 20% by mass, too large an amount of the light-scattering particle causes deterioration in transmittance.

(Red Light Cut Filter)

Examples of the material of the red light cut filter include glass and resin, and any material can be used which can be formed into a dielectric multi-layer film or a film that contains an absorbing dye to thereby remove red light. The red light cut filter here used may be a commercially available product. Alternatively, the above film may be formed on the wavelength conversion film, or may be independently produced and thereafter combined with the wavelength conversion film.

Light emission via the wavelength conversion film is described with reference to FIG. 1, by way of, as an example, a case where two light-emitting dyes (hereinafter, sequentially referred to as “first dye” and “second dye” in the order of dyes having a shorter maximum light emission wavelength.) are included in the wavelength conversion film.

The first dye is excited by red light emitted from a light source, and the excitation energy is transferred to the second dye. The light emitted from the second dye corresponds to light emitted from the wavelength conversion film. In view of this mechanism, the first dye is preferably one that has an absorption region in a red light region (600 to 700 nm) and in particular exhibits a maximum absorption wavelength included in a wavelength region of 600 to 700 nm. The second dye, which receives the excitation energy from the first dye, is thus preferably a dye such that a light emission spectrum of the first dye and an absorption spectrum of the second dye are largely overlapped.

One factor of such energy transfer between two dyes is fluorescence resonance energy transfer (also referred to as “Foerster resonance energy transfer”) corresponding to direct transfer of energy due to electron resonance, but is not limited thereto in the present invention. The wavelength of light emitted can also be lengthened by resorption between such dyes. The magnitude of overlap between the spectra in the case of the occurrence of Foerster resonance energy transfer is referred to as “overlap integral value J”, which is known to be calculated according to the following expression.

$$J=\int f_D(\lambda)E_A(\lambda)\lambda^4 d\lambda \quad \text{[Expression 1]}$$

In the expression, $f_D$ represents a standardized light emission spectrum of a donor (energy donor), $E_A$ represents a coefficient of molar absorbance of an acceptor (energy acceptor), and λ represents a wavelength.

The spectral intensity (intensity of A illustrated in FIG. 1) at the wavelength corresponding to the intersection of respective spectra of the first dye and the second dye is more preferably one-quarter or more, particularly preferably one-third or more of the intensity (intensity of B illustrated in FIG. 1) at a maximum light emission wavelength of the second dye. Herein, all the spectra (emission and absorption of both the dyes) are standardized so that the maximum value (intensity) is constant.

Examples of the light-emitting dye used for the two or more light-emitting dye in the present invention include a complex such as deuterated tris(hexafluoroacetylacetonate) neodymium(III):Nd(hfa-D3) or pyrromethene-based boron, an inorganic nanomaterial including a rare-earth ion, a quantum nanodot particle including indium arsenide, lead sulfide or the like, and a water-soluble silicon nanoparticle, and also squarylium, croconium, thiadiazole, cyanine, phthalocyanine, croconium, rhodamine, eosine, fluorescein, triplenylmethane, porphyrin, perylene, and thiophene, and also perylene bisimide, terrylene bisimide, pyrrolopyrrole cyanine, lanthanoid, an indium complex, a platinum complex, a thermally activated delayed fluorescence dye, a conjugated polymer, and a carbon nanotube, described in Adv. Funct. Mater. 2019, 1807623. The concentration of such light-emitting dyes in the film is preferably 0.05 to 4.0% by mass, more preferably 0.1 to 3.0% by mass, further preferably 0.15 to 2.5% by mass, in view of a sufficient intensity of light emission and suppression of concentration quenching.

Among these dyes for the two or more light-emitting dyes, a squarylium compound, which is a light-emitting dye, has been previously used as a compound exhibiting sharp absorption in the near-infrared light region for a sensitizing dye for organic solar cells, a charge generation material for electrophotographic photoreceptors, and a fluorescent probe, for example, and furthermore can be particularly preferably used as the light-emitting dye in the present invention because of being high in durability and excellent in efficiency of light emission in the infrared light emission region. Accordingly, any of the first and second dyes is preferably a squarylium compound, and both the dyes are more preferably squarylium compounds.

The method for synthesizing the squarylium compound in the present invention is not particularly limited, and the squarylium compound can be obtained by using a generally well-known reaction described in, for example, JP H5-155144A, JP H5-239366A, JP H5-339233A, JP 2000-345059A, JP 2002-363434A, JP 2004-86133A, and JP 2004-238606A.

<Compound Having Structure Represented by General Formula (1)>

The type of the squarylium compound in the present invention is not particularly limited, and the squarylium compound is preferably a compound having a structure represented by the following general formula (1).

[Formula 1]

General formula (1)

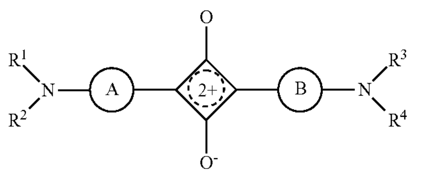

In the general formula (1). A and B each represent an aromatic hydrocarbon ring optionally having a substituent or an aromatic heterocyclic ring optionally having a substituent, and adjacent substituents may be mutually bound to form a ring. $R_1$ to $R_4$ each represent a substituent, and at least one thereof has an aromatic hydrocarbon ring. $R_1$ to $R_4$ may be mutually bound to form a ring.

The aromatic hydrocarbon ring (also referred to as, for example, "aromatic hydrocarbon ring group", "aromatic carbocyclic ring group", or "aryl group") represented by A and B is a substituted or unsubstituted aromatic hydrocarbon ring having 6 to 18 carbon atoms, and examples include a phenyl group, a naphthyl group, an anthryl group, a fluorenyl group, a phenanthryl group, and a biphenylyl group. Preferable examples include a phenyl group, a naphthyl group, and an anthryl group. Examples of the aromatic heterocyclic ring group represented by A and B include a pyridyl group, a pyrimidinyl group, a furyl group, a pyrrolyl group, an imidazolyl group, a benzimidazolyl group, a pyrazolyl group, a pyrazinyl group, triazolyl groups (for example, a 1,2,4-triazol-1-yl group and a 1,2,3-triazol-1-yl group), a pyrazolotriazolyl group, an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (a group in which one of carbon atoms constituting a carboline ring of the carbolinyl group is replaced with a nitrogen atom), a quinoxalinyl group, a pyridazinyl group, a triazinyl group, a quinazolinyl group, and a phthalazinyl group.

Examples of the substituent represented by $R_1$ to $R_4$ and the substituent optionally contained in A and B in the general formula (1) include alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), cycloalkyl groups (for example, a cyclopentyl group and a cyclohexyl group), alkenyl groups (for example, a vinyl group and an allyl group), alkynyl groups (for example, an ethynyl group and a propargyl group), aromatic hydrocarbon groups (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group), aromatic heterocyclic ring groups (for example, a pyridyl group, a pyrimidinyl group, a furyl group, a pyrrolyl group, an imidazolyl group, a benzimidazolyl group, a pyrazolyl group, a pyrazinyl group, triazolyl groups (for example, a 1,2,4-triazol-1-yl group and a 1,2,3-triazol-1-yl group), a pyrazolotriazolyl group, an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (a group in which one of carbon atoms constituting a carboline ring of the carbolinyl group is replaced with a nitrogen atom), a quinoxalinyl group, a pyridazinyl group, a triazinyl group, a quinazolinyl group, and a phthalazinyl group), heterocyclic ring groups (for example, a pyrrolidyl group, an imidazolinyl group, a morpholyl group, and an oxazolidyl group), alkoxy groups (for example, a methoxy group, an ethoxy group, a propyloxy group, a pentyloxy group, a hexyloxy group, an octyloxy group, and a dodecyloxy group), cycloalkoxy groups (for example, a cyclopentyloxy group and a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group, and a dodecylthio group), cycloalkylthio groups (for example, a cyclopentylthio group and a cyclohexylthio group), arylthio groups (for example, a phenylthio group and a naphthylthio group), alkoxycarbonyl groups (for example, a methyloxycarbonyl group, an ethyloxycarbonyl group, a butyloxycarbonyl group, an octyloxycarbonyl group, and a dodecyloxycarbonyl group), aryloxycarbonyl groups (for example, a phenyloxycarbonyl group and a naphthyloxycarbonyl group), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbamoyl group, a phenylcarbonyl group, a naphthylcarbonyl group, and a pyridylcarbonyl group), acyloxy groups (for example, an acetyloxy group, an ethylcarbonyloxy group, a butylcarbonyloxy group, an octylcarbonyloxy group, a dodecycarbonyloxy group, and a phenylcarbonyloxy group), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), ureido groups (for example, a methylureido group, an ethylureido group, a pentylureido group, a cyclohexylureido group, an octylureido group, a dodecylureido group, a phenylureido group, a naphthylureido group, and a 2-pyridylaminoureido group), sulfinyl groups (for example, a methylsulfinyl group, an ethylsulfinyl group, a butylsulfinyl group, a cyclolexylsulfinyl group, a 2-ethylhexylsulfinyl group, a dodecylsulfinyl group, a phenylsulfinyl group, a naphthylsulfinyl group, and a 2-pyridylsulfinyl group), alkylsulfonyl groups (for example, a methylsulfonyl group, an ethylsulfonyl group, a butylsulfonyl group, a cyclohexylsulfonyl group, a 2-ethylhexylsulfonyl group, and a dodecylsulfonyl group), arylsulfonyl group or heteroarylsulfonyl groups (for example, a phenylsulfonyl group, a naphthylsulfonyl group, and a 2-pyridylsulfonyl group), amino groups (for example, an amino group, an ethylamino group, a dimethylamino group, a diphenylamino group, a diisopropylamino group, a di-tert-butyl group, a cyclohexylamino group, a butylamino group, a cyclopentylamino group, a 2-ethythexylamino group, a dodecylamino group, an anilino group, a naphthylamino group, and a 2-pyridylamino group), halogen atoms (for example, a fluorine atom, a chlorine atom, and bromine atom), fluorinated hydrocarbon groups (for example, a fluoromethyl group, a trifluoromethyl group, a pentafluoroethyl group, and a pentafluorophenyl group), a cyano group, a nitro group, a hydroxy group, a mercapto group, silyl groups (for example, a trimethylsilyl group, a triisopropylsilyl group, a triphenylsilyl group, and a phenyldimethylsilyl group), and a phosphono group. Examples can preferably include alkyl groups, aromatic hydrocarbon groups, amino groups, a hydroxy group, and silyl groups.

Such substituents may also be each further substituted with any of the above substituents.

In particular, the substituent represented by $R_1$ to $R_4$ is preferably an alkyl group or an aromatic hydrocarbon group.

The alkyl group represented by $R_1$ to $R_4$ is preferably a substituted or unsubstituted alkyl group having 6 to 10 carbon atoms. Examples include a methyl group, an ethyl group, a propyl group, an isopropyl group, a butyl group, an isobutyl group, a pentyl group, a hexyl group, an octyl group, a dodecyl group, a cyclopentyl group, and a cyclohexyl group.

The aromatic hydrocarbon group represented by $R_1$ to $R_4$ is preferably a substituted or unsubstituted aromatic hydrocarbon group having 6 to 18 carbon atoms. Examples include aromatic hydrocarbon groups (a phenyl group, a naphthyl group, an anthryl group, a fluorenyl group, a phenanthryl group, and a biphenylyl group). Preferable examples include a phenyl group and a naphthyl group.

In a case where adjacent substituents form a ring, the resulting cyclic structure may be an aromatic ring or an aliphatic ring, may include a hetero atom, and/or may be a fused ring of two or more rings. The heteroatom here mentioned is preferably selected from the group consisting of a nitrogen atom, an oxygen atom, and a sulfur atom. Examples of the cyclic structure formed include a benzene ring, a naphthalene ring, a pyridine ring, a pyridazine ring, a pyrimidine ring, a pyrazine ring, a pyrrole ring, an imidazole ring, a pyrazole ring, a triazole ring, an imidazoline ring, an oxazole ring, an isoxazole ring, a thiazole ring, an isothiazole ring, a cyclohexadiene ring, a cyclohexene ring, a cyclopentaene ring, a cycloheptatriene ring, a cycloheptadiene ring, a cycloheptaene ring, a carbazole ring, and a dibenzofuran ring.

<Compound Having Structure Represented by General Formula (2)>

In the general formula (1), A or B or both thereof preferably contains a hydroxy group in view of an enhancement in light-emitting properties, and the squarylium compound is more preferably represented by the following general formula (2) in view of expanding the π-conjugation in the molecule to lengthen the maximum light emission wavelength.

[Formula 2]

General formula (2)

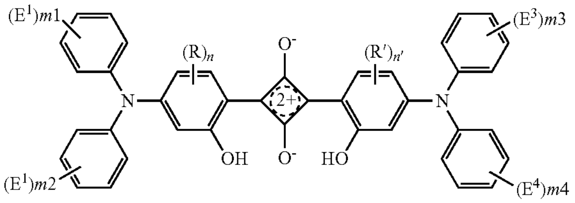

In the general formula (2), $E^1$ to $E^4$ each represent a substituent, m1 to m4 each represent 0 or an integer of 1 to 5. R and R' each represent a substituent, and n and n' each represent 0 or an integer of 1 to 3. In a case where $m_1$ to $m_4$, and n and n are each 2 or more, $E^1$ to $E^4$, and R and R' may be each the same or different.

The respective structures of the substituents represented by E' to E', and R and R' have the same meanings as the substituents of the general formula (1) described above in detail. The substituent represented by $E^1$ to $E^4$ is particularly preferably an alkyl group such as a methyl group, an ethyl group, and a t-butyl group, and the substituent represented by R and R' is preferably a hydrogen atom or a hydroxy group.

The squarylium compound in the present invention can be synthesized with reference to any method described in References, for example, Chemistry of Materials, vol. 23, page 4789 (2011) or The Journal of Physical Chemistry, vol. 91, page 5184 (1987), or any method described in Cited References in the References.

The first dye in the present invention preferably has a maximum absorption wavelength at 600 to 700 nm (red light region).

Representative examples of the first dye, the squarylium compound, the compound represented by the general formula (1), and the compound represented by the general formula (2) in the present invention will be shown below, but are not limited thereto.

[Formula 3]

1-1

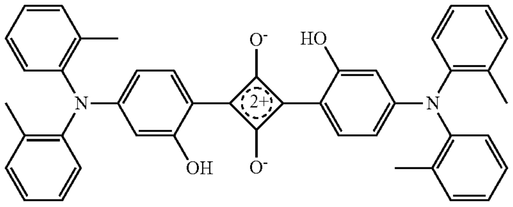

1-2

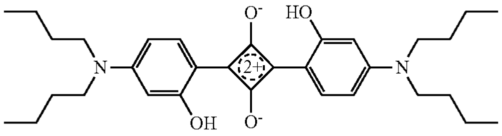

1-3

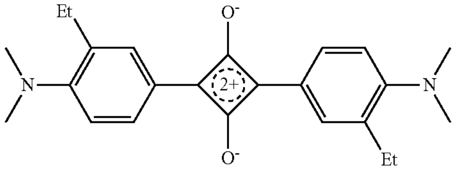

1-4

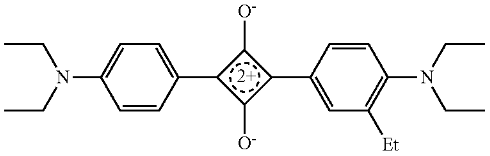

1-5

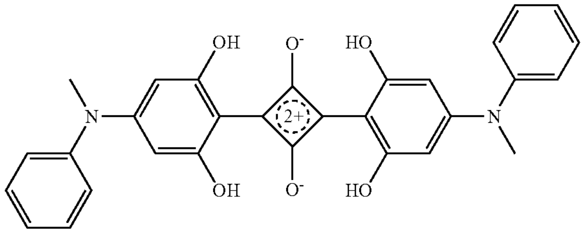

1-6

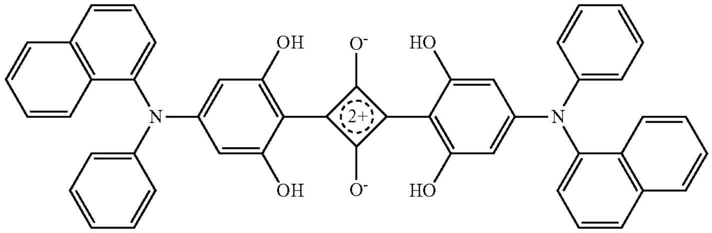

1-7

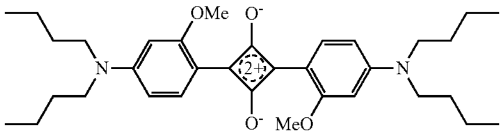

1-8

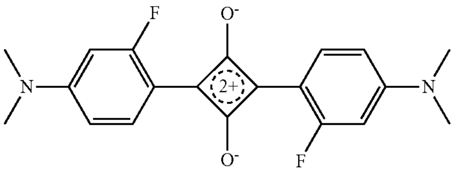

1-9

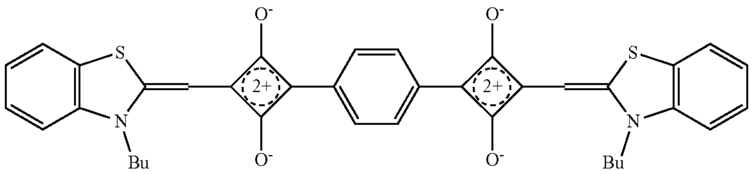

1-10

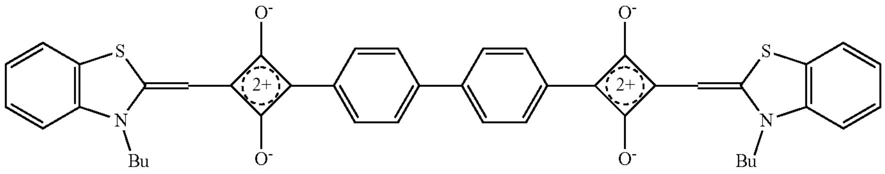

-continued
1-11
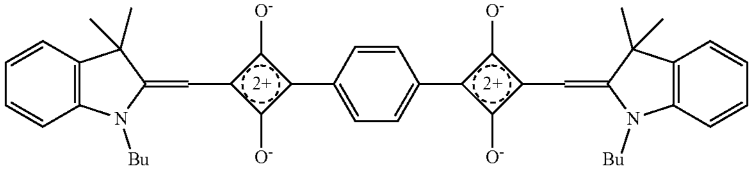
Representative examples of the second dye, the squarylium compound, the compound represented by the general formula (1), and the compound represented by the general formula (2) in the present intention will be shown below, but are not limited thereto.
[Formula 4]
2-1
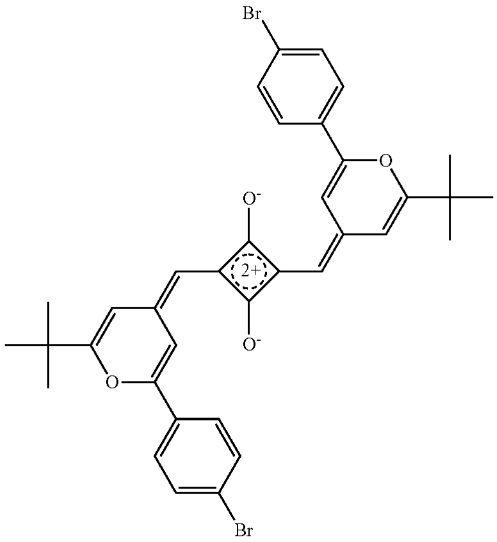
2-2
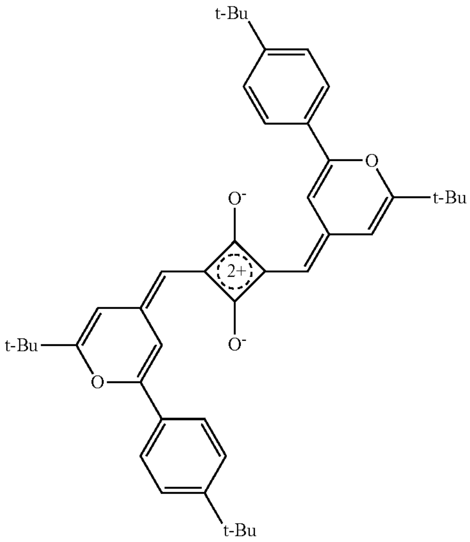
2-3
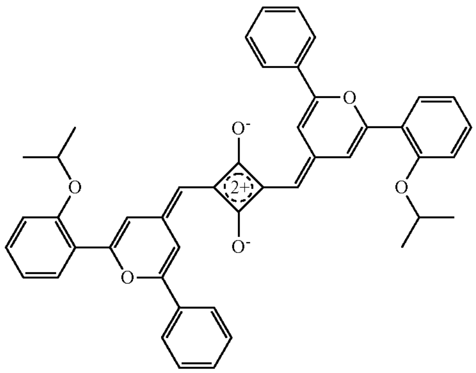
2-4
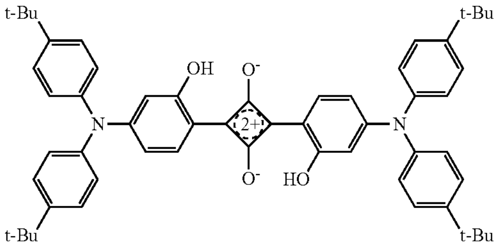
2-5
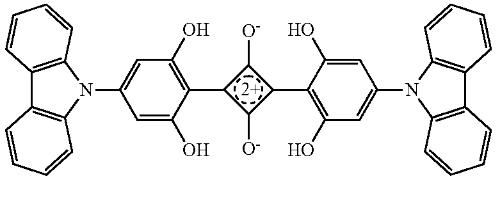
2-6
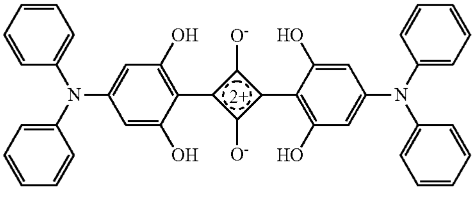

-continued
[Formula 5]
2-7
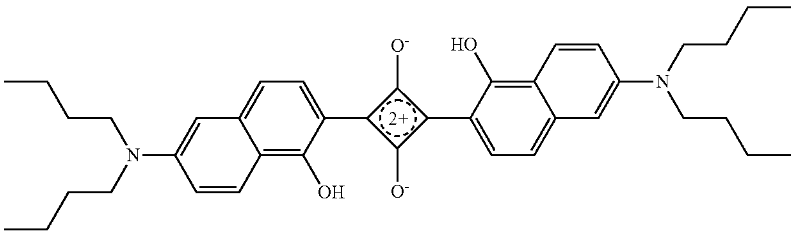
2-8
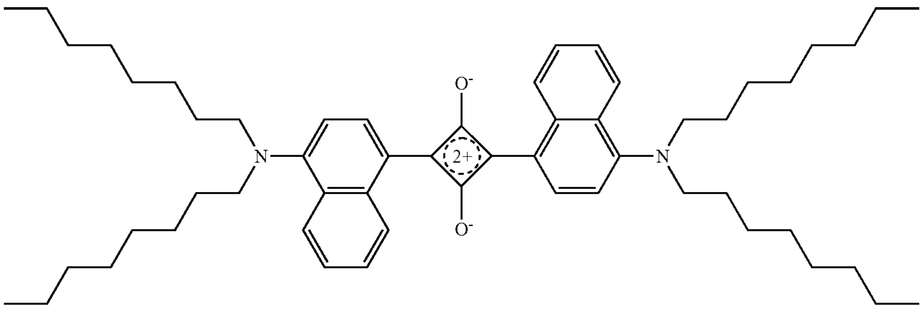
2-9
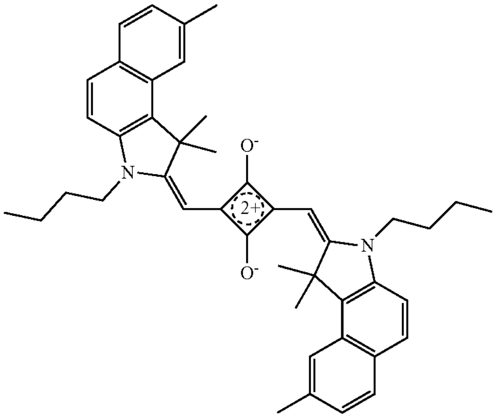
2-10
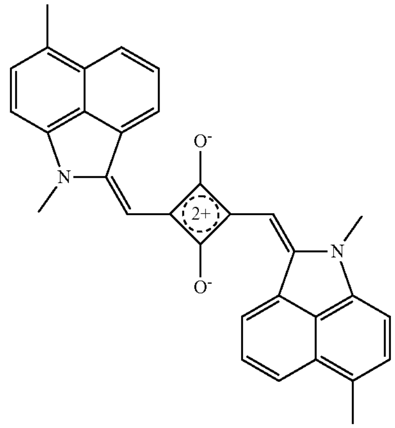
2-11
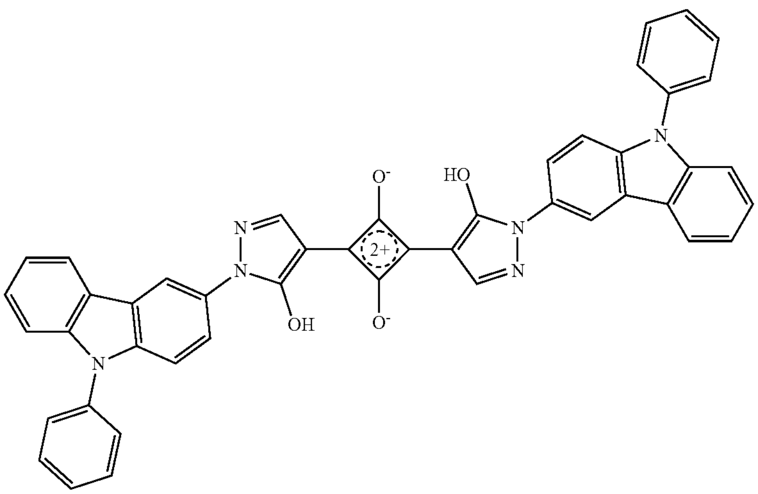

-continued
2-12
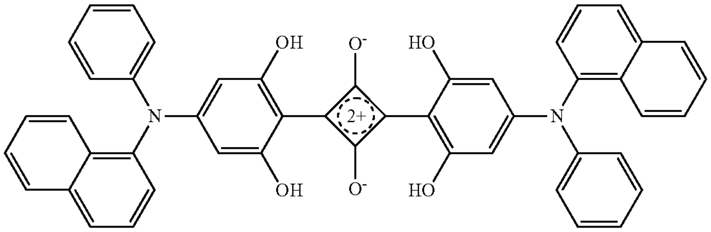
2-13
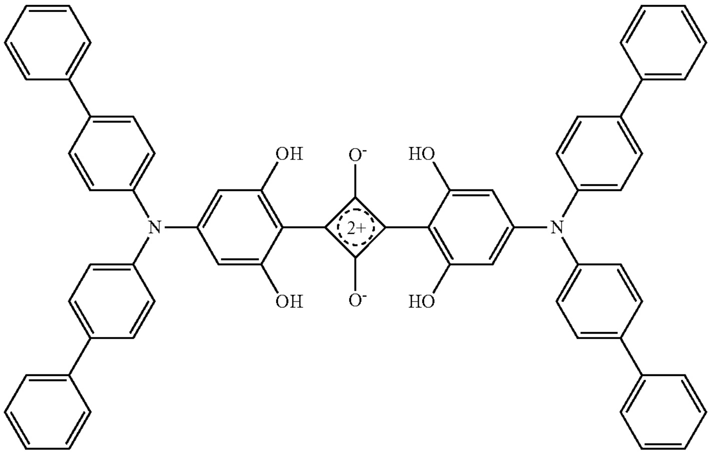
[Formula 6]
2-14
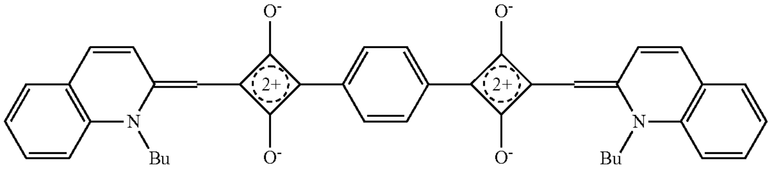
2-15
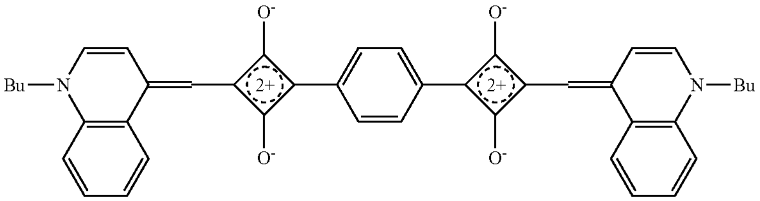
2-16
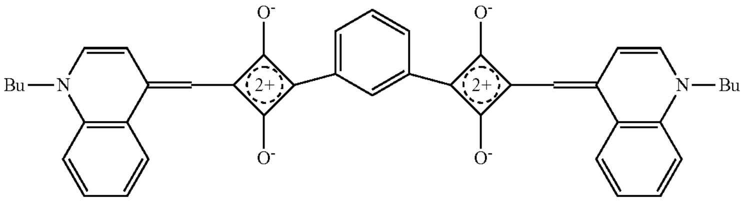
2-17
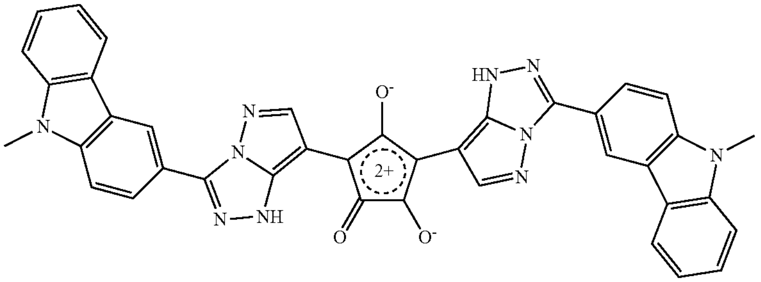

-continued
2-18
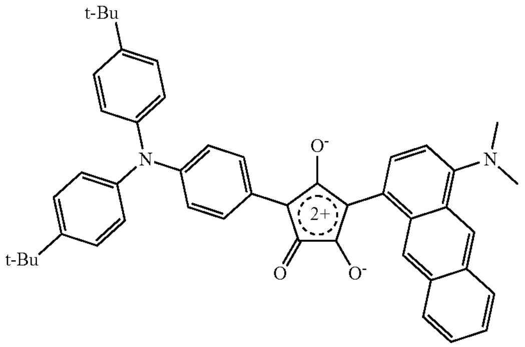
2-19
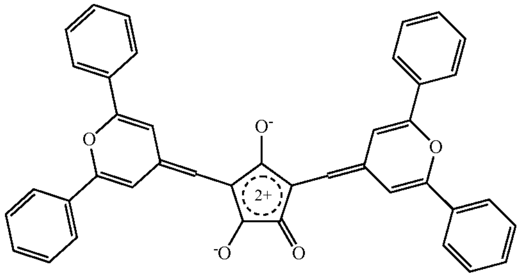
2-20
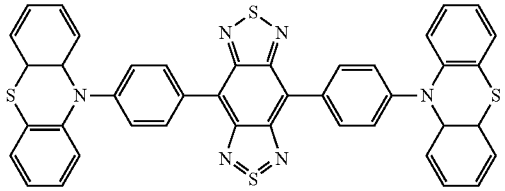
2-21
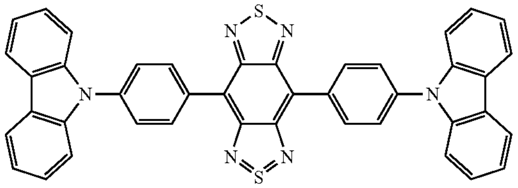
[Formula 7]
2-22
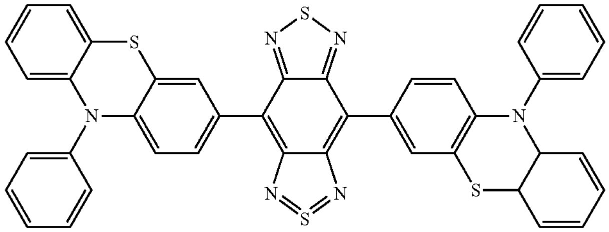
2-23
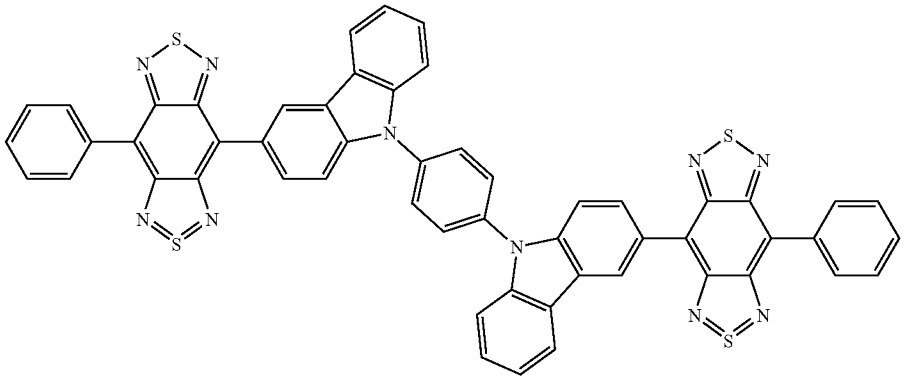
2-24
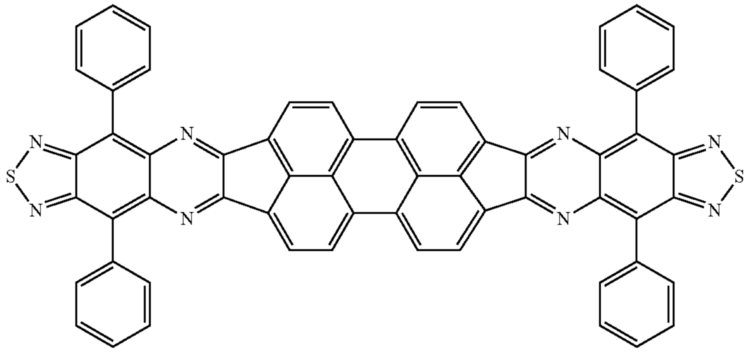

-continued
2-25
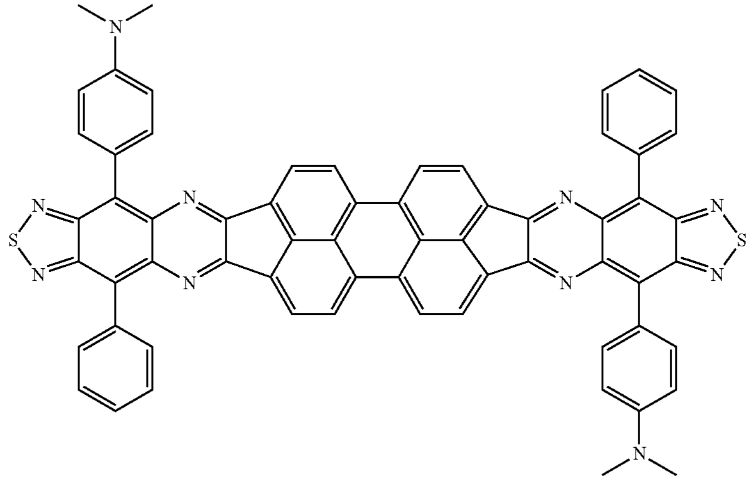
2-26
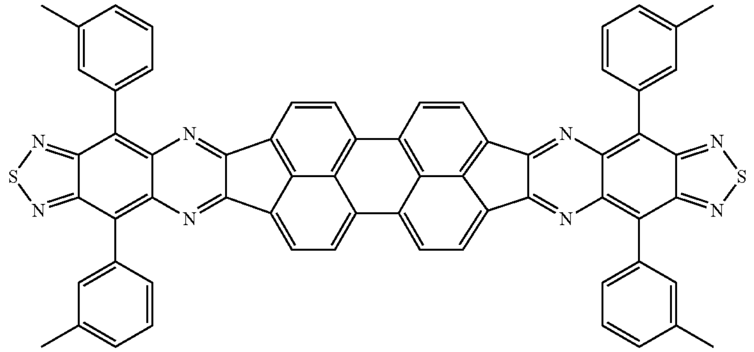
[Formula 8]
2-27
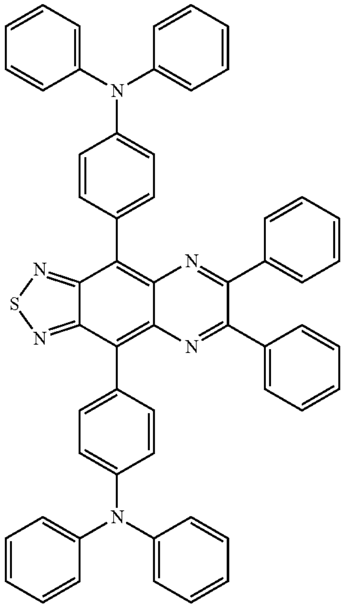
2-28
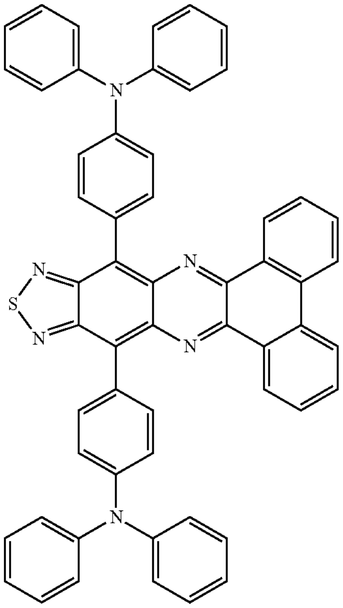

-continued 2-29

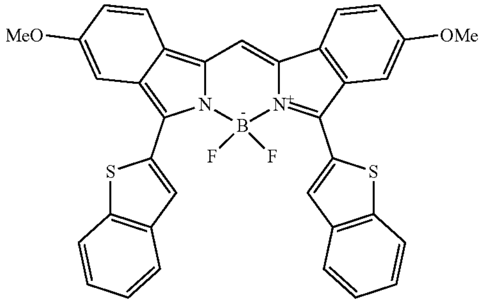

2-30

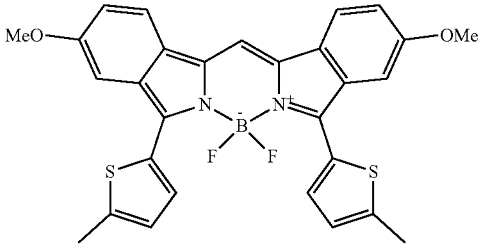

2-31

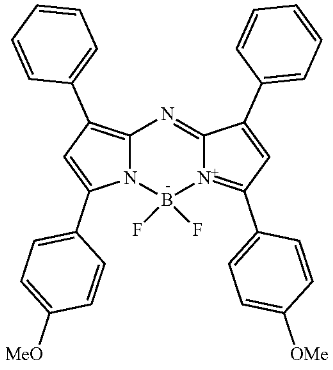

2-32

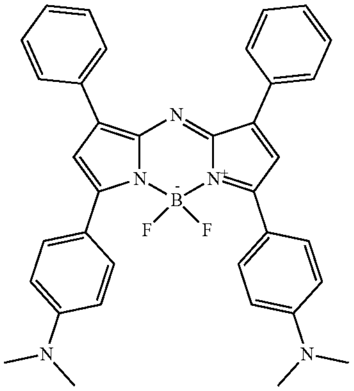

Pyrrolopyrrole cyanine dyes described in Reference 1 and cyanovinyl-substituted squarylium dyes described in Reference 2, which are shown below, are also suitably used as a compound for the first dye and the second dye in the present invention.

[Formula 9]

11f

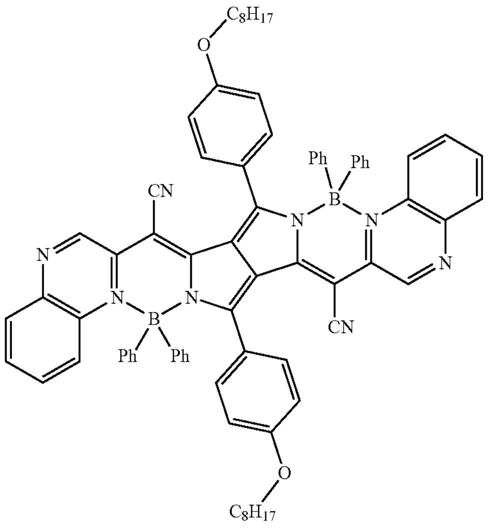

-continued

31d

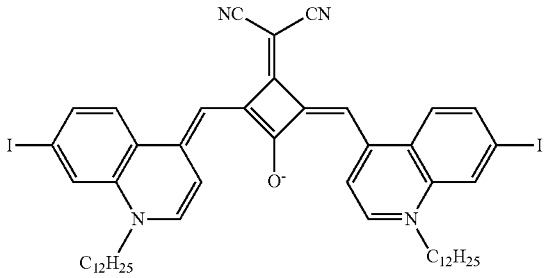

Reference 1: Fischer_et_al—Angew. Chem. Int. Ed. 2007, 46, 3750-3753

Reference 2: Mayerh-ffer_et_al—Chem. Eur. J. 2013, 19, 218-232

As the compounds for the first dye and the second dye in the present invention, compounds (1a) to (1d) and compounds (4) to (11) having structures represented by the following general formulae (1a) to (1d) and structures represented by general formulae (4) to (11), respectively, are suitably used. The respective general formulae (1a) to (1d) and general formulae (4) to (11) will be described below, and also respective compounds will be exemplified.

[Formula 10]

General formula (1a)

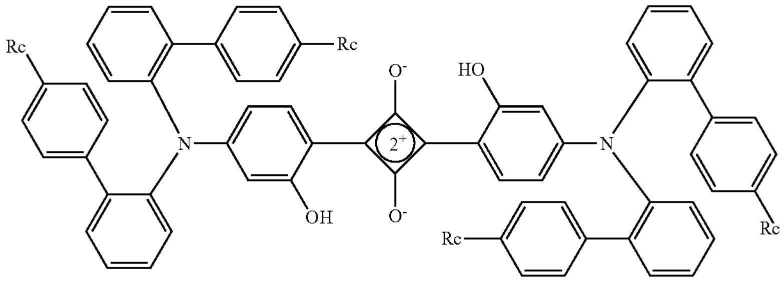

In the general formula (1a), each Rc independently represents a hydrogen atom or a substituent, and at least one of four Rc represents a linear or branched alkyl group (a) having 4 to 12 carbon atoms and optionally having —O— as a linkage, or a group (P) having a structure represented by the following formula (P).

[Formula 11]

General formula (P)

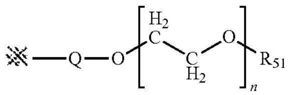

In the general formula (P), * represents a substitution site. Q represents a single bond or a divalent linking group, n represents an integer of 1 to 9. $R_{51}$ represents a hydrogen atom or a methyl group.

Table I shows examples of the compound (1a), which has the structure represented by the general formula (1a), and in these examples, all four Rc are the same alkyl groups (a) or groups (P). Table I shows each compound name and the type of Rc in each compound. In Table 1, each compound name is represented by only an abbreviation. Other Tables shown below, which shows examples of other compound, also show each compound name by only an abbreviation.

In Table I, "n-butyl" represents a n-butyl group, "n-pentyl" represents a n-pentyl group, "n-hexyl" represents a n-hexyl group, "n-heptyl" represents a n-heptyl group, "n-octyl" represents a n-octyl group, "n-nonyl" represents a n-nonyl group, "n-decyl" represents a n-decyl group, "n-undecyl" represents a n-undecyl group, and "n-dodecyl" represents a n-dodecyl group. A group (a1) is represented by (a1). The group (P) is represented by (P), and, for example, is represented with the type of Q, the number represented by n, and the type of $R_{11}$, which are described in brackets after "(P)", for example, (P)(Q=—$CH_2$—, n=2, $R_{11}$=$CH_3$). In a case where Q is a single bond, the designation of Q is omitted. The same applies to the description in other Tables showing other compound described later.

In each Table shown below, the group (a1) represents a 1-propylbutyl group, a group (a2) represents a 1-ethylpentyl group, a group (a3) represents a 2,4,4-trimethylpentyl group, a group (a4) represents an isobutyl group, a group (a5) represents a 2-ethylbutyl group, a group (a6) represents a 2-ethylhexyl group, and a group (a7) represents a 2-butyloctyl group.

TABLE 1

Table I

| Compound name (abbreviation) | Rc |
|---|---|
| (1a)-1 | n-butyl |
| (1a)-2 | n-pentyl |
| (1a)-3 | n-hexyl |
| (1a)-4 | n-heptyl |
| (1a)-5 | n-octyl |
| (1a)-6 | n-nonyl |
| (1a)-7 | n-decyl |
| (1a)-8 | n-undecyl |
| (1a)-9 | n-dodecyl |
| (1a)-10 | (a4) |
| (1a)-11 | (a5) |
| (1a)-12 | (a6) |
| (1a)-13 | (a7) |
| (1a)-14 | (P)(n = 2, $R_{51}$ = $CH_3$) |
| (1a)-15 | (P)(n = 3, $R_{51}$ = $CH_3$) |
| (1a)-16 | (P)(n = 4, $R_{51}$ = $CH_3$) |
| (1a)-17 | (P)(n = 5, $R_{51}$ = $CH_3$) |
| (1a)-18 | (P)(n = 6, $R_{51}$ = $CH_3$) |
| (1a)-19 | (P)(n = 7, $R_{51}$ = $CH_3$) |
| (1a)-20 | (P)(n = 8, $R_{51}$ = $CH_3$) |
| (1a)-21 | (P)(n = 9, $R_{51}$ = $CH_3$) |
| (1a)-22 | (P)(n = 2, $R_{51}$ = H) |
| (1a)-23 | (P)(n = 3, $R_{51}$ = H) |
| (1a)-24 | (P)(n = 4, $R_{51}$ = H) |
| (1a)-25 | (P)(n = 5, $R_{51}$ = H) |
| (1a)-26 | (P)(n = 6, $R_{51}$ = H) |
| (1a)-27 | (P)(n = 7, $R_{51}$ = H) |
| (1a)-28 | (P)(n = 8, $R_{51}$ = H) |
| (1a)-29 | (P)(n = 9, $R_{51}$ = H) |
| (1a)-30 | (P)(Q = —$CH_2$—, n = 2, $R_{51}$ = $CH_3$) |
| (1a)-31 | (P)(Q = —$CH_2$—, n = 3, $R_{51}$ = $CH_3$) |
| (1a)-32 | (P)(Q = —$CH_2$—, n = 4, $R_{51}$ = $CH_3$) |
| (1a)-33 | (P)(Q = —$CH_2$—, n = 8, $R_{51}$ = $CH_3$) |
| (1a)-34 | (P)(Q = —C(=O)—, n = 2, $R_{51}$ = $CH_3$) |
| (1a)-35 | (P)(Q = —C(=O)—, n = 3, $R_{51}$ = $CH_3$) |
| (1a)-36 | (P)(Q = —C(=O)—, n = 4, $R_{51}$ = $CH_3$) |
| (1a)-37 | (P)(Q = —C(=O)—, n = 8, $R_{51}$ = $CH_3$) |
| (1a)-38 | —O-n-butyl |

[Formula 12]

General formula (1c)

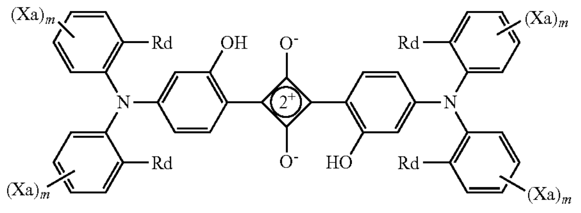

In the general formula (1c), each Rd independently represents a hydrogen atom or a substituent, and at least one of four Rd represents a linear or branched alkyl group (a) having 4 to 12 carbon atoms and optionally having —O— as a linkage, or the group (P) having the structure represented by the general formula (P). Each Xa represents independently an alkyl group or alkoxy group having 1 to 3 carbon atoms, or a phenyl group, m represents an integer of 0 to 4.

Table II shows examples of the compound (1c), which has the structure represented by the general formula (1c), and in these examples, all four (Xa)m are the same (all (Xa)m are the same in benzene rings to which Rd and (Xa)m are bound). All four Rd are the same alkyl groups (a) or groups (P). Table II shows each compound name and the type of Rc in each compound, and each group or each atom bound to the carbon atom other than the carbon atom to which each Rd is bound, as X11, X12, X13, and X14, in adjacent order from Rd. In Table II, "—O-(a2)" represents a group (a2) to which —O— as a linkage is bound. "2,4,6-Trimethoxyphenyl" represents a 2,4,6-trimethoxyphenyl group, "Me" represents a methyl group, and "Ph" represents a phenyl group. The same applies to the description in other Table showing other compound, described later.

TABLE 2

Table II

| Compound name (abbreviation) | Rd | X11 | X12 | X13 | X14 |
|---|---|---|---|---|---|
| (1c)-1 | n-butyl | H | H | H | H |
| (1c)-2 | n-pentyl | H | H | H | H |
| (1c)-3 | n-hexyl | H | H | H | H |
| (1c)-4 | n-heptyl | H | H | H | H |
| (1c)-5 | n-octyl | H | H | H | H |
| (1c)-6 | n-nonyl | H | H | H | H |

TABLE 2-continued

Table II

| Compound name (abbreviation) | Rd | X11 | X12 | X13 | X14 |
|---|---|---|---|---|---|
| (1c)-7 | n-decyl | H | H | H | H |
| (1c)-8 | n-undecyl | H | H | H | H |
| (1c)-9 | n-dodecyl | H | H | H | H |
| (1c)-10 | (a4) | H | H | H | H |
| (1c)-11 | (a5) | H | H | H | H |
| (1c)-12 | (a6) | H | H | H | H |
| (1c)-13 | (a7) | H | H | H | H |
| (1c)-14 | (P)(n = 2, $R_{51}$ = $CH_3$) | H | H | H | H |
| (1c)-15 | (P)(n = 3, $R_{51}$ = $CH_3$) | H | H | H | H |
| (1c)-16 | (P)(n = 4, $R_{51}$ = $CH_3$) | H | H | H | H |
| (1c)-17 | (P)(n = 5, $R_{51}$ = $CH_3$) | H | H | H | H |
| (1c)-18 | (P)(n = 6, $R_{51}$ = $CH_3$) | H | H | H | H |
| (1c)-19 | (P)(n = 7, $R_{51}$ = $CH_3$) | H | H | H | H |
| (1c)-20 | (P)(n = 8, $R_{51}$ = $CH_3$) | H | H | H | H |
| (1c)-21 | (P)(n = 9, $R_{51}$ = $CH_3$) | H | H | H | H |
| (1c)-22 | (P)(n = 2, $R_{51}$ = H) | H | H | H | H |
| (1c)-23 | (P)(n = 3, $R_{51}$ = H) | H | H | H | H |
| (1c)-24 | (P)(n = 4, $R_{51}$ = H) | H | H | H | H |
| (1c)-25 | (P)(n = 5, $R_{51}$ = H) | H | H | H | H |
| (1c)-26 | (P)(n = 6, $R_{51}$ = H) | H | H | H | H |
| (1c)-27 | (P)(n = 7, $R_{51}$ = H) | H | H | H | H |
| (1c)-28 | (P)(n = 8, $R_{51}$ = H) | H | H | H | H |
| (1c)-29 | (P)(n = 9, $R_{51}$ = H) | H | H | H | H |
| (1c)-30 | (P)(Q= —$CH_2$—, n = 2, $R_{51}$ = $CH_3$) | H | H | H | H |
| (1c)-31 | (P)(Q= —$CH_2$—, n = 3, $R_{51}$ = $CH_3$) | H | H | H | H |
| (1c)-32 | (P)(Q= —$CH_2$—, n = 4, $R_{51}$ = $CH_3$) | H | H | H | H |
| (1c)-33 | (P)(Q= —$CH_2$—, n = 8, $R_{51}$ = $CH_3$) | H | H | H | H |
| (1c)-34 | (P)(Q = —C(═O)—, n = 2, $R_{51}$ = $CH_3$) | H | H | H | H |
| (1c)-35 | (P)(Q = —C(═O)—, n = 3, $R_{51}$ = $CH_3$) | H | H | H | H |
| (1c)-36 | (P)(Q = —C(═O)—, n = 4, $R_{51}$ = $CH_3$) | H | H | H | H |
| (1c)-37 | (P)(Q = —C(═O)—, n = 8, $R_{51}$ = $CH_3$) | H | H | H | H |
| (1c)-38 | n-butyl | Me | H | H | H |
| (1c)-39 | n-butyl | H | Me | H | H |
| (1c)-40 | n-butyl | H | H | Me | H |
| (1c)-41 | n-huty | H | Ph | H | H |
| (1c)-42 | —O—(a2) | H | 2,4,6-trimethoxy-phenyl | H | H |

[Formula 13]

General formula (1b)

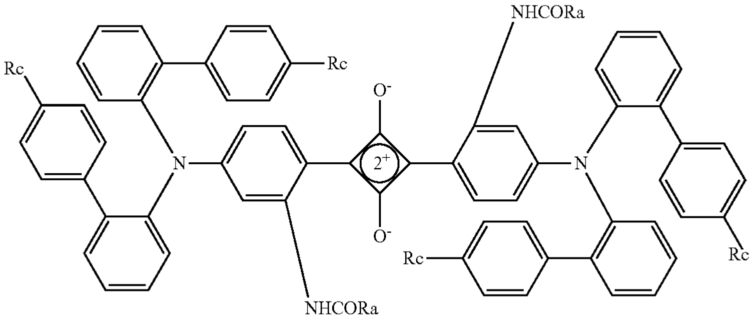

In the general formula (1b), each Ra independently represents a hydrocarbon group. Each Rc independently represents a hydrogen atom or a substituent, and at least one of four Rc represents a linear or branched alkyl group (a) having 4 to 12 carbon atoms and optionally having —O— as a linkage, or the group (P) having the structure represented by the general formula (P).

Table III shows examples of the compound (1b), which has the structure represented by the general formula (1b). In these examples, two Ra are the same alkyl groups and all four Rc are the same alkyl groups (a) or groups (P). Table III shows each compound name and the types of Rc and Ra in each compound.

TABLE 3

TABLE III

| Compound name (abbreviation) | Rc | Ra |
|---|---|---|
| (1b)-1 | n-butyl | n-butyl |
| (1b)-2 | n-pentyl | n-pentyl |
| (1b)-3 | n-hexyl | n-hexyl |
| (1b)-4 | n-heptyl | n-heptyl |
| (1b)-5 | n-octyl | n-octyl |
| (1b)6 | n-nonyl | n-nonyl |
| (1b)-7 | n-decyl | n-decyl |
| (1b)-8 | n-undecyl | n-undecyl |
| (1b)-9 | n-dodecyl | n-dodecyl |
| (1b)-10 | (a4) | (a4) |
| (1b)-11 | (a5) | (a1) |
| (1b)-12 | (a6) | (a2) |
| (1b)-13 | (a7) | (a3) |
| (1b)-14 | n-butyl | Me |
| (1b)-15 | n-hexyl | Me |
| (1b)-16 | (a4) | Me |
| (1b)-17 | (a5) | Me |
| (1b)-18 | (a6) | Me |
| (1b)-19 | (P)(n = 2, $R_{51}$ = $CH_3$) | Me |
| (1b)-20 | (P)(n = 3, $R_{51}$ = $CH_3$) | Me |
| (1b)-21 | (P)(n = 4, $R_{51}$ = $CH_3$) | Me |
| (1b)-22 | (P)(n = 5, $R_{51}$ = $CH_3$) | Me |
| (1b)-23 | (P)(n = 6, $R_{51}$ = $CH_3$) | Me |
| (1b)-24 | (P)(n = 7, $R_{51}$ = $CH_3$) | Me |
| (1b)-25 | (P)(n = 8, $R_{51}$ = $CH_3$) | Me |
| (1b)-26 | (P)(n = 9, $R_{51}$ = $CH_3$) | Me |
| (1b)-27 | (P)(n = 2, $R_{51}$ = H) | Me |
| (1b)-28 | (P)(n = 3, $R_{51}$ = H) | Me |

TABLE 3-continued

TABLE III

| Compound name (abbreviation) | Rc | Ra |
|---|---|---|
| (1b)-29 | (P)(n = 4, $R_{51}$ = H) | Me |
| (1b)-30 | (P)(n = 5, $R_{51}$ = H) | Me |
| (1b)-31 | (P)(n = 6, $R_{51}$ = H) | Me |
| (1b)-32 | (P)(n = 7, $R_{51}$ = H) | Me |
| (1b)-33 | (P)(n = 8, $R_{51}$ = H) | Me |
| (1b)-34 | (P)(n = 9, $R_{51}$ = H) | Me |
| (1b)-35 | (P)(Q = —$CH_2$—, n = 2, $R_{51}$ = $CH_3$) | Me |
| (1b)-36 | (P)(Q = —$CH_2$—, n = 3, $R_{51}$ = $CH_3$) | Me |
| (1b)-37 | (P)(Q = —$CH_2$—, n = 4, $R_{51}$ = $CH_3$) | Me |
| (1b)-38 | (P)(Q = —$CH_2$—, n = 8, $R_{51}$ = $CH_3$) | Me |
| (1b)-39 | (P)(Q = —C(═O)—, n = 2, $R_{51}$ = $CH_3$) | Me |
| (1b)-40 | (P)(Q = —C(═O)—, n = 3, $R_{51}$ = $CH_3$) | Me |
| (1b)-41 | (P)(Q = —C(═O)—, n = 4, $R_{51}$ = $CH_3$) | Me |
| (1b)-42 | (P)(Q = —C(═O)—, n = 8, $R_{51}$ = $CH_3$) | Me |
| (1b)-43 | —O-n-butyl | Me |

[Formula 14]

General formula (1d)

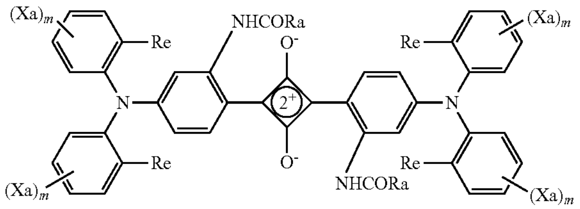

In the general formula (1d), each Ra independently represents a hydrocarbon group. Each Re independently represents a hydrogen atom or a substituent. Each Xa independently represents an alkyl group or alkoxy group having 1 to 3 carbon atoms, or a substituted or unsubstituted phenyl group, and Xa bound at the 4-position may be the group having the structure represented by the formula (D) in represents an integer of 0 to 4. In the general formula (1d), any of Ra represents a linear or branched alkyl group (a) having 4 to 12 carbon atoms, at least one of four Re represents a linear or branched alkyl group (a) having 4 to 12 carbon atoms and optionally having —O— as a linkage, or the group (P) having the structure represented by the formula (P), or the group having the structure represented by the formula (D) is bound as Xa at the 4-position.

Table IV shows examples of the compound (1d), which has the structure represented by the general formula (1d), and in these examples, two Ra, four Re, and four (Xa)m are each the same. Two Ra are a methyl group, an ethyl group (in the Table, represented by "Et".), or an alkyl group (a). All four Re are the same alkyl groups (a), groups (P), methyl groups or phenyl groups. Table IV shows each compound name and the types of Ra and Re in each compound, and each group or each atom bound to the carbon atom other than the carbon atom to which each Re is bound, as X11, X12, X13, and X14, in adjacent order from each Re. X12 corresponds to the 4-position in a benzene ring of the group (A). In Table IV. "(D)-1" represents a group having a structure represented by the following formula.

[Formula 15]

(D)-1

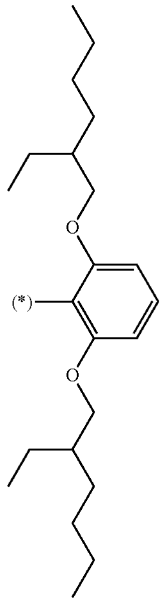

TABLE 4

Table IV

| Compound name (abbre-viation) | Ra | Re | X11 | X12 | X13 | X14 |
|---|---|---|---|---|---|---|
| (1d)-1 | n-butyl | Me | H | H | H | H |
| (1d)-2 | n-pentyl | Me | H | H | H | H |
| (1d)-3 | n-hexyl | Me | H | H | H | H |
| (1d)-4 | n-heptyl | Me | H | H | H | H |
| (1d)-5 | n-octyl | Me | H | H | H | H |
| (1d)-6 | n-nonyl | Me | H | H | H | H |
| (1d)-7 | n-decyl | Me | H | H | H | H |
| (1d)-8 | n-undecyl | Me | H | H | H | H |
| (1d)-9 | n-dodecyl | Me | H | H | H | H |
| (1d)-10 | (a4) | Me | H | H | H | H |
| (1d)-11 | (a1) | Me | H | H | H | H |
| (1d)-12 | (a2) | Me | H | H | H | H |
| (1d)-13 | (a3) | Me | H | H | H | H |
| (1d)-14 | Me | n-butyl | H | H | H | H |
| (1d)-15 | Et | n-pentyl | H | H | H | H |
| (1d)-16 | Et | n-hexyl | H | H | H | H |
| (1d)-17 | Me | n-heptyl | H | H | H | H |
| (1d)-18 | Me | n-octyl | H | H | H | H |
| (1d)-19 | Me | n-nonyl | H | H | H | H |
| (1d)-20 | Me | n-decyl | H | H | H | H |
| (1d)-21 | Me | n-undecyl | H | H | H | H |
| (1d)-22 | Me | n-dodecyl | H | H | H | H |
| (1d)-23 | Me | (P)(Q = $-CH_2-$, n = 2, $R_{51} = CH_3$) | H | H | H | H |
| (1d)-24 | Me | (P)(Q = $-CH_2-$, n = 3, $R_{51} = CH_3$) | H | H | H | H |
| (1d)-25 | Me | (P)(Q = $-CH_2-$, n = 4, $R_{51} = CH_3$) | H | H | H | H |
| (1d)-26 | Me | (P)(Q = $-CH_2-$, n = 8, $R_{51} = CH_3$) | H | H | H | H |
| (1d)-27 | Me | (P)(Q = $-C(=O)-$, n = 2, $R_{51} = CH_3$) | H | H | H | H |
| (1d)-28 | Me | (P)(Q = $-C(=O)-$, n = 3, $R_{51} = CH_3$) | H | H | H | H |
| (1d)-29 | Me | (P)(Q = $-C(=O)-$, n = 4, $R_{51} = CH_3$) | H | H | H | H |
| (1d)-30 | Me | (P)(Q = $-C(=O)-$, n = 8, $R_{51} = CH_3$) | H | H | H | H |
| (1d)-31 | n-butyl | Me | Me | H | H | H |
| (1d)-32 | n-butyl | Me | H | Me | H | H |
| (1d)-33 | n-butyl | Me | H | H | Me | H |
| (1d)-34 | n-butyl | Me | H | Ph | H | H |
| (1d)-35 | (a1) | Me | Me | H | H | H |
| (1d)-36 | (a2) | Me | H | Me | H | H |
| (1d)-37 | (a2) | Me | H | H | Me | H |
| (1d)-38 | (a3) | Me | H | Ph | H | H |
| (1d)-39 | n-butyl | Ph | H | H | H | H |
| (1d)-40 | n-butyl | Me | H | (D)-1 | H | H |
| (1d)-41 | n-butyl | H | H | H | H | H |

[Formula 16]

General formula (4)

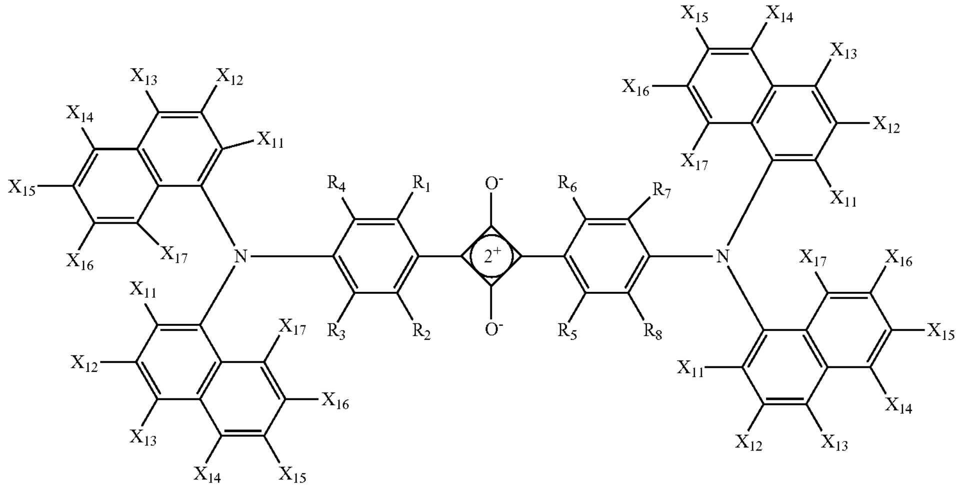

In the compound (4), which has the structure represented by the general formula (4), $R_1$ and $R_5$ each preferably represent a NHCORa group, a OH group, a $NHSO_2Rb$ group, or a NHPO(ORf)(ORg) group, and each Ra preferably represents an alkyl group (a). Table V shows examples of such a compound (4). In the Table, "tolyl" (represents a tolyl group.

TABLE 5

Table V

| Compound name (abbreviation) | $R_1$ | Ra | Rb | Rf | Rg | $R_2$ | $R_3$ | $R_4$ | $R_5$ | Ra | Rb |
|---|---|---|---|---|---|---|---|---|---|---|---|
| (4)-1 | NHCORa | n-butyl | — | — | — | H | H | H | NHCORa | n-butyl | — |
| (4)-2 | NHCORa | n-butyl | — | — | — | H | H | H | NHCORa | n-butyl | — |
| (4)-3 | NHCORa | (a1) | — | — | — | H | H | H | NHCORa | (a1) | — |
| (4)-4 | NHCORa | (a2) | — | — | — | H | H | H | NHCORa | (a2) | — |
| (4)-5 | NHCORa | (a2) | — | — | — | H | H | H | NHCORa | (a2) | — |
| (4)-6 | NHCORa | (a3) | — | — | — | H | H | H | NHCORa | (a3) | — |
| (4)-7 | OH | — | — | — | — | H | H | H | OH | — | — |
| (4)-8 | OH | — | — | — | — | H | H | H | OH | — | — |
| (4)-9 | OH | — | — | — | — | H | H | H | OH | — | — |
| (4)-10 | OH | — | — | — | — | H | H | H | OH | — | — |
| (4)-11 | OH | — | — | — | — | H | H | H | OH | — | — |
| (4)-12 | $NHSO_2Rb$ | — | (a1) | — | — | H | H | H | $NHSO_2Rb$ | — | (a1) |
| (4)-13 | $NHSO_2Rb$ | — | tolyl | — | — | H | H | H | $NHSO_2Rb$ | — | tolyl |
| (4)-14 | $NH_2PO(ORf)(ORg)$ | — | — | Me | Me | H | H | H | $NH_2PO(ORf)(ORg)$ | — | — |

| Compound name (abbreviation) | Rf | Rg | $R_6$ | $R_7$ | $R_8$ | $X_{11}$ | $X_{12}$ | $X_{13}$ | $X_{14}$ | $X_{15}$ | $X_{16}$ | $X_{17}$ |
|---|---|---|---|---|---|---|---|---|---|---|---|---|
| (4)-1 | — | — | H | H | H | Me | H | H | H | H | H | H |
| (4)-2 | — | — | H | H | H | Me | H | Ph | H | H | H | H |
| (4)-3 | — | — | H | H | H | Me | H | H | H | H | H | H |
| (4)-4 | — | — | H | H | H | Me | H | Ph | H | H | H | H |
| (4)-5 | — | — | H | H | H | Me | H | H | H | H | H | H |
| (4)-6 | — | — | H | H | H | Me | H | Ph | H | H | H | H |
| (4)-7 | — | — | H | H | H | n-butyl | H | H | H | H | H | H |
| (4)-8 | — | — | H | H | H | (a5) | H | H | H | H | H | H |
| (4)-9 | — | — | H | H | H | (a2) | H | H | H | H | H | H |
| (4)-10 | — | — | H | H | H | (P)(n = 8, $R_{51}$ = $CH_3$) | H | H | H | H | H | H |
| (4)-11 | — | — | H | H | H | (a2) | H | Ph | H | H | H | H |
| (4)-12 | — | — | H | H | H | H | H | H | H | H | H | H |
| (4)-13 | — | — | H | H | H | (P)(n = 8, $R_{51}$ = $CH_3$) | H | H | H | H | H | H |
| (4)-14 | Me | Me | H | H | H | H | H | H | H | H | H | H |

[Formula 17]

General formula (5)

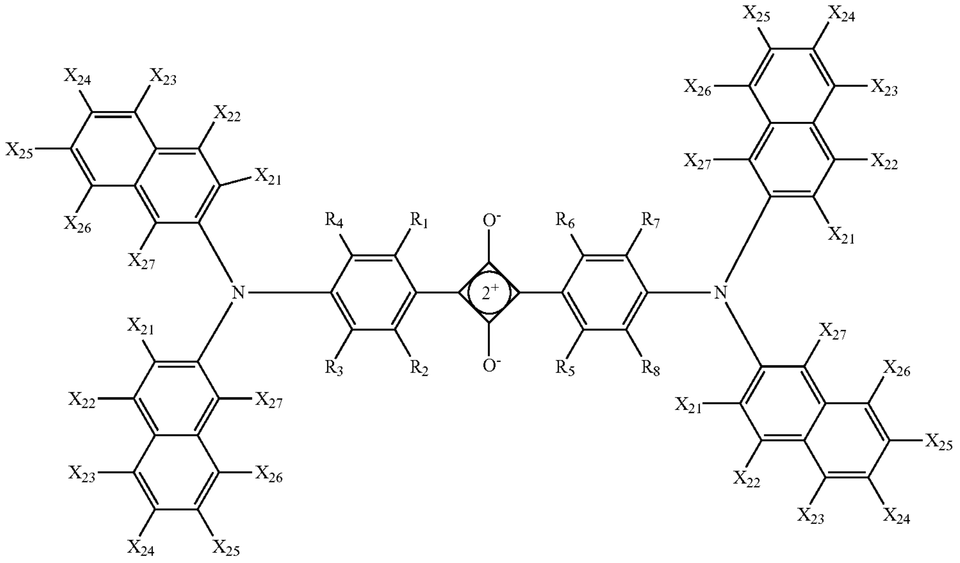

In the compound (5), which has the structure represented by the general formula (5), $R_1$ and $R_5$ each preferably represent a NHCORa group, a OH group, a $NHOS_2Rb$ group, or a NHPO(OR)(ORg) group, and each Ra preferably represents an alkyl group (a). Table VI shows examples of such a compound (5).

TABLE 6

Table VI

| Compound name (abbreviation) | $R_1$ | Ra | Rb | Rf | Rg | $R_2$ | $R_3$ | $R_4$ | $R_5$ | Ra | Rb | Rf |
|---|---|---|---|---|---|---|---|---|---|---|---|---|
| (5)-1 | NHCORa | n-butyl | — | — | — | H | H | H | NHCORa | n-butyl | — | — |
| (5)-2 | NHCORa | n-butyl | — | — | — | H | H | H | NHCORa | n-butyl | — | — |
| (5)-3 | NHCORa | (a1) | — | — | — | H | H | H | NHCORa | (a1) | — | — |
| (5)-4 | NHCORa | (a2) | — | — | — | H | H | H | NHCORa | (a2) | — | — |
| (5)-5 | NHCORa | (a2) | — | — | — | H | H | H | NHCORa | (a2) | — | — |
| (5)-6 | NHCORa | (a3) | — | — | — | H | H | H | NHCORa | (a3) | — | — |
| (5)-7 | OH | — | — | — | — | H | H | H | OH | — | — | — |
| (5)-8 | OH | — | — | — | — | H | H | H | OH | — | — | — |
| (5)-9 | OH | — | — | — | — | H | H | H | OH | — | — | — |
| (5)-10 | OH | — | — | — | — | H | H | H | OH | — | — | — |
| (5)-11 | OH | — | — | — | — | H | H | H | OH | — | — | — |
| (5)-12 | OH | — | — | — | — | H | H | H | OH | — | — | — |
| (5)-13 | $NHSO_2Rb$ | — | (a1) | — | — | H | H | H | $NHSO_2Rb$ | — | (a1) | — |
| (5)-14 | $NHSO_2Rb$ | — | tolyl | — | — | H | H | H | $NHSO_2Rb$ | — | tolyl | — |
| (5)-15 | $NH_2PO(ORf)(ORg)$ | — | — | Me | Me | H | H | H | $NH_2PO(ORf)(ORg)$ | — | — | Me |

| Compound name (abbreviation) | Rg | $R_6$ | $R_7$ | $R_8$ | $X_{21}$ | $X_{22}$ | $X_{23}$ | $X_{24}$ | $X_{25}$ | $X_{26}$ | $X_{27}$ |
|---|---|---|---|---|---|---|---|---|---|---|---|
| (5)-1 | — | H | H | H | Me | H | H | H | H | H | H |
| (5)-2 | — | H | H | H | Me | H | Ph | H | H | H | H |
| (5)-3 | — | H | H | H | Me | H | H | H | H | H | H |
| (5)-4 | — | H | H | H | Me | H | Ph | H | H | H | H |
| (5)-5 | — | H | H | H | Me | H | H | H | H | H | H |
| (5)-6 | — | H | H | H | Me | H | Ph | H | H | H | H |
| (5)-7 | — | H | H | H | n-butyl | H | H | H | H | H | H |
| (5)-8 | — | H | H | H | H | H | H | H | H | H | n-butyl |
| (5)-9 | — | H | H | H | (a5) | H | H | H | H | H | H |
| (5)-10 | — | H | H | H | (a6) | H | H | H | H | H | H |
| (5)-11 | — | H | H | H | (P)(n = 6, $R_{51}$ = $CH_3$) | H | H | H | H | H | H |
| (5)-12 | — | H | H | H | (a6) | H | Ph | H | H | H | H |
| (5)-13 | — | H | H | H | H | H | H | H | H | H | H |
| (5)-14 | — | H | H | H | H | H | H | H | H | H | H |
| (5)-15 | Me | H | H | H | (a5) | H | H | H | H | H | H |

[Formula 18]
General formula (6)
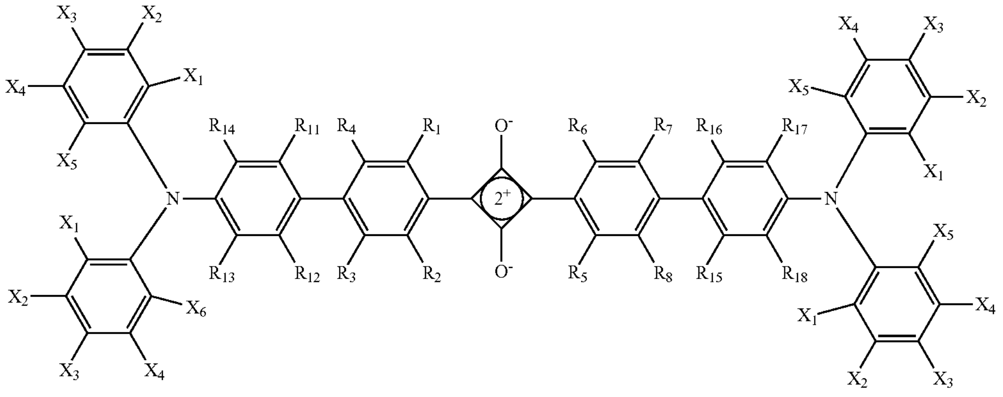
General formula (7)
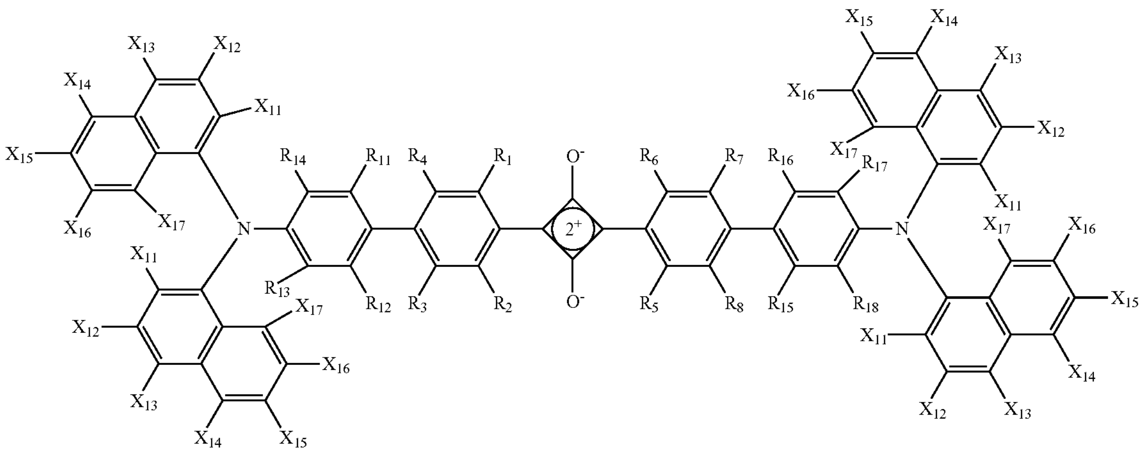
General formula (8)
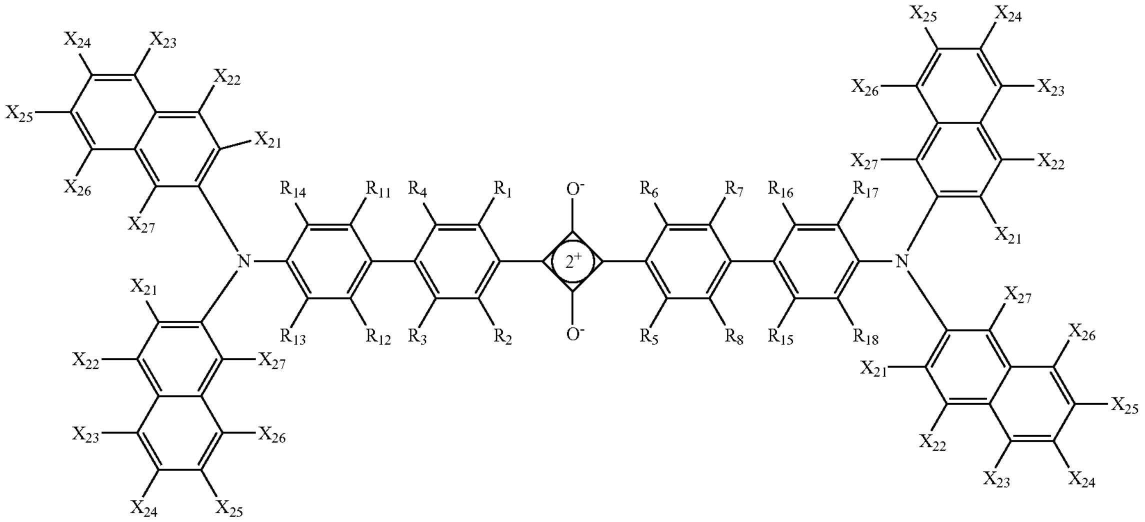
Table VII, Table VIII and Table IX show specific examples of the compounds (6) to (8), which have the structures represented by the general formulae (6) to (8), respectively. In the following Tables. "—O-(a4)" represents a group (a4) to which —O— as a link age is bound.

TABLE 7

Table VII

| Compound name (abbreviation) | $R_1$ | Ra | Rb | Rf | Rg | $R_2$ | $R_3$ | $R_4$ | $R_5$ | Ra | Rb | Rf | Rg | $R_6$ |
|---|---|---|---|---|---|---|---|---|---|---|---|---|---|---|
| (6)-1 | OH | — | — | — | — | H | H | H | OH | — | — | — | — | H |
| (6)-2 | OH | — | — | — | — | H | H | H | OH | — | — | — | — | H |
| (6)-3 | OH | — | — | — | — | H | Me | H | OH | — | — | — | — | H |
| (6)-4 | OH | — | — | — | — | H | H | H | OH | — | — | — | — | H |
| (6)-5 | NHCORa | n-butyl | — | — | — | H | H | H | NHCORa | n-butyl | — | — | — | H |
| (6)-6 | NHCORa | n-hexyl | — | — | — | H | H | H | NHCORa | n-hexyl | — | — | — | H |
| (6)-7 | NHCORa | (a1) | — | — | — | H | H | H | NHCORa | (a1) | — | — | — | H |
| (6)-8 | NHCORa | (a2) | — | — | — | H | H | H | NHCORa | (a2) | — | — | — | H |
| (6)-9 | NHCORa | (a2) | — | — | — | H | H | H | NHCORa | (a2) | — | — | — | H |
| (6)-10 | NHCORa | (a3) | — | — | — | H | H | H | NHCORa | (a3) | — | — | — | H |
| (6)-11 | $NHSO_2Rb$ | — | (a1) | — | — | H | H | H | $NHSO_2Rb$ | — | (a1) | — | — | H |
| (6)-12 | $NHSO_2Rb$ | — | tolyl | — | — | H | H | H | $NHSO_2Rb$ | — | tolyl | — | — | H |
| (6)-13 | $NH_2PO(ORf)(ORg)$ | — | — | Me | Me | H | H | H | $NH_2PO(ORf)(ORg)$ | — | — | Me | Me | H |

| Compound name (abbreviation) | $R_7$ | $R_8$ | $R_{11}$ | $R_{12}$ | $R_{13}$ | $R_{14}$ | $R_{15}$ | $R_{16}$ | $R_{17}$ | $R_{18}$ | $X_1$ | $X_2$ | $X_3$ | $X_4$ | $X_5$ |
|---|---|---|---|---|---|---|---|---|---|---|---|---|---|---|---|
| (6)-1 | H | H | H | H | H | H | H | H | H | H | (a2) | H | H | H | H |
| (6)-2 | H | H | Me | Me | H | H | Me | Me | H | H | n-butyl | H | H | H | H |
| (6)-3 | Me | H | H | H | H | H | H | H | H | H | *1 | H | H | H | H |
| (6)-4 | H | H | H | H | H | H | H | H | H | H | n-octyl | H | Ph | H | H |
| (6)-5 | H | H | H | H | H | H | H | H | H | H | Me | H | H | H | H |
| (6)-6 | H | H | H | H | H | H | H | H | H | H | Me | H | Ph | H | H |
| (6)-7 | H | H | H | H | H | H | H | H | H | H | Me | H | H | H | H |
| (6)-8 | H | H | H | H | H | H | H | H | H | H | Me | H | H | H | H |
| (6)-9 | H | H | H | H | H | H | H | H | H | H | Me | H | H | Me | H |
| (6)-10 | H | H | H | H | H | H | H | H | H | H | Me | H | Ph | H | H |
| (6)-11 | H | H | H | H | H | H | H | H | H | H | Me | H | H | H | H |
| (6)-12 | H | H | H | H | H | H | H | H | H | H | Me | H | H | H | H |
| (6)-13 | H | H | H | H | H | H | H | H | H | H | Me | H | H | H | H |

*1: (P)(Q = $-CH_2-$, n = 9, $R_{51}$ = H)

TABLE 8

Table VIII

| Compound name (abbreviation) | $R_1$ | Ra | Rb | Rf | Rg | $R_2$ | $R_3$ | $R_4$ | $R_5$ | Ra | Rb | Rf | Rg | $R_6$ | $R_7$ |
|---|---|---|---|---|---|---|---|---|---|---|---|---|---|---|---|
| (7)-1 | NHCORa | n-butyl | — | — | — | H | H | H | NHCORa | n-butyl | — | — | — | H | H |
| (7)-2 | NHCORa | n-hexyl | — | — | — | H | H | H | NHCORa | n-hexyl | — | — | — | H | H |
| (7)-3 | NHCORa | (a1) | — | — | — | H | H | H | NHCORa | (a1) | — | — | — | H | H |
| (7)-4 | NHCORa | (a2) | — | — | — | H | H | H | NHCORa | (a2) | — | — | — | H | H |
| (7)-5 | NHCORa | (a2) | — | — | — | H | H | H | NHCORa | (a2) | — | — | — | H | H |
| (7)-6 | NHCORa | (a3) | — | — | — | H | H | H | NHCORa | (a3) | — | — | — | H | H |
| (7)-7 | OH | — | — | — | — | H | H | H | OH | — | — | — | — | H | H |
| (7)-8 | OH | — | — | — | — | H | H | H | OH | — | — | — | — | H | H |
| (7)-9 | OH | — | — | — | — | H | Me | H | OH | — | — | — | — | H | Me |
| (7)-10 | OH | — | — | — | — | H | H | H | OH | — | — | — | — | H | H |
| (7)-11 | $NHSO_2Rb$ | — | (a1) | — | — | H | H | H | $NHSO_2Rb$ | — | (a1) | — | — | H | H |
| (7)-12 | $NHSO_2Rb$ | — | tolyl | — | — | H | H | H | $NHSO_2Rb$ | — | tolyl | — | — | H | H |
| (7)-13 | *2 | — | — | Me | Me | H | H | H | *2 | — | — | Me | Me | H | H |

| Compound name (abbreviation) | $R_8$ | $R_{11}$ | $R_{12}$ | $R_{13}$ | $R_{14}$ | $R_{15}$ | $R_{16}$ | $R_{17}$ | $R_{18}$ | $X_{11}$ | $X_{12}$ | $X_{13}$ | $X_{14}$ | $X_{15}$ | $X_{16}$ | $X_{17}$ |
|---|---|---|---|---|---|---|---|---|---|---|---|---|---|---|---|---|
| (7)-1 | H | H | H | H | H | H | H | H | H | Me | H | H | H | H | H | H |
| (7)-2 | H | H | H | H | H | H | H | H | H | Me | H | Ph | H | H | H | H |
| (7)-3 | H | H | H | H | H | H | H | H | H | Me | H | H | H | H | H | H |
| (7)-4 | H | H | H | H | H | H | H | H | H | H | H | H | H | H | H | H |
| (7)-5 | H | H | H | H | H | H | H | H | H | Me | H | Me | H | H | H | H |
| (7)-6 | H | H | H | H | H | H | H | H | H | Me | H | Ph | H | H | H | H |
| (7)-7 | H | H | H | H | H | H | H | H | H | (a2) | H | H | H | H | H | H |
| (7)-8 | H | Me | Me | H | H | Me | Me | H | H | n-octyl | H | H | H | H | H | H |
| (7)-9 | H | Me | Me | H | H | Me | Me | H | H | (a5) | H | H | H | H | H | H |

TABLE 8-continued

Table VIII

| | | | | | | | | | | | | | | | | |
|---|---|---|---|---|---|---|---|---|---|---|---|---|---|---|---|---|
| (7)-10 | H | H | H | H | H | H | H | H | H | *1 | H | Ph | H | H | H | H |
| (7)-11 | H | H | H | H | H | H | H | H | H | H | H | H | H | H | H | H |
| (7)-12 | H | H | H | H | H | H | H | H | H | H | H | H | H | H | H | H |
| (7)-13 | H | H | H | H | H | H | H | H | H | *1 | H | H | H | H | H | H |

*1: (P)(n = 8, $R_{51}$ = $CH_2$)
*2: $NH_2PO(ORf)(ORg)$

TABLE 9

Table IX

| Compound name (abbreviation) | $R_1$ | Ra | Rb | Rf | Rg | $R_2$ | $R_3$ | $R_4$ | $R_5$ | Ra | Rb | Rf | Rg | $R_6$ | $R_7$ |
|---|---|---|---|---|---|---|---|---|---|---|---|---|---|---|---|
| (8)-1 | NHCORa | n-butyl | — | — | — | H | H | H | NHCORa | n-butyl | — | — | — | H | H |
| (8)-2 | NHCORa | (a1) | — | — | — | H | H | H | NHCORa | (a1) | — | — | — | H | H |
| (8)-3 | NHCORa | (a2) | — | — | — | H | H | H | NHCORa | (a2) | — | — | — | H | H |
| (8)-4 | NHCORa | (a3) | — | — | — | H | H | H | NHCORa | (a3) | — | — | — | H | H |
| (8)-5 | OH | — | — | — | — | H | H | H | OH | — | — | — | — | H | H |
| (8)-6 | OH | — | — | — | — | H | H | H | OH | — | — | — | — | H | H |
| (8)-7 | OH | — | — | — | — | H | H | H | OH | — | — | — | — | H | H |
| (8)-8 | OH | — | — | — | — | H | H | H | OH | — | — | — | — | H | H |
| (8)-9 | OH | — | — | — | — | H | H | H | OH | — | — | — | — | H | H |
| (8)-10 | OH | — | — | — | — | H | H | H | OH | — | — | — | — | H | H |
| (8)-11 | $NHSO_2Rb$ | — | (a1) | — | — | H | H | H | $NHSO_2Rb$ | — | (a1) | — | — | H | H |
| (8)-12 | $NHSO_2Rb$ | — | tolyl | — | — | H | H | H | $NHSO_2Rb$ | — | tolyl | — | — | H | H |
| (8)-13 | *2 | — | — | Me | Me | H | H | H | *2 | — | — | Me | Me | H | H |

| Compound name (abbreviation) | $R_8$ | $R_{11}$ | $R_{12}$ | $R_{13}$ | $R_{14}$ | $R_{15}$ | $R_{16}$ | $R_{17}$ | $R_{18}$ | $X_{21}$ | $X_{22}$ | $X_{23}$ | $X_{24}$ | $X_{25}$ | $X_{26}$ | $X_{27}$ |
|---|---|---|---|---|---|---|---|---|---|---|---|---|---|---|---|---|
| (8)-1 | H | H | H | H | H | H | H | H | H | Me | H | H | H | H | H | H |
| (8)-2 | H | H | H | H | H | H | H | H | H | Me | H | H | H | H | H | H |
| (8)-3 | H | H | H | H | H | H | H | H | H | H | H | H | H | H | H | H |
| (8)-4 | H | H | H | H | H | H | H | H | H | Me | H | H | H | H | H | H |
| (8)-5 | H | H | H | H | H | H | H | H | H | n-butyl | H | H | H | H | H | H |
| (8)-6 | H | Me | Me | H | H | Me | Me | H | H | H | H | H | H | H | H | H |
| (8)-7 | H | Me | Me | H | H | Me | Me | H | H | (a5) | H | H | H | H | H | H |
| (8)-8 | H | H | H | H | H | H | H | H | H | (a5) | H | H | H | H | H | H |
| (8)-9 | H | H | H | H | H | H | H | H | H | *1 | H | H | H | H | H | H |
| (8)-10 | H | —O-(a4) | H | H | H | —O-(a4) | H | H | H | (a4) | H | H | H | H | H | H |
| (8)-11 | H | H | H | H | H | H | H | H | H | H | H | H | H | H | H | H |
| (8)-12 | H | H | H | H | H | H | H | H | H | H | H | H | H | H | H | H |
| (8)-13 | H | (a6) | H | H | H | (a6) | H | H | H | H | H | H | H | H | H | H |

*1: (P)(n = 9, $R_{51}$ = $CH_3$)
*2: $NH_2PO(ORf)(ORg)$

[Formula 19]

General formula (9)

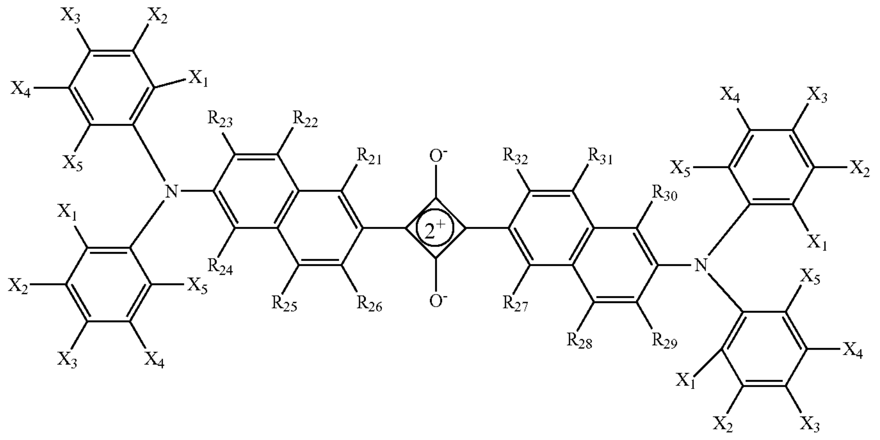

-continued

General formula (10)

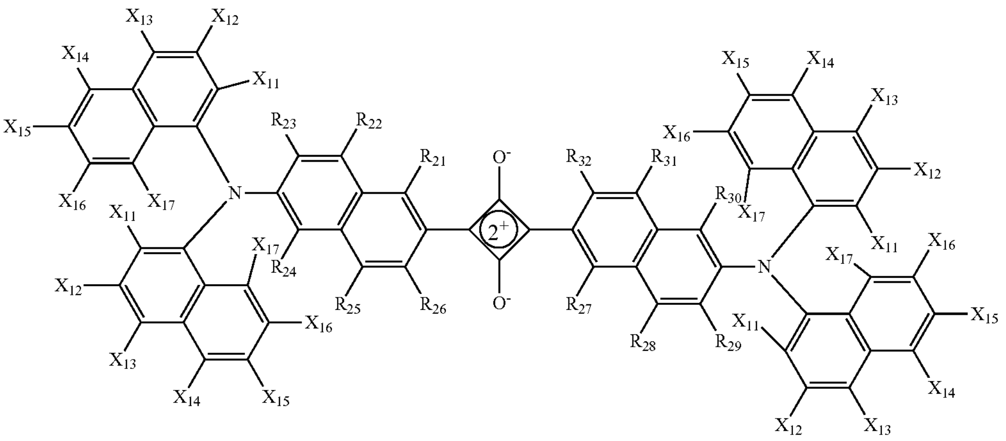

General formula (11)

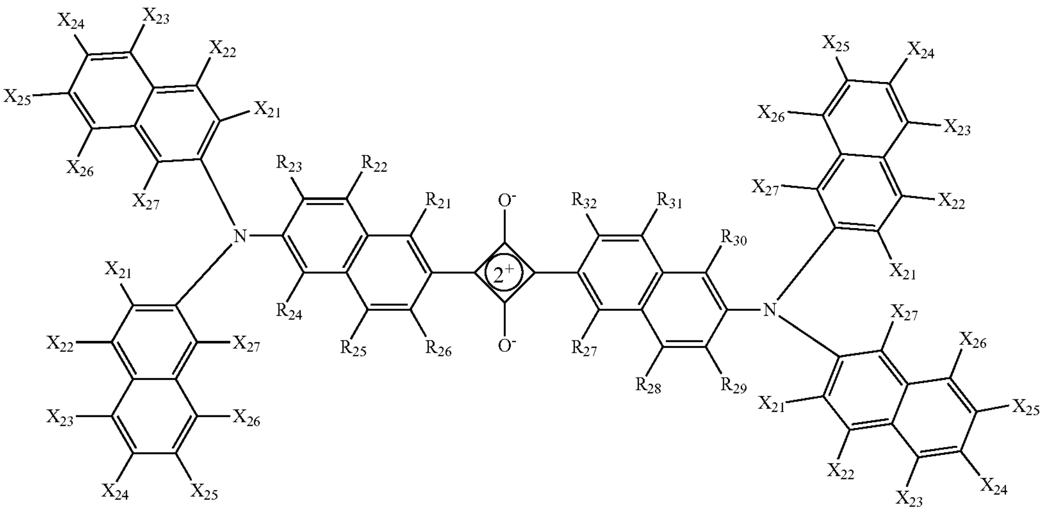

Table X, Table XI and Table XII show specific examples of the compounds (9) to (11), which have the structures represented by the general formulae (9) to (11), respectively.

TABLE 10

| Table X | | | | | | | | | | | |
|---|---|---|---|---|---|---|---|---|---|---|---|
| Compound name (abbreviation) | $R_{21}$ | Ra | Rb | Rf | Rg | $R_{22}$ | $R_{23}$ | $R_{24}$ | $R_{25}$ | $R_{26}$ | $R_{27}$ |
| (9)-1 | OH | — | — | — | — | H | H | H | H | H | OH |
| (9)-2 | OH | — | — | — | — | H | H | H | H | H | OH |
| (9)-3 | OH | — | — | — | — | H | H | H | H | H | OH |
| (9)-4 | OH | — | — | — | — | H | H | H | H | H | OH |
| (9)-5 | NHCORa | n-butyl | — | — | — | H | H | H | H | H | NHCORa |
| (9)-6 | NHCORa | n-hexyl | — | — | — | H | H | H | H | H | NHCORa |
| (9)-7 | NHCORa | (a1) | — | — | — | H | H | H | H | H | NHCORa |
| (9)-8 | NHCORa | (a2) | — | — | — | H | H | H | H | H | NHCORa |
| (9)-9 | NHCORa | (a2) | — | — | — | H | H | H | H | H | NHCORa |
| (9)-10 | NHCORa | (a3) | — | — | — | H | H | H | H | H | NHCORa |
| (9)-11 | $NHSO_2Rb$ | — | (a1) | — | — | H | H | H | H | H | $NHSO_2Rb$ |
| (9)-12 | $NHSO_2Rb$ | — | tolyl | — | — | H | H | H | H | H | $NHSO_2Rb$ |
| (9)-13 | $NH_2PO(ORf)(ORg)$ | — | — | Me | Me | H | H | H | H | H | $NH_2PO(ORf)(ORg)$ |

TABLE 10-continued

Table X

| Compound name (abbreviation) | Ra | Rb | Rf | Rg | $R_{28}$ | $R_{29}$ | $R_{30}$ | $R_{31}$ | $R_{32}$ | $X_1$ | $X_2$ | $X_3$ | $X_4$ | $X_5$ |
|---|---|---|---|---|---|---|---|---|---|---|---|---|---|---|
| (9)-1 | — | — | — | — | H | H | H | H | H | (a6) | H | H | H | H |
| (9)-2 | — | — | — | — | H | H | H | H | H | n-butyl | H | Me | H | H |
| (9)-3 | — | — | — | — | H | H | H | H | H | (P)(n = 9, $R_{51}$ = $CH_3$) | H | H | H | H |
| (9)-4 | — | — | — | — | H | H | H | H | H | n-octyl | H | Ph | H | H |
| (9)-5 | n-butyl | — | — | — | H | H | H | H | H | Me | H | H | H | H |
| (9)-6 | n-hexyl | — | — | — | H | H | H | H | H | Me | H | Ph | H | H |
| (9)-7 | (a1) | — | — | — | H | H | H | H | H | Me | H | H | H | H |
| (9)-8 | (a2) | — | — | — | H | H | H | H | H | Me | H | H | H | H |
| (9)-9 | (a2) | — | — | — | H | H | H | H | H | Me | H | H | Me | H |
| (9)-10 | (a3) | — | — | — | H | H | H | H | H | Me | H | Ph | H | H |
| (9)-11 | — | (a1) | — | — | H | H | H | H | H | H | H | H | H | H |
| (9)-12 | — | tolyl | — | — | H | H | H | H | H | H | H | H | H | H |
| (9)-13 | — | — | Me | Me | H | H | H | H | H | (a6) | H | H | H | H |

TABLE 11

Table XI

| Compound name (abbreviation) | $R_{21}$ | Ra | Rb | Rf | Rg | $R_{22}$ | $R_{23}$ | $R_{24}$ | $R_{25}$ | $R_{26}$ | $R_{27}$ | Ra | Rb |
|---|---|---|---|---|---|---|---|---|---|---|---|---|---|
| (10)-1 | NHCORa | n-butyl | — | — | — | H | H | H | H | H | NHCORa | n-butyl | — |
| (10)-2 | NHCORa | n-hexyl | — | — | — | H | H | H | H | H | NHCORa | n-hexyl | — |
| (10)-3 | NHCORa | (a1) | — | — | — | H | H | H | H | H | NHCORa | (a1) | — |
| (10)-4 | NHCORa | (a2) | — | — | — | H | H | H | H | H | NHCORa | (a2) | — |
| (10)-5 | NHCORa | (a2) | — | — | — | H | H | H | H | H | NHCORa | (a2) | — |
| (10)-6 | NHCORa | (a3) | — | — | — | H | H | H | H | H | NHCORa | (a3) | — |
| (10)-7 | OH | — | — | — | — | H | H | H | H | H | OH | — | — |
| (10)-8 | OH | — | — | — | — | H | H | H | H | H | OH | — | — |
| (10)-9 | OH | — | — | — | — | H | H | H | H | H | OH | — | — |
| (10)-10 | OH | — | — | — | — | H | H | H | H | H | OH | — | — |
| (10)-11 | $NHSO_2Rb$ | — | (a1) | — | — | H | H | H | H | H | $NHSO_2Rb$ | — | (a1) |
| (10)-12 | $NHSO_2Rb$ | — | tolyl | — | — | H | H | H | H | H | $NHSO_2Rb$ | — | tolyl |
| (10)-13 | *2 | — | — | Me | Me | H | H | H | H | H | *2 | — | — |

| Compound name (abbreviation) | Rf | Rg | $R_{28}$ | $R_{29}$ | $R_{30}$ | $R_{31}$ | $R_{32}$ | $X_{11}$ | $X_{12}$ | $X_{13}$ | $X_{14}$ | $X_{15}$ | $X_{16}$ | $X_{17}$ |
|---|---|---|---|---|---|---|---|---|---|---|---|---|---|---|
| (10)-1 | — | — | H | H | H | H | H | Me | H | H | H | H | H | H |
| (10)-2 | — | — | H | H | H | H | H | H | H | H | H | H | H | H |
| (10)-3 | — | — | H | H | H | H | H | Me | H | H | H | H | H | H |
| (10)-4 | — | — | H | H | H | H | H | Me | H | H | H | H | H | H |
| (10)-5 | — | — | H | H | H | H | H | H | H | Me | H | H | H | H |
| (10)-6 | — | — | H | H | H | H | H | Me | H | Ph | H | H | H | H |
| (10)-7 | — | — | H | H | H | H | H | (a7) | H | H | H | H | H | H |
| (10)-8 | — | — | H | H | H | H | H | (a6) | H | H | H | H | H | H |
| (10)-9 | — | — | H | H | H | H | H | *1 | H | H | H | H | H | H |
| (10)-10 | — | — | H | H | H | H | H | n-octyl | H | Ph | H | H | H | H |
| (10)-11 | — | — | H | H | H | H | H | H | H | H | H | H | H | H |
| (10)-12 | — | — | H | H | H | H | H | H | H | H | H | H | H | H |
| (10)-13 | Me | Me | H | H | H | H | H | n-octyl | H | H | H | H | H | H |

*1: (P)(n = 9, $R_{51}$ = $CH_3$)
*2: $NH_2PO(ORf)(ORg)$

TABLE 12

Table XII

| Compound name (abbreviation) | $R_{21}$ | Ra | Rb | Rf | Rg | $R_{22}$ | $R_{23}$ | $R_{24}$ | $R_{25}$ | $R_{26}$ | $R_{27}$ | Ra | Rb | Rf | Rg |
|---|---|---|---|---|---|---|---|---|---|---|---|---|---|---|---|
| (11)-1 | NHCORa | n-butyl | — | — | — | H | H | H | H | H | NHCORa | n-butyl | — | — | — |
| (11)-2 | NHCORa | (a1) | — | — | — | H | H | H | H | H | NHCORa | (a1) | — | — | — |
| (11)-3 | NHCORa | (a2) | — | — | — | H | H | H | H | H | NHCORa | (a2) | — | — | — |
| (11)-4 | OH | — | — | — | — | H | H | H | H | H | OH | — | — | — | — |
| (11)-5 | OH | — | — | — | — | H | H | H | H | H | OH | — | — | — | — |
| (11)-6 | OH | — | — | — | — | H | H | H | H | H | OH | — | — | — | — |
| (11)-7 | OH | — | — | — | — | H | H | H | H | H | OH | — | — | — | — |
| (11)-8 | $NHSO_2Rb$ | — | (a1) | — | — | H | H | H | H | H | $NHSO_2Rb$ | — | (a1) | — | — |
| (11)-9 | $NHSO_2Rb$ | — | tolyl | — | — | H | H | H | H | H | $NHSO_2Rb$ | — | tolyl | — | — |
| (11)-10 | *1 | — | — | Me | Me | H | H | H | H | H | *1 | — | — | Me | Me |

| Compound name (abbreviation) | $R_{28}$ | $R_{29}$ | $R_{30}$ | $R_{31}$ | $R_{32}$ | $X_{21}$ | $X_{22}$ | $X_{23}$ | $X_{24}$ | $X_{25}$ | $X_{26}$ | $X_{27}$ |
|---|---|---|---|---|---|---|---|---|---|---|---|---|
| (11)-1 | H | H | H | H | H | Me | H | H | H | H | H | H |
| (11)-2 | H | H | H | H | H | H | H | H | H | H | H | H |
| (11)-3 | H | H | H | H | H | H | H | H | H | H | H | H |
| (11)-4 | H | H | H | H | H | (a7) | H | H | H | H | H | H |
| (11)-5 | H | H | H | H | H | n-butyl | H | Me | H | H | H | H |
| (11)-6 | H | H | H | H | H | (P)(n = 8, $R_{51}$ = $CH_3$) | H | H | H | H | H | H |
| (11)-7 | H | H | H | H | H | n-octyl | H | H | H | H | H | H |
| (11)-8 | H | H | H | H | H | H | H | H | H | H | H | H |
| (11)-9 | H | H | H | H | H | H | H | H | H | H | H | H |
| (11)-10 | H | H | H | H | H | (P)(n = 9, $R_{51}$ = $CH_3$) | H | H | H | H | H | H |

*1: $NH_2PO(ORf)(ORg)$

Furthermore, the following compounds can also be used as the compound for the first dye and the second dye in the present invention.

[Formula 20]

Da-1

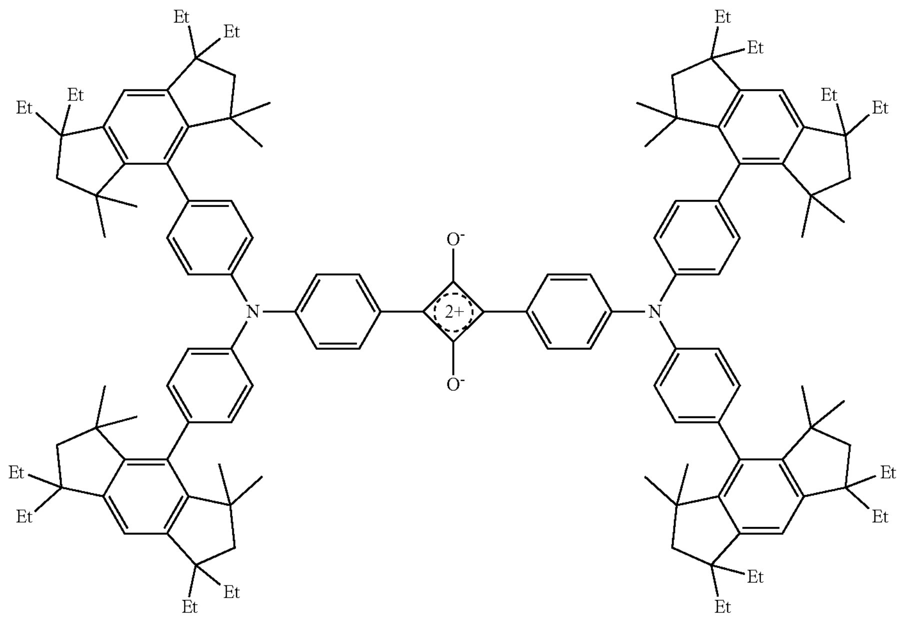

-continued
Da-2
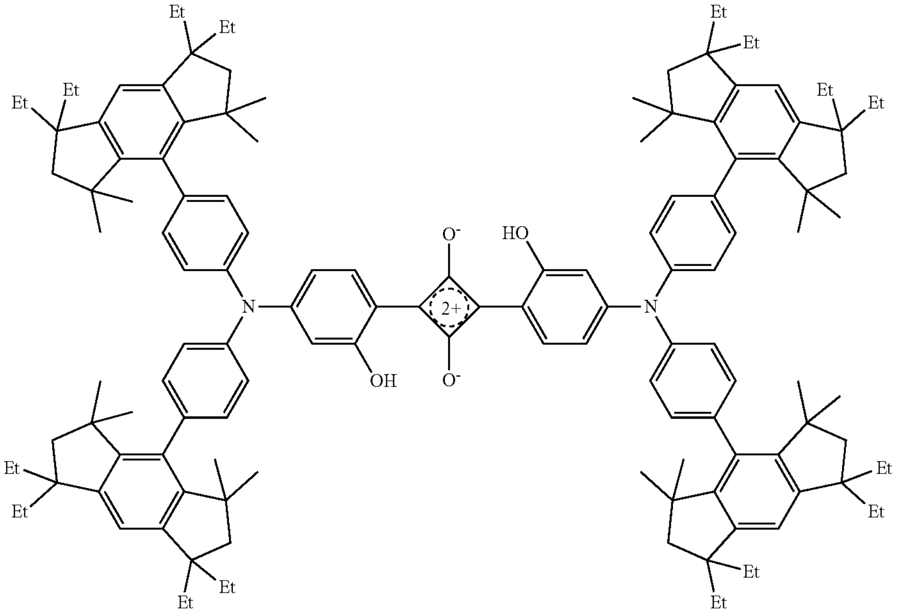
Da-3
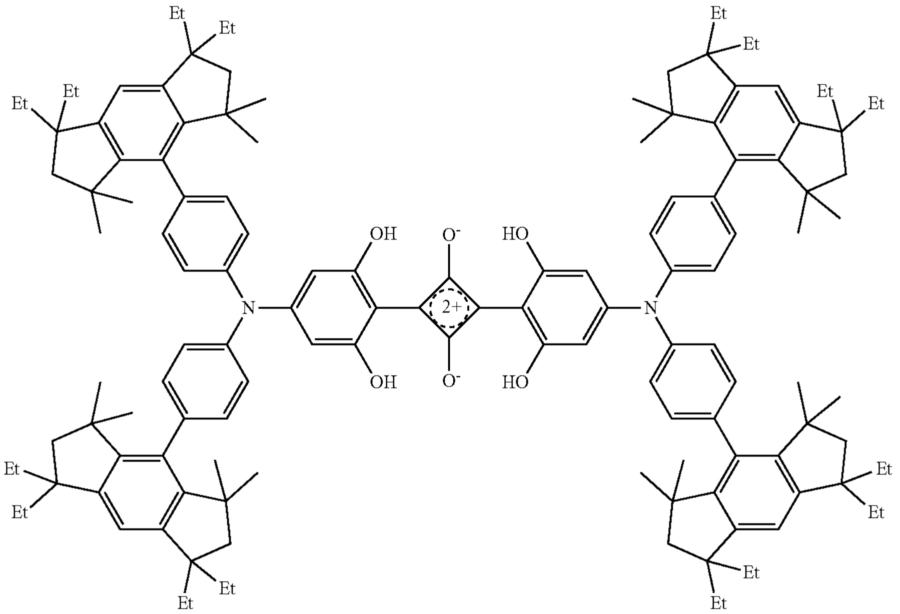

-continued
[Formula 21]
Da-4
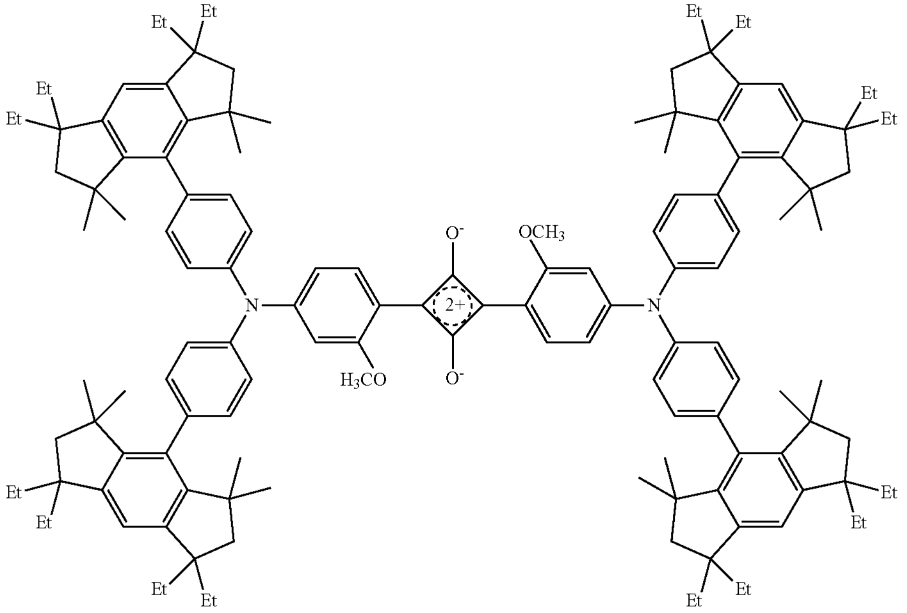
Da-5
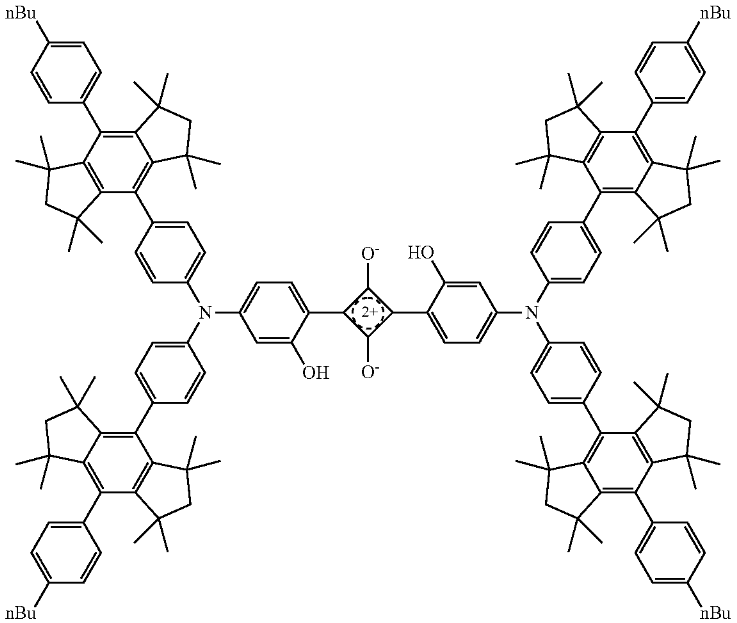

-continued
[Formula 22]
Da-6
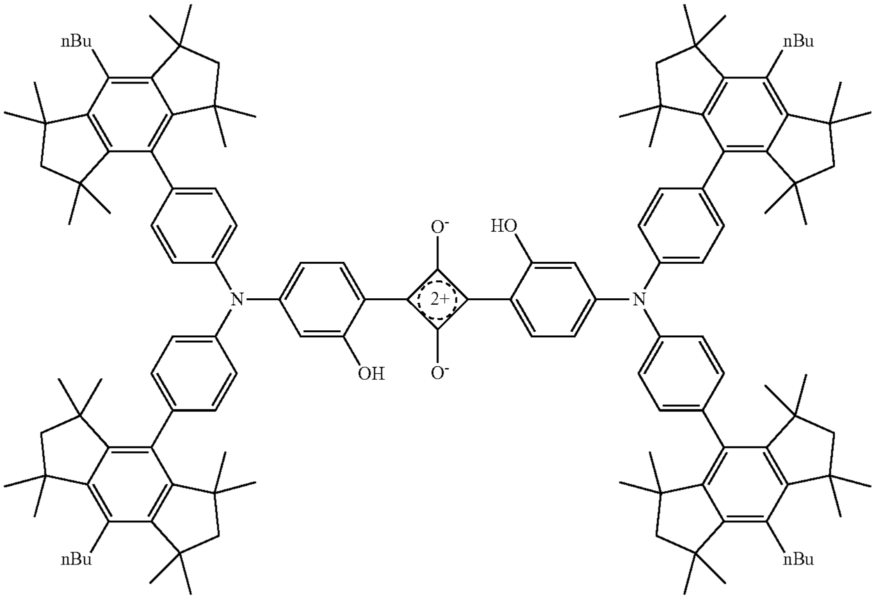
Da-7
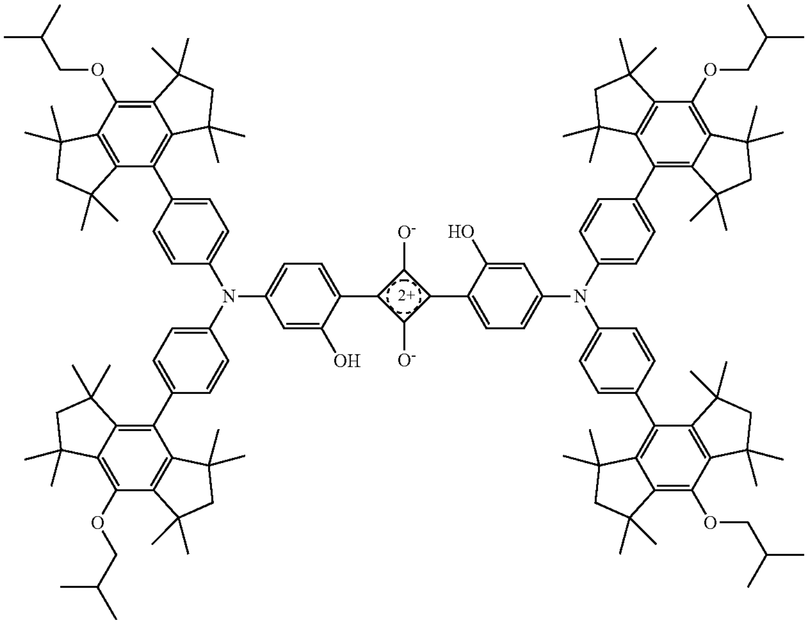

-continued
Da-8
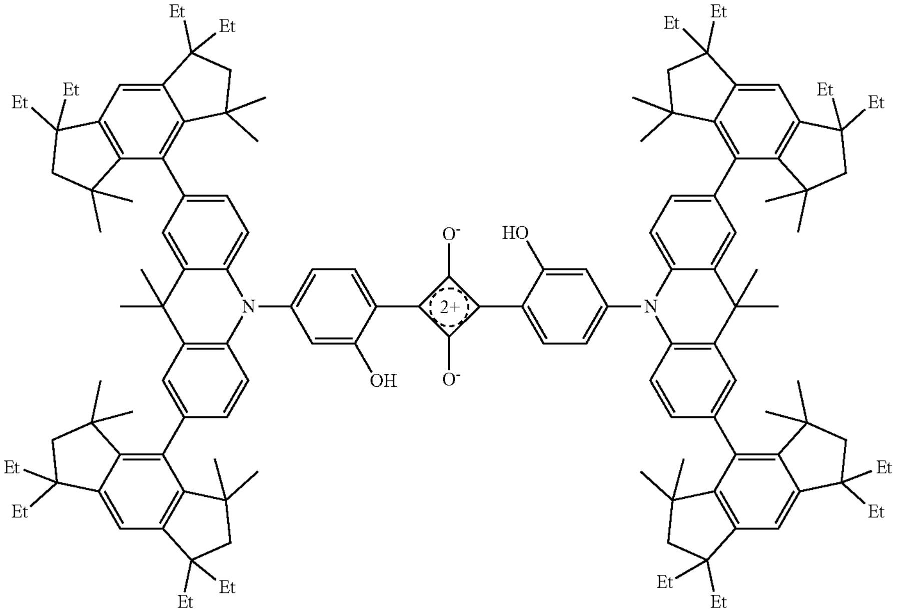
[Formula 23]
Da-9
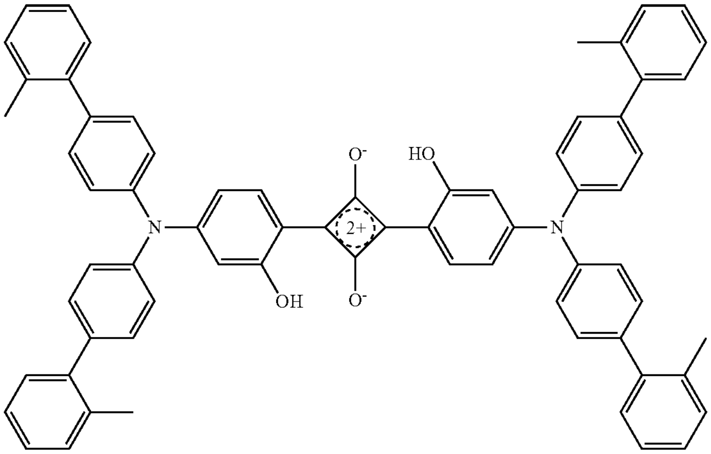

-continued
Da-10
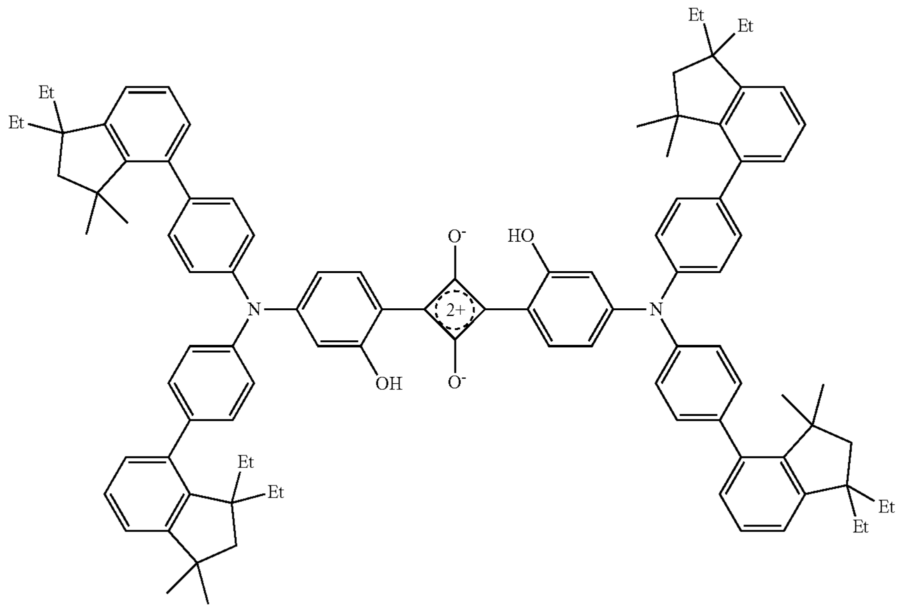
Da-11
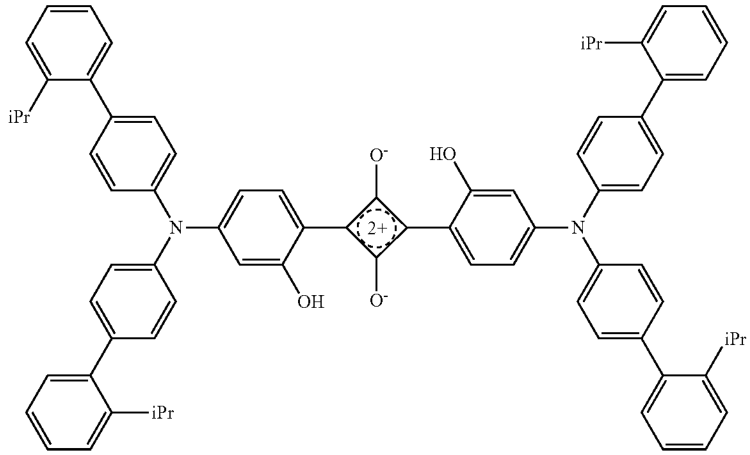
Da-12
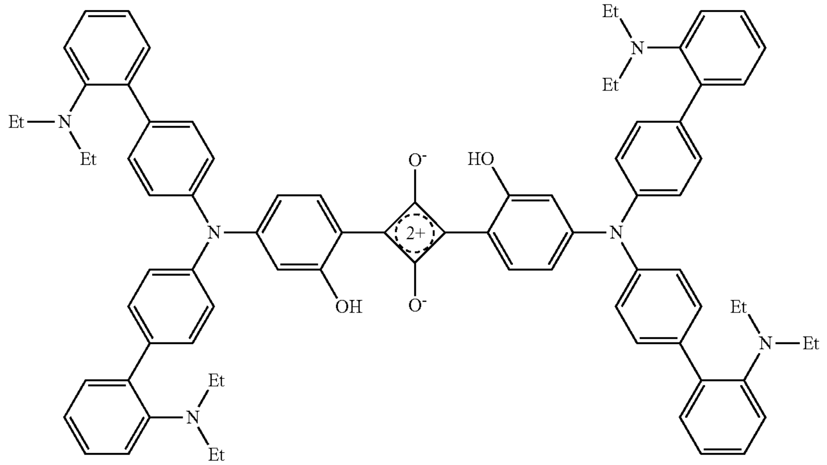

-continued
[Formula 24]
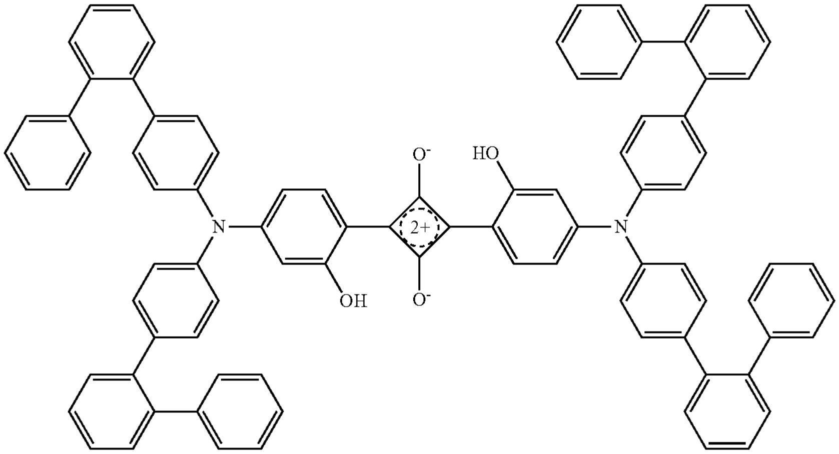
Da-13
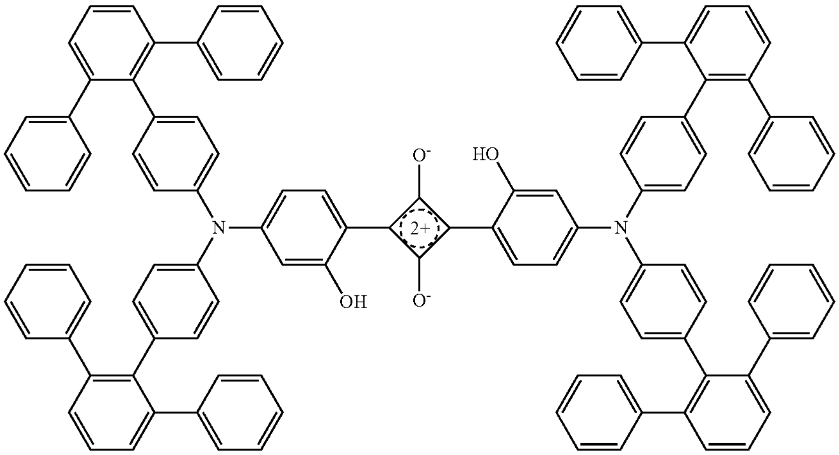
Da-14
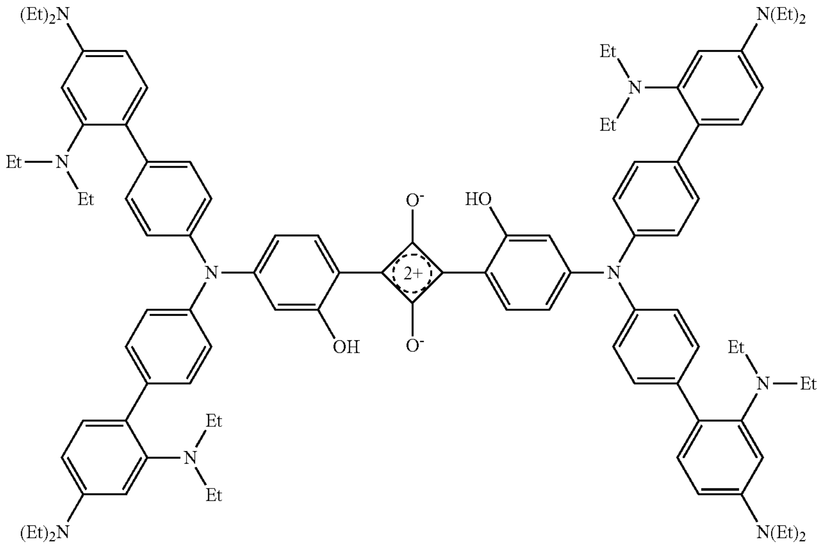
Da-15

-continued
[Formula 25]
Da-16
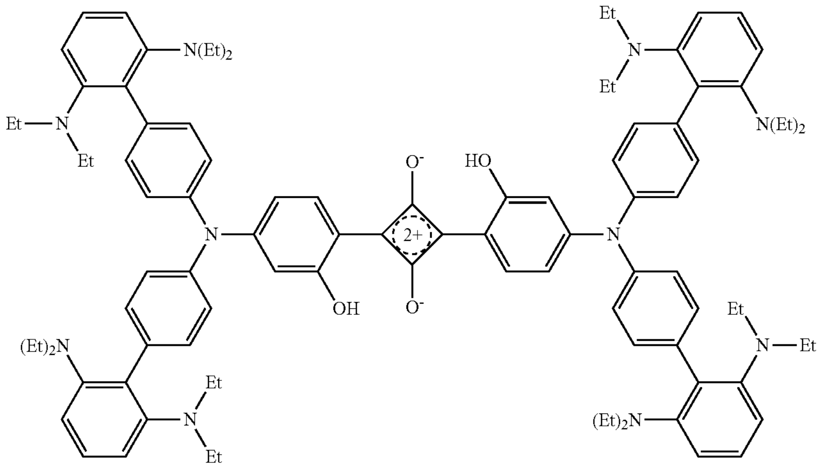
Da-17
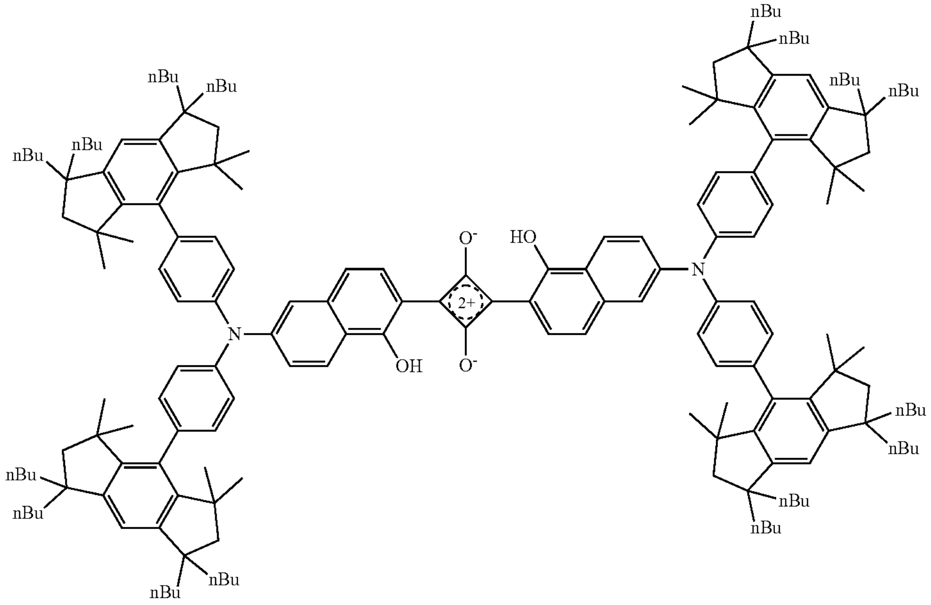

-continued
Da-18
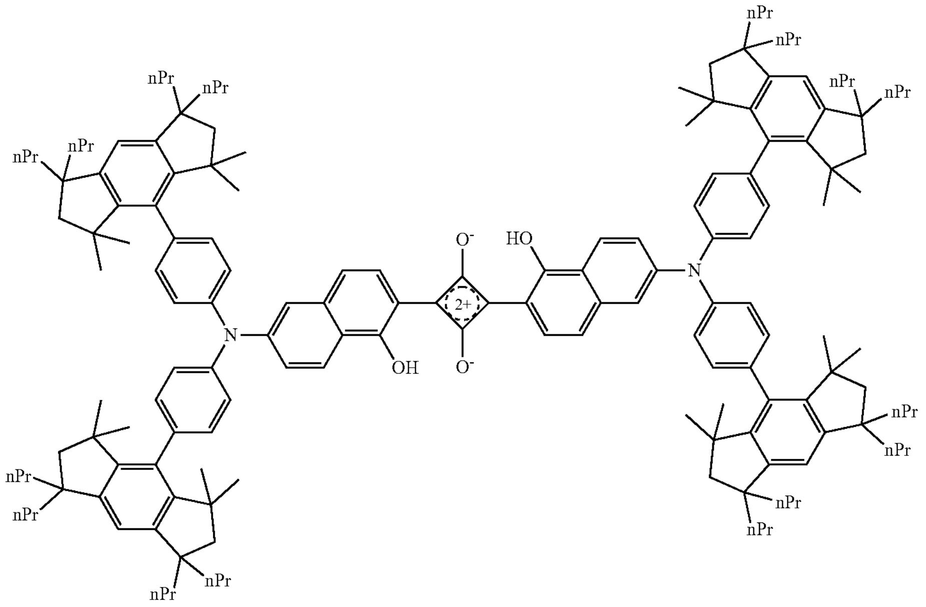
[Formula 26]
Da-19
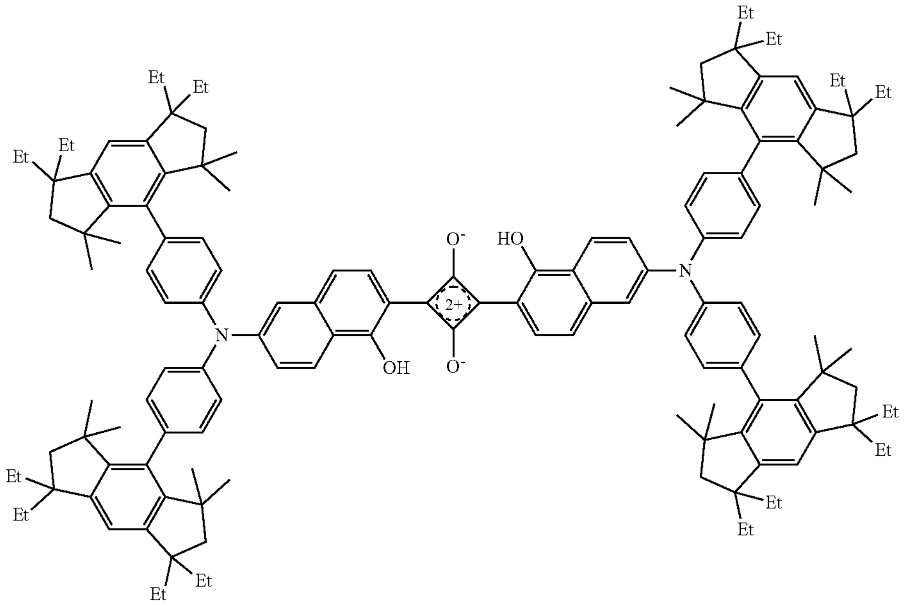

-continued
Da-20
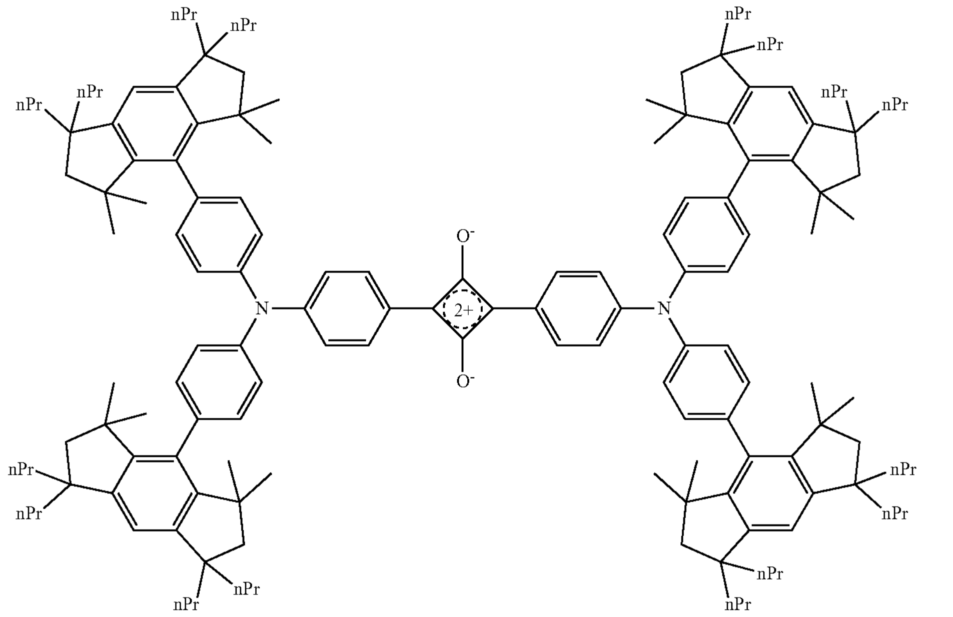
Da-21
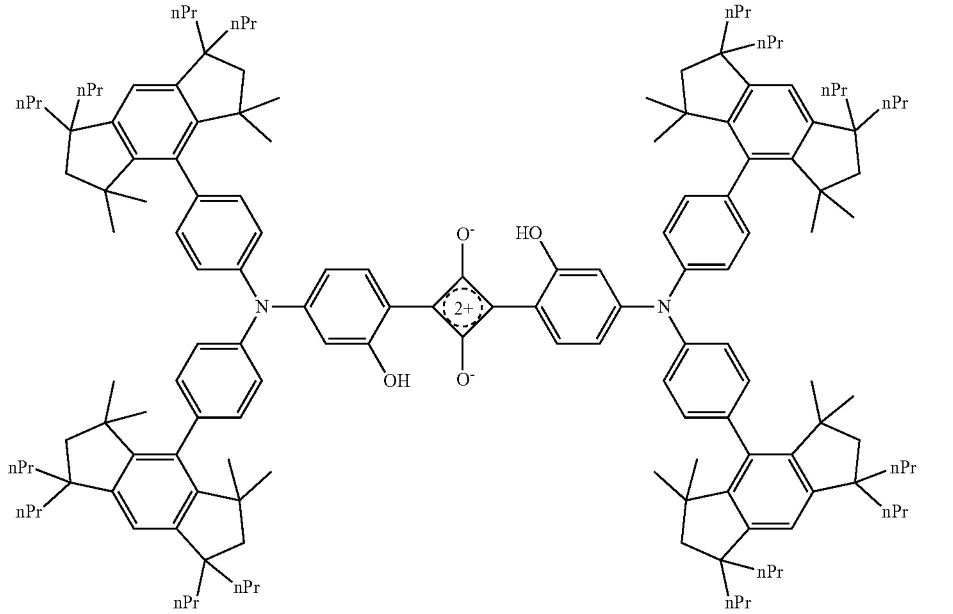

-continued
[Formula 27]
Da-22
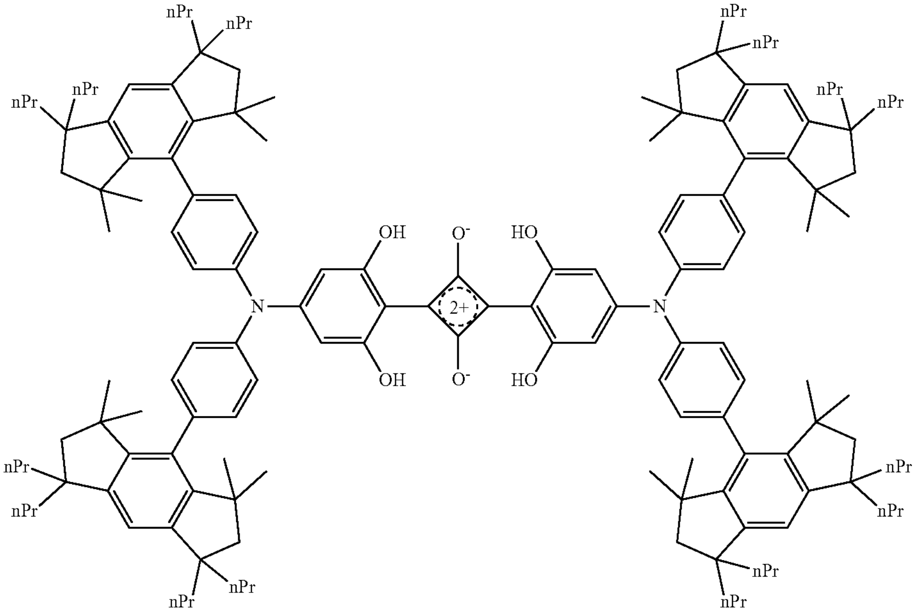
Da-23
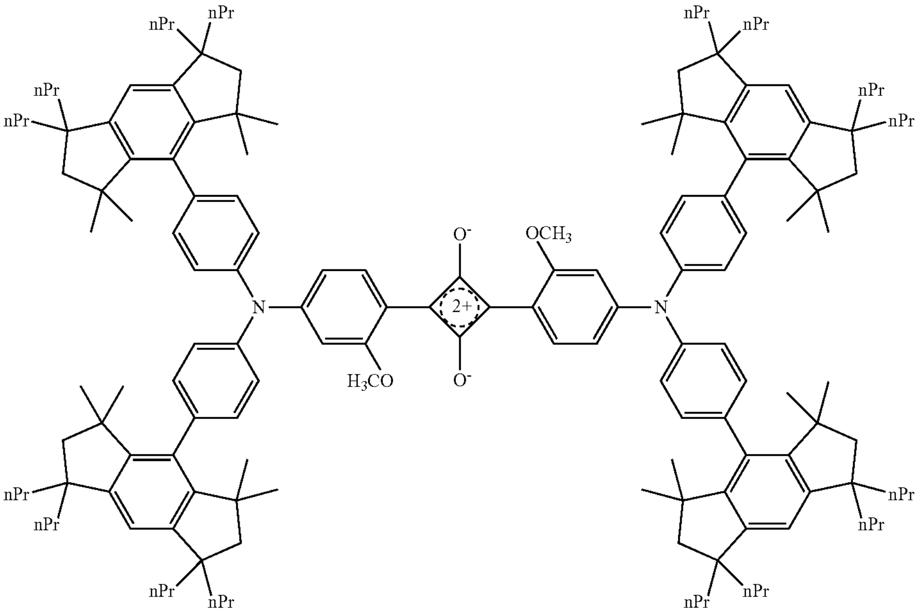

-continued
Da-24
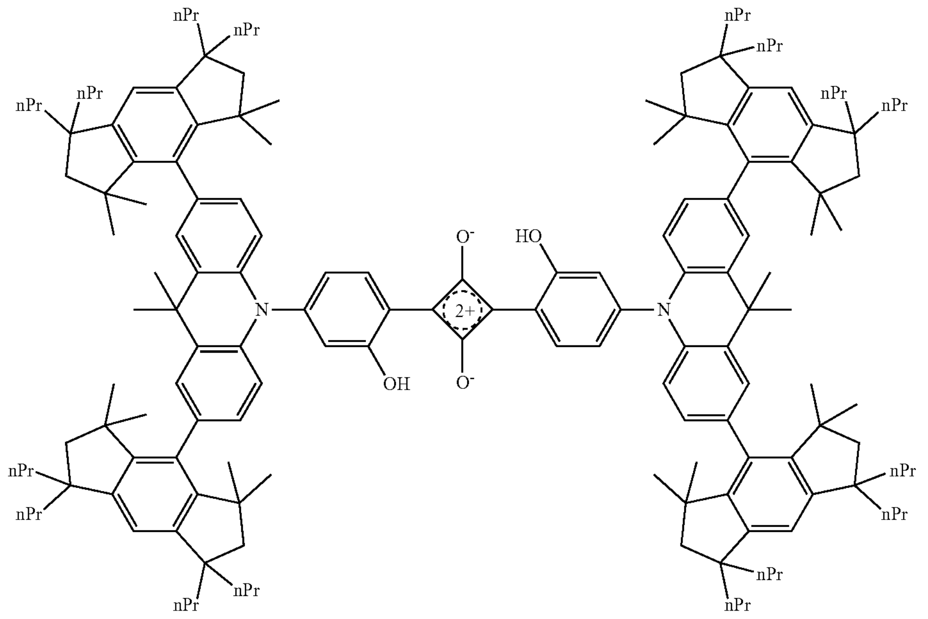
[Formula 28]
Da-25
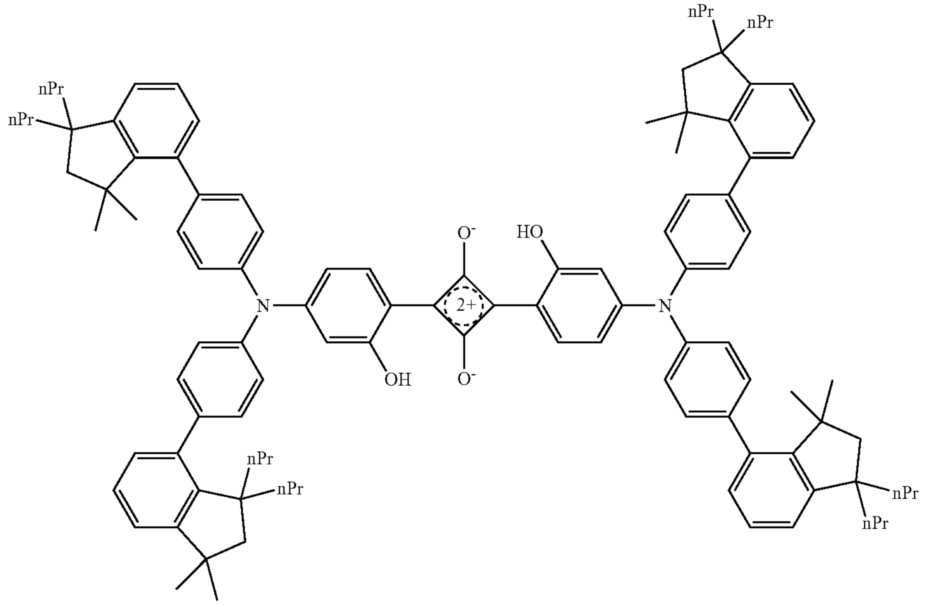

-continued
Da-26
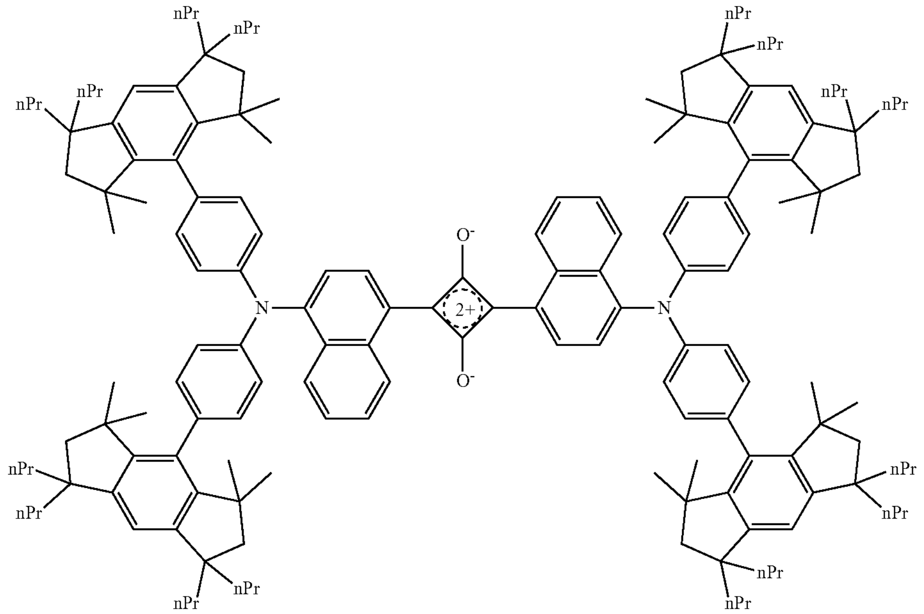
Da-27
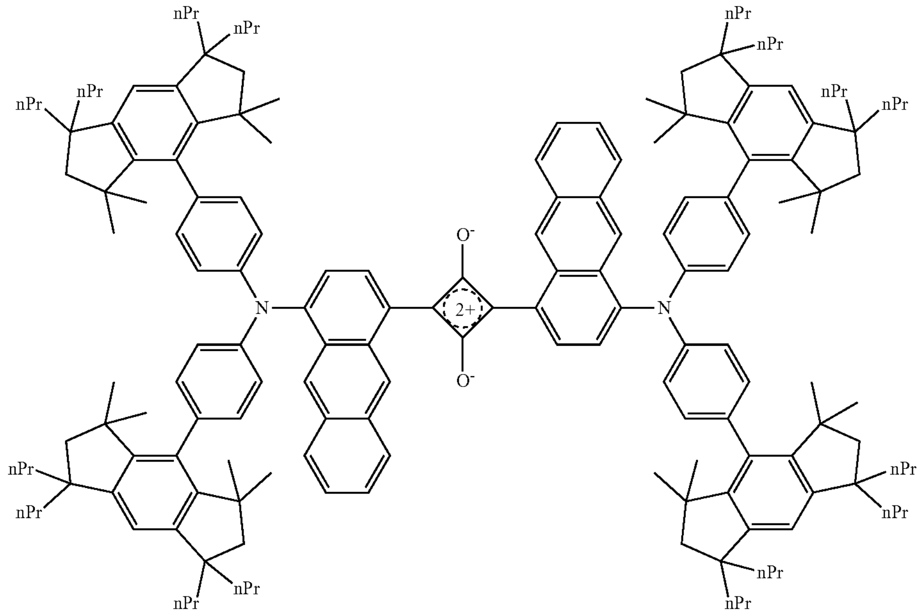

-continued
[Formula 29]
Da-28
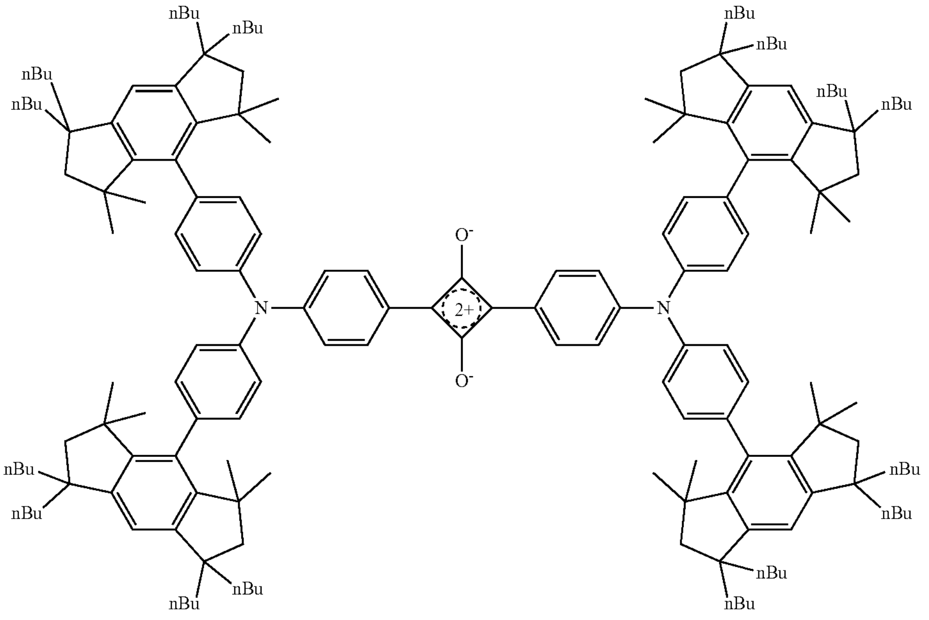
Da-29
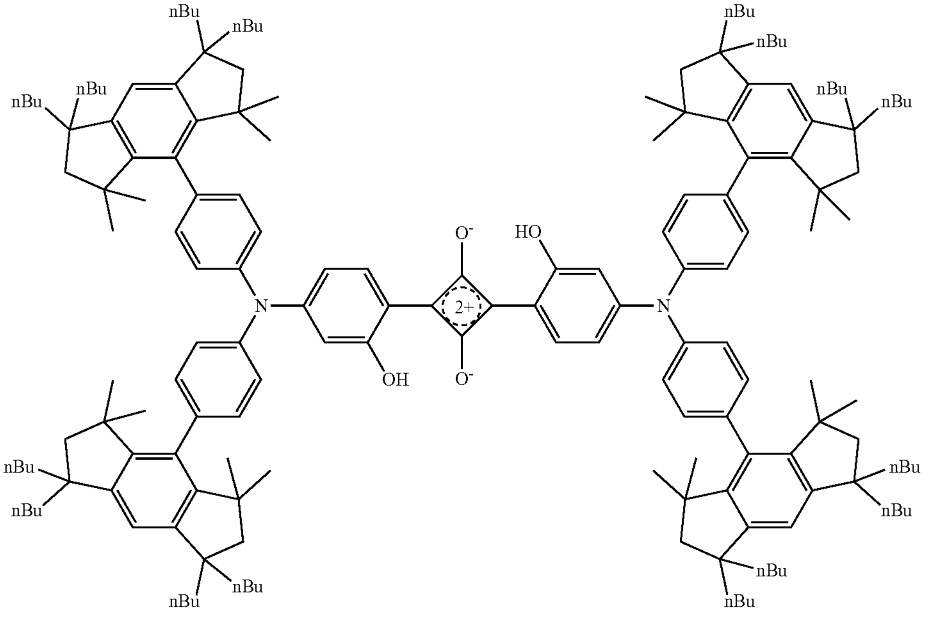

-continued
Da-30
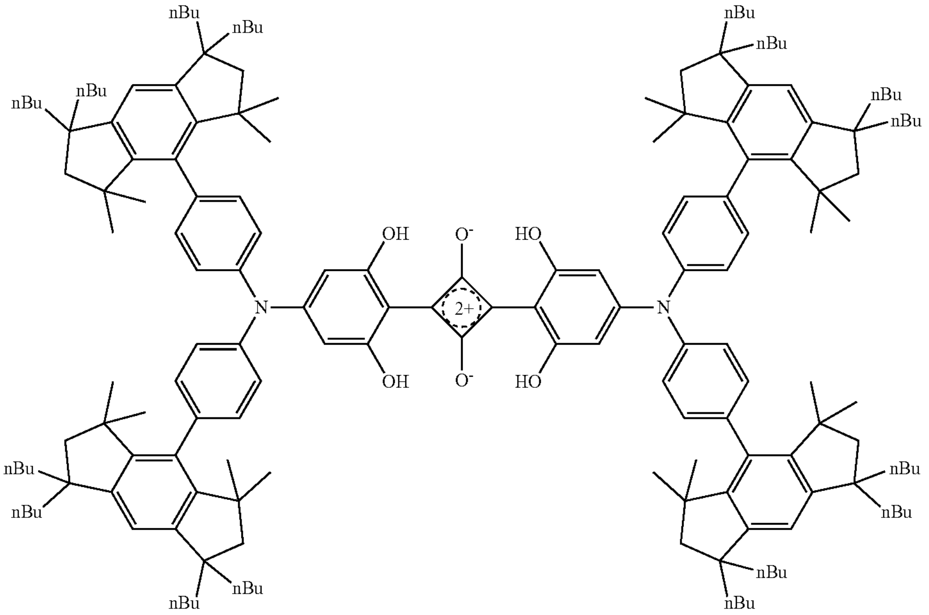
[Formula 30]
Da-31
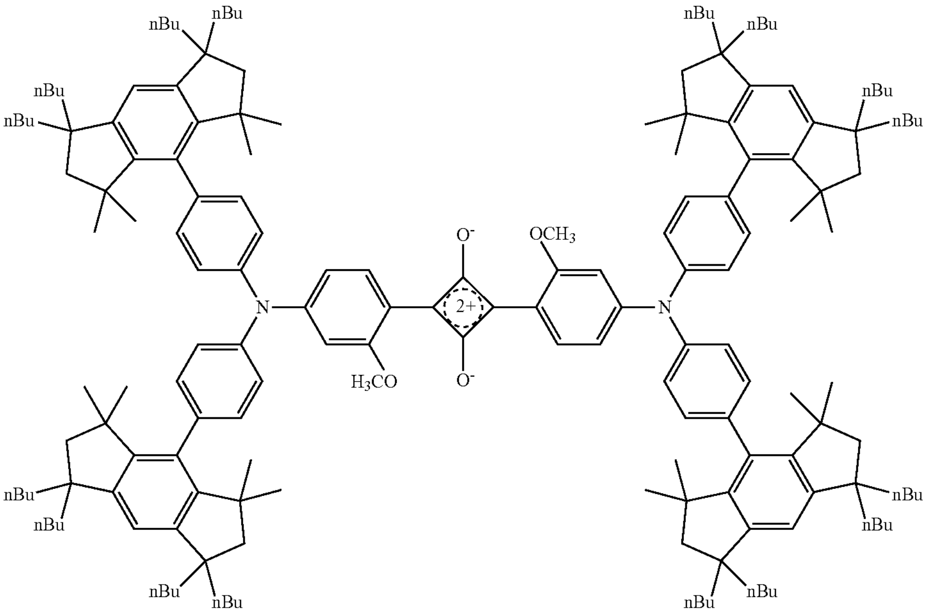

-continued
Da-32
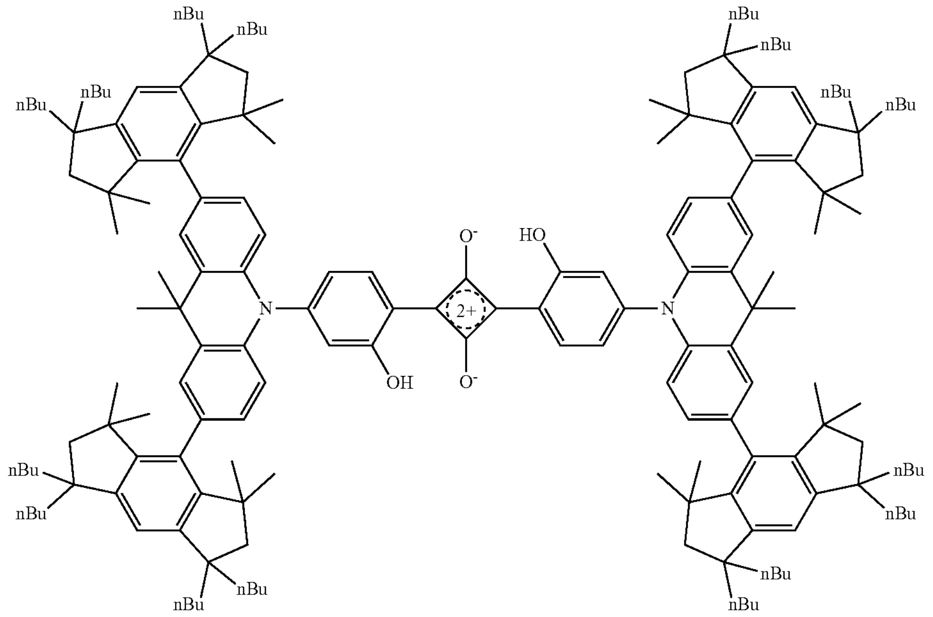
[Formula 31]
Da-33
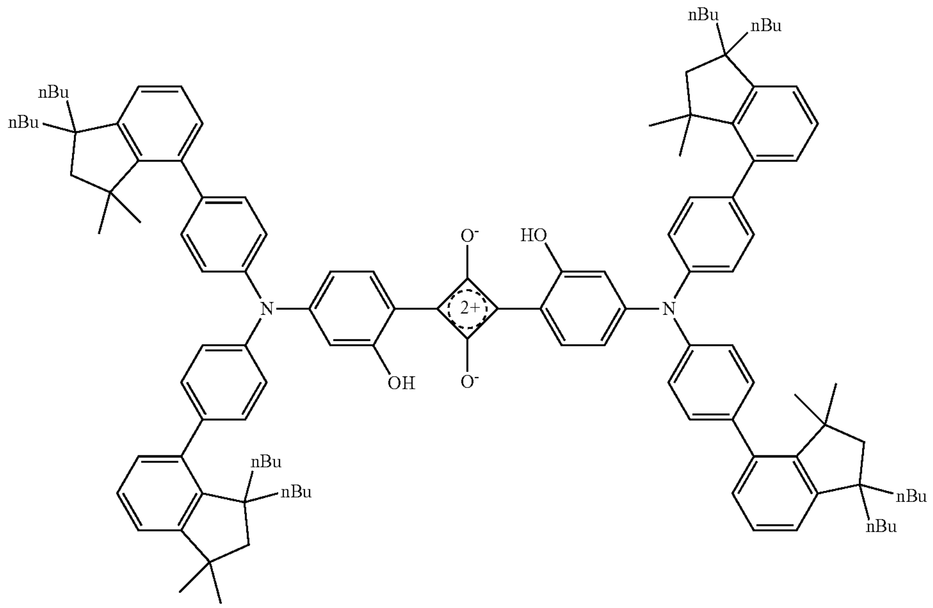

-continued
Da-34
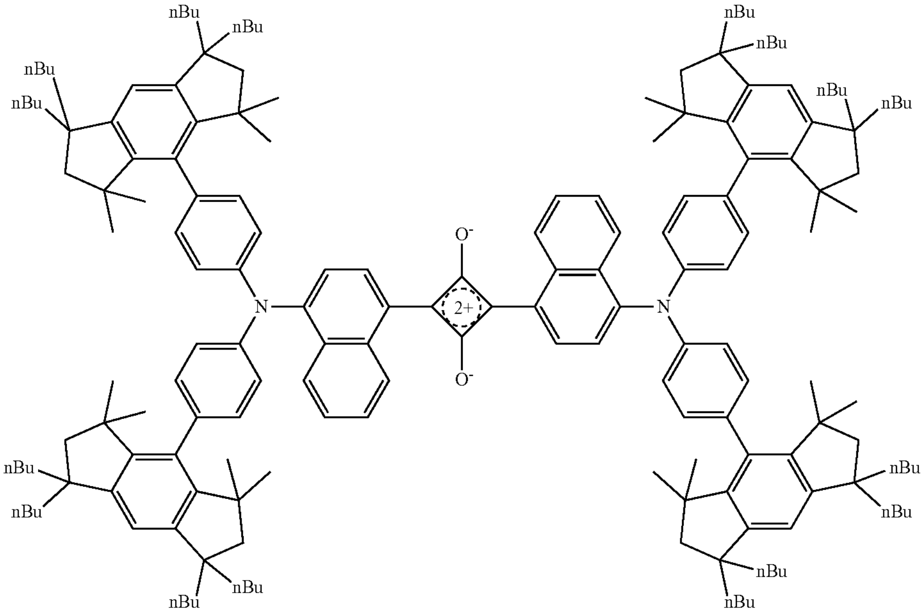
Da-35
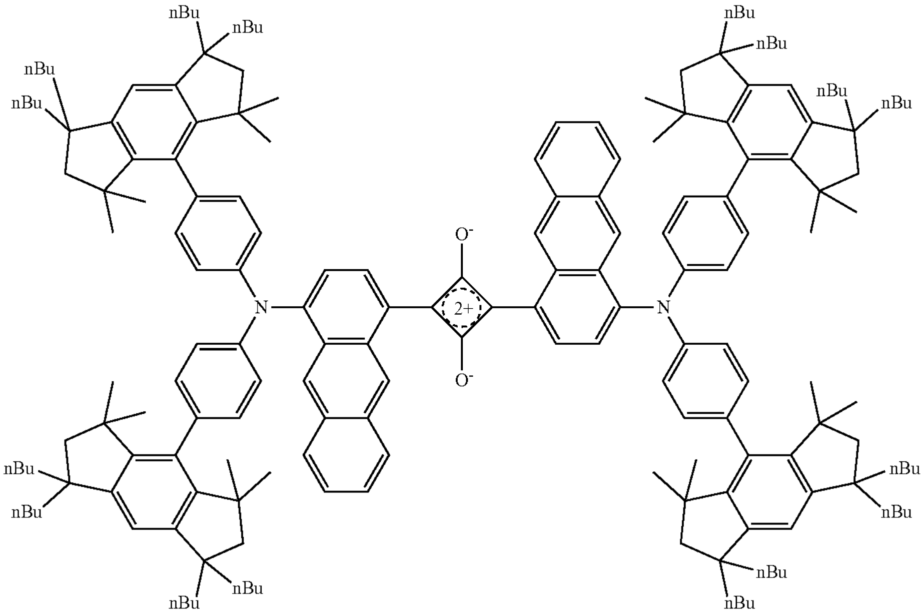

-continued
[Formula 32]
Da-36
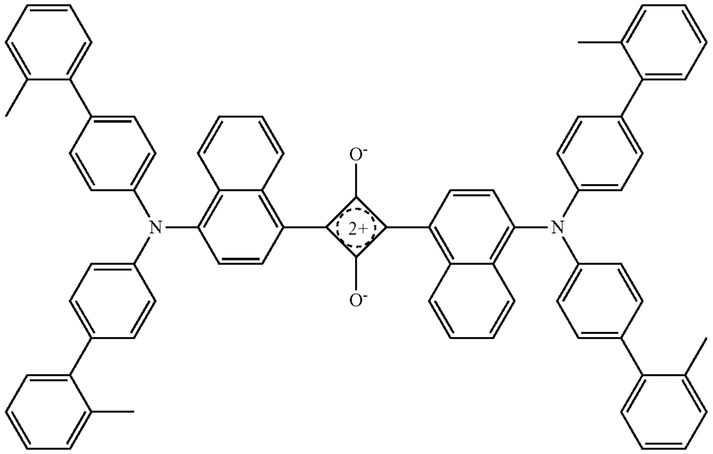
Da-37
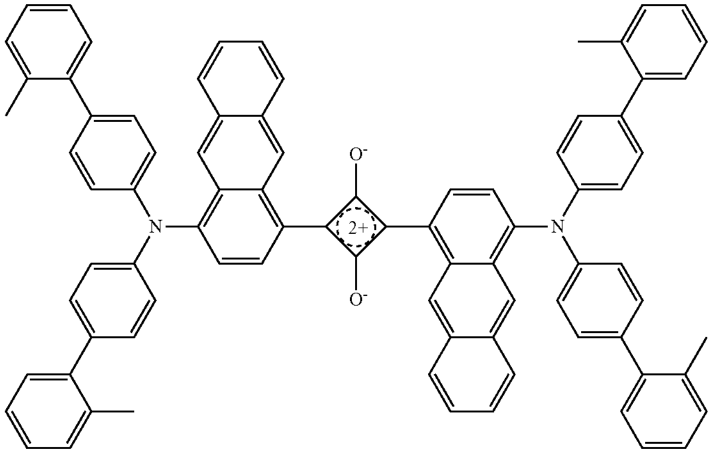
Da-38
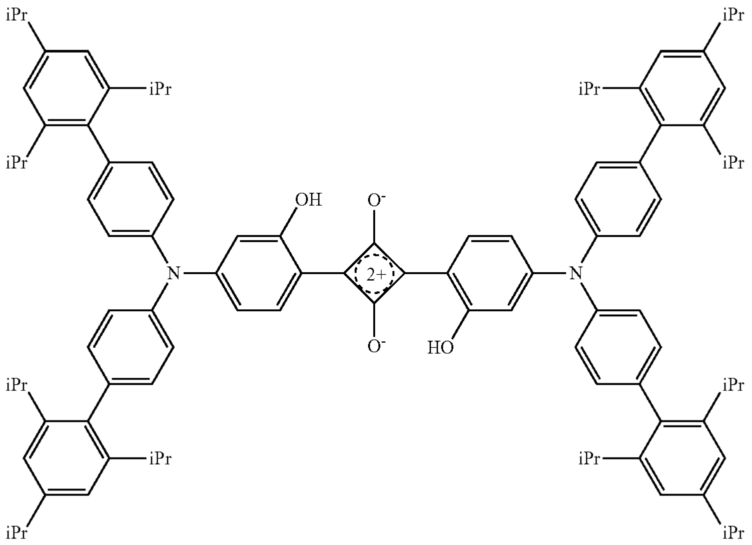

-continued
Da-39
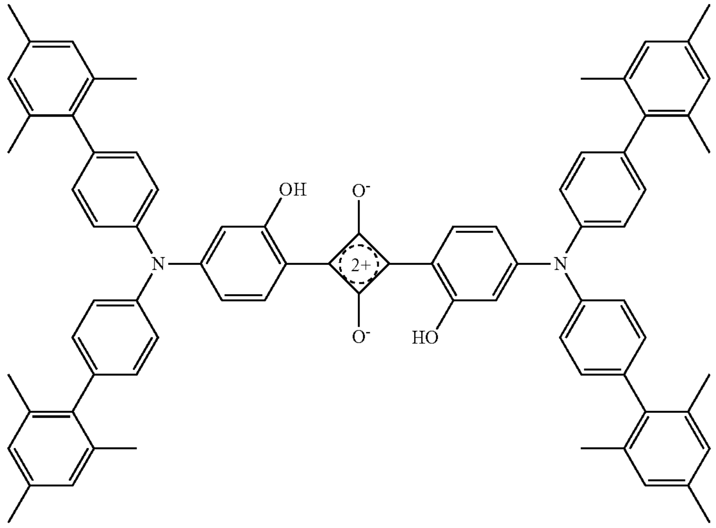
[Formula 33]
Da-40
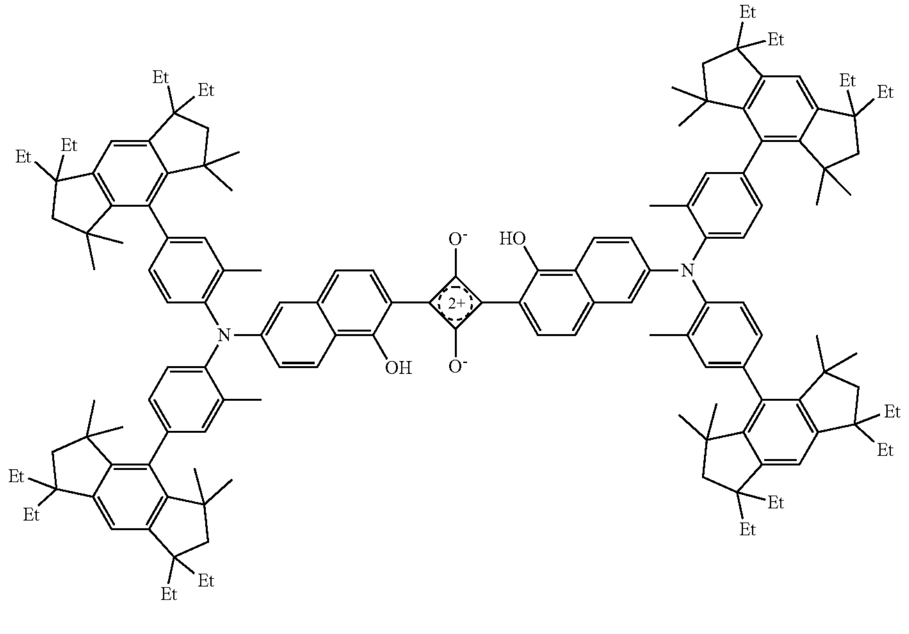

-continued
Da-41
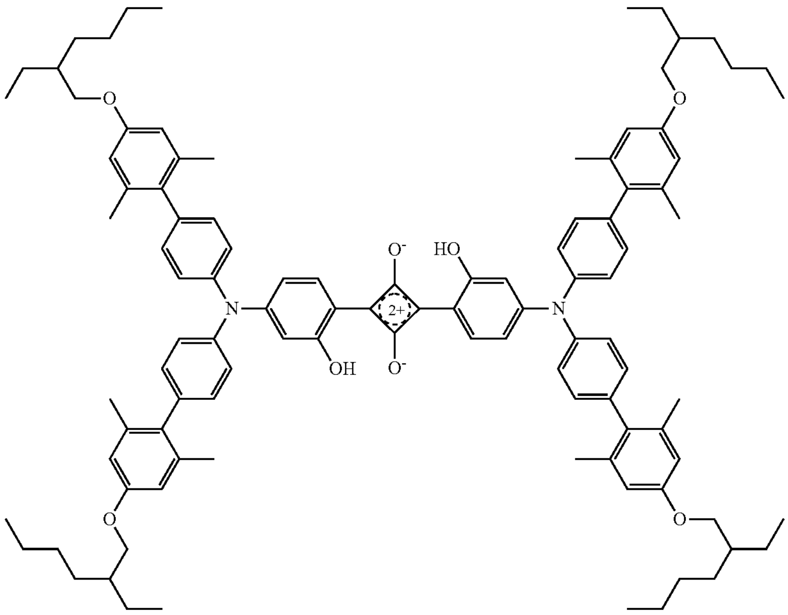
[Formula 34]
Da-42
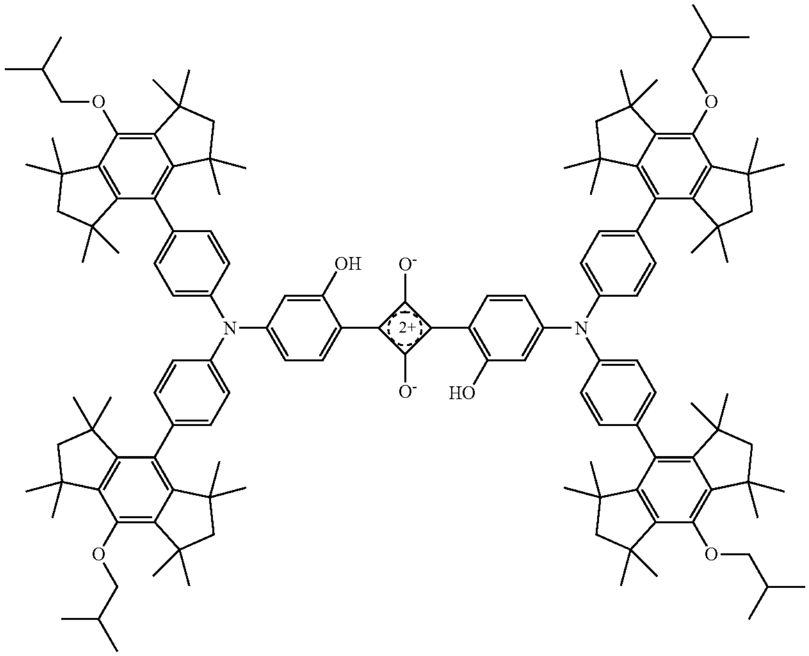

-continued
Da-43
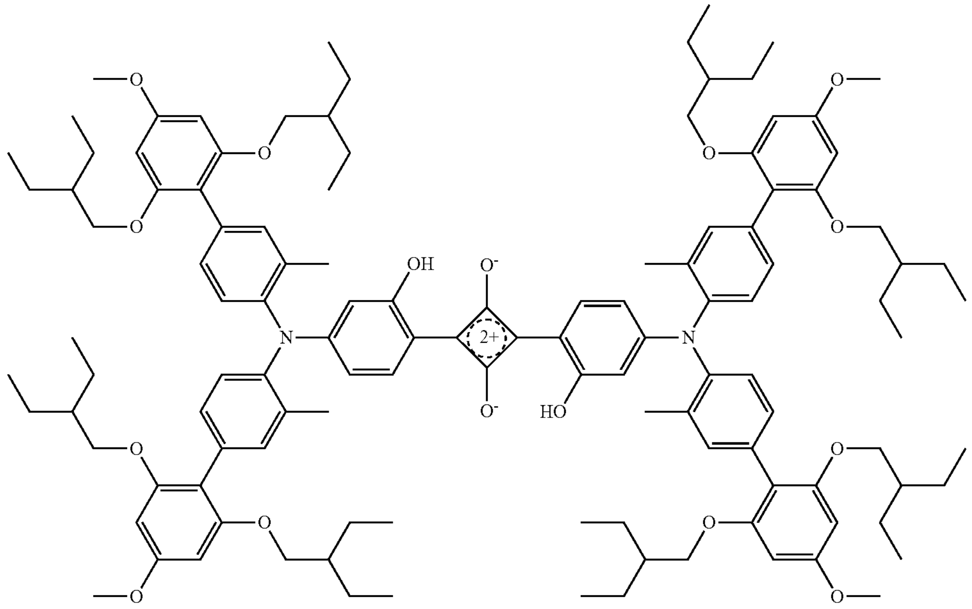
[Formula 35]
Da-44
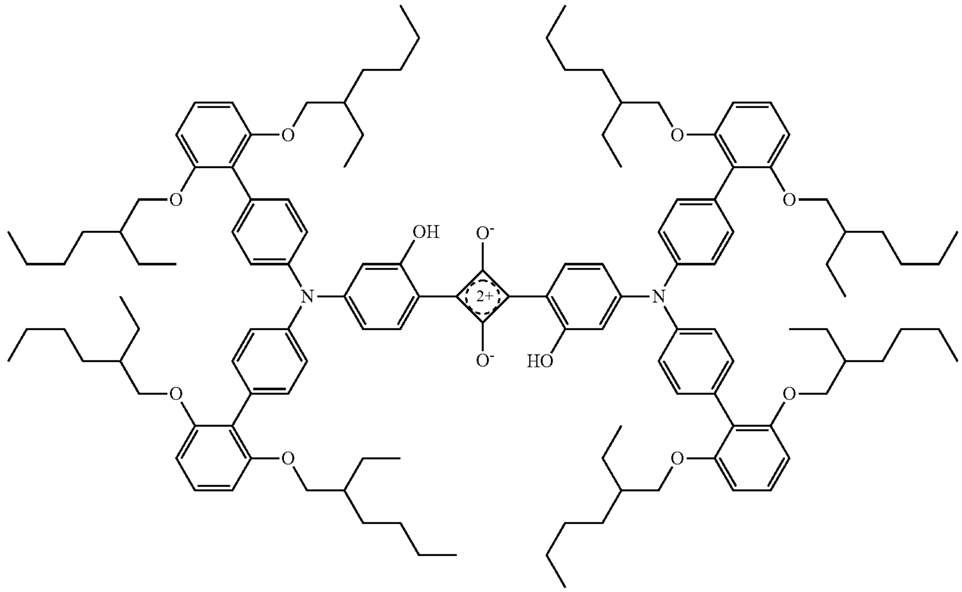

-continued
Da-45
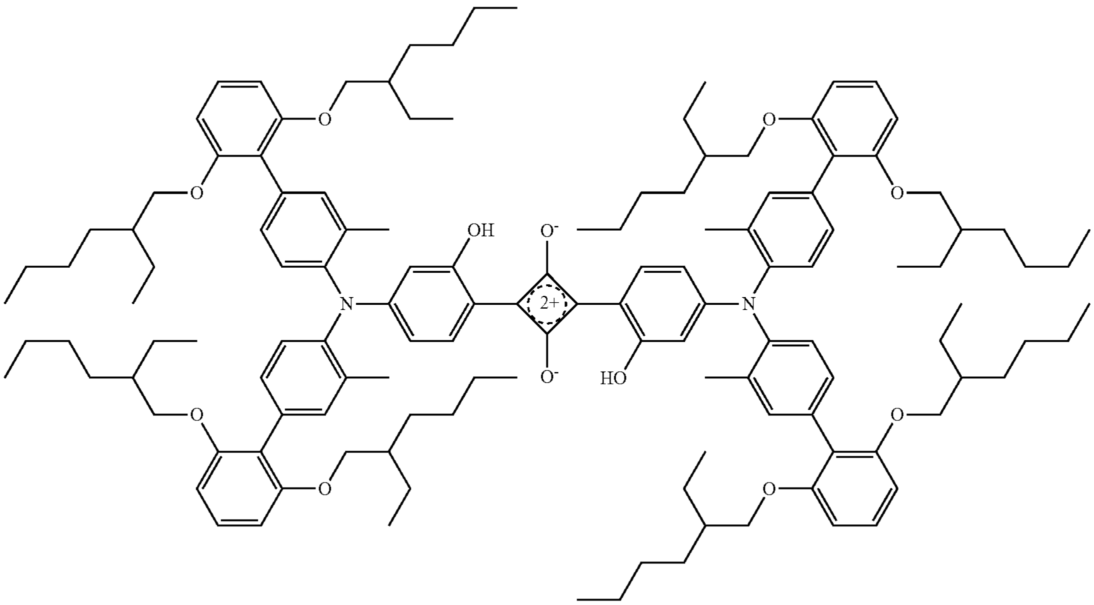
[Formula 36]
Da-46
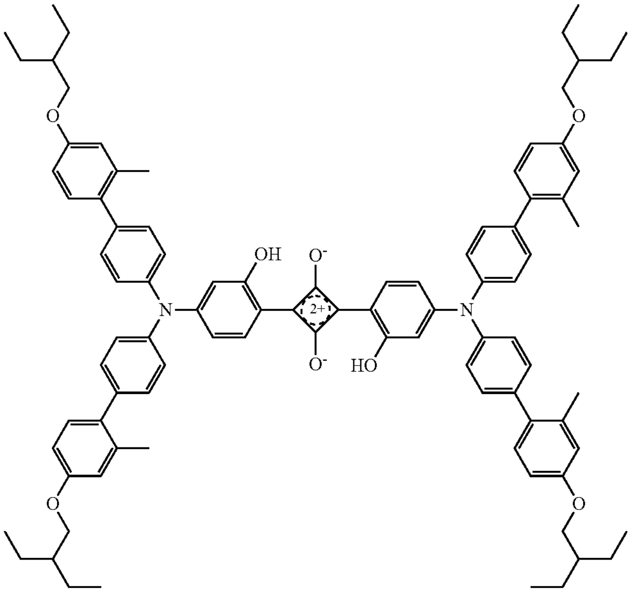

-continued
Da-47
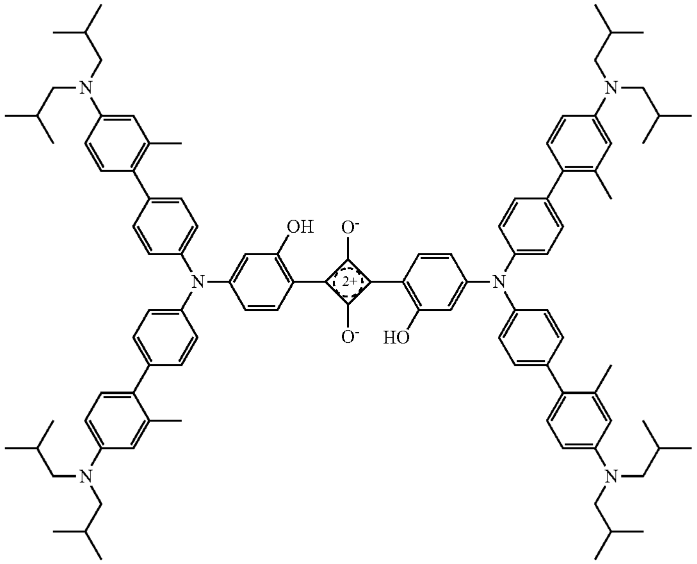
[Formula 37]
Da-48
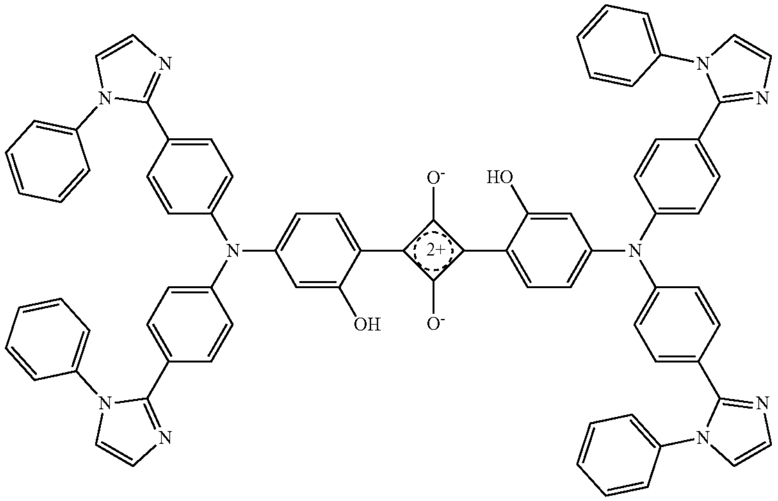
Da-49
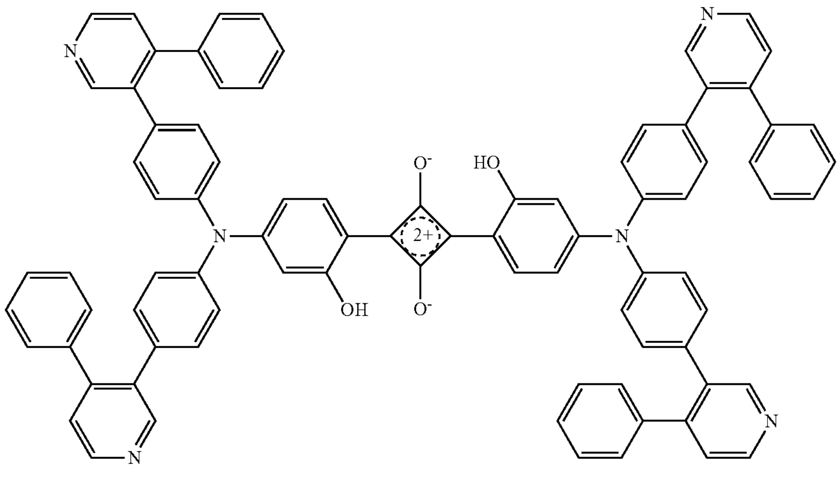

-continued
[Formula 38]
Da-50
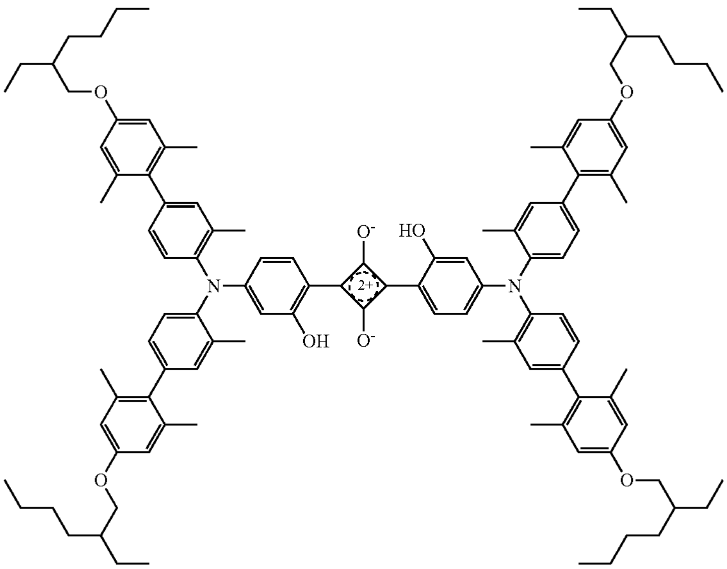
Da-51
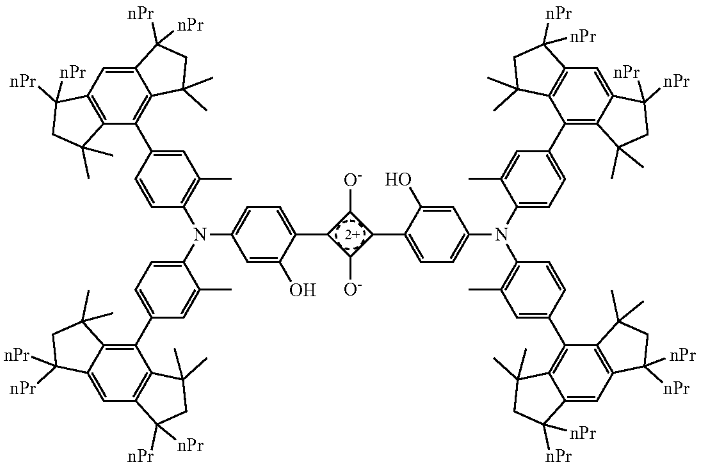
[Formula 39]
Da-52
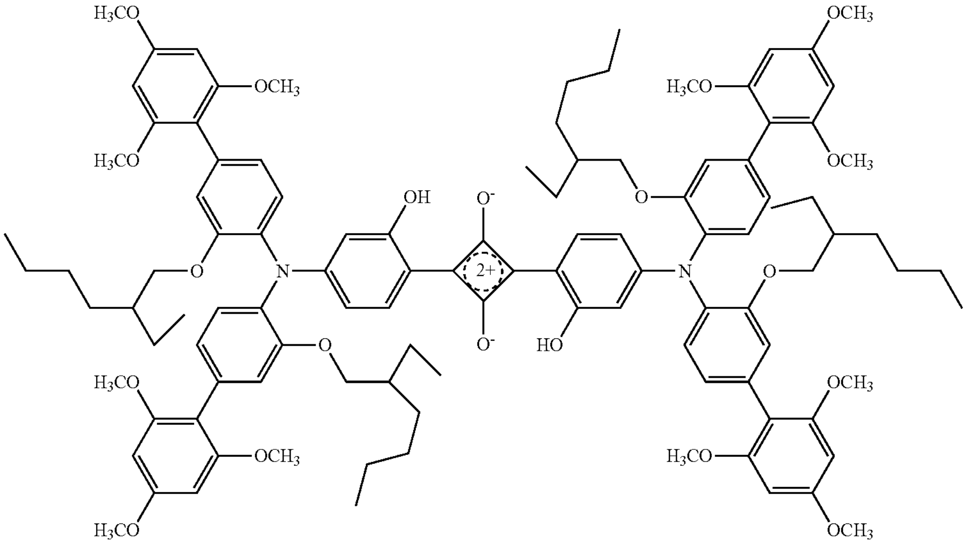

-continued
Da-53
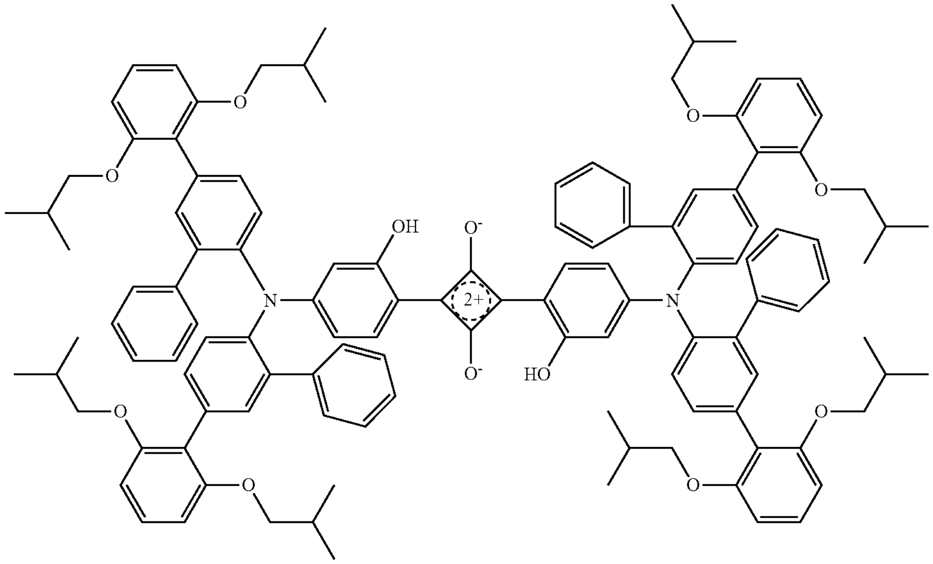
[Formula 40]
Da-54
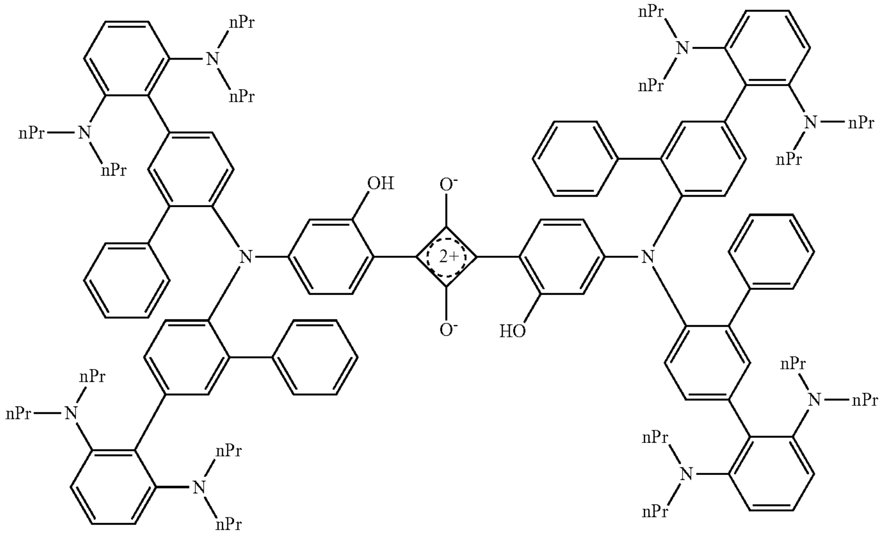

-continued
Da-55
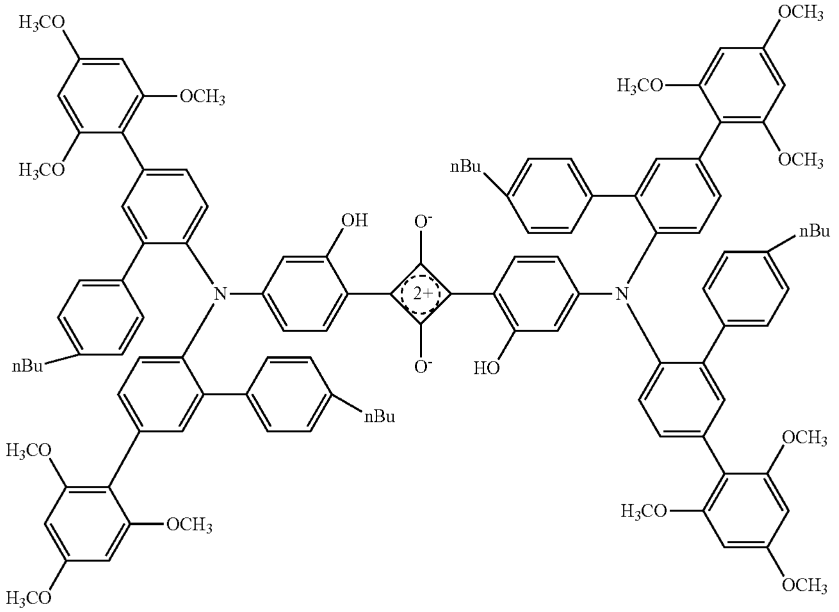
[Formula 41]
Db-1
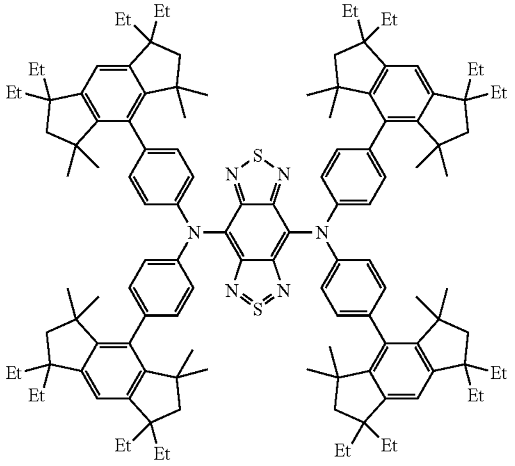
Db-2
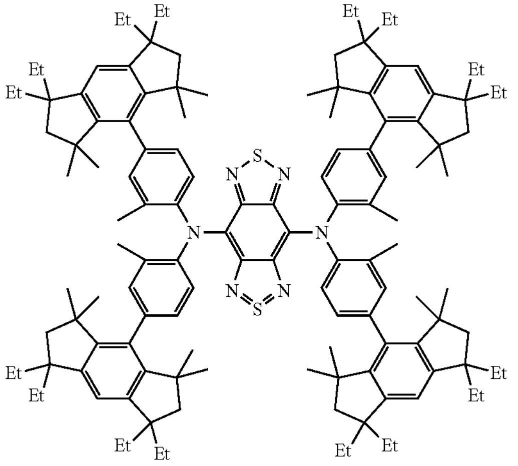

-continued
Db-3
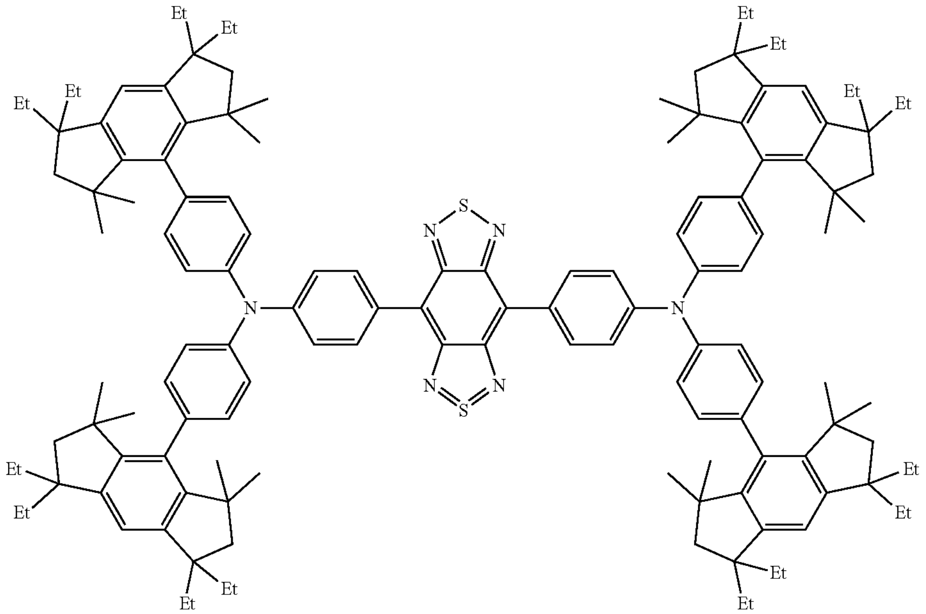
[Formula 42]
Db-4
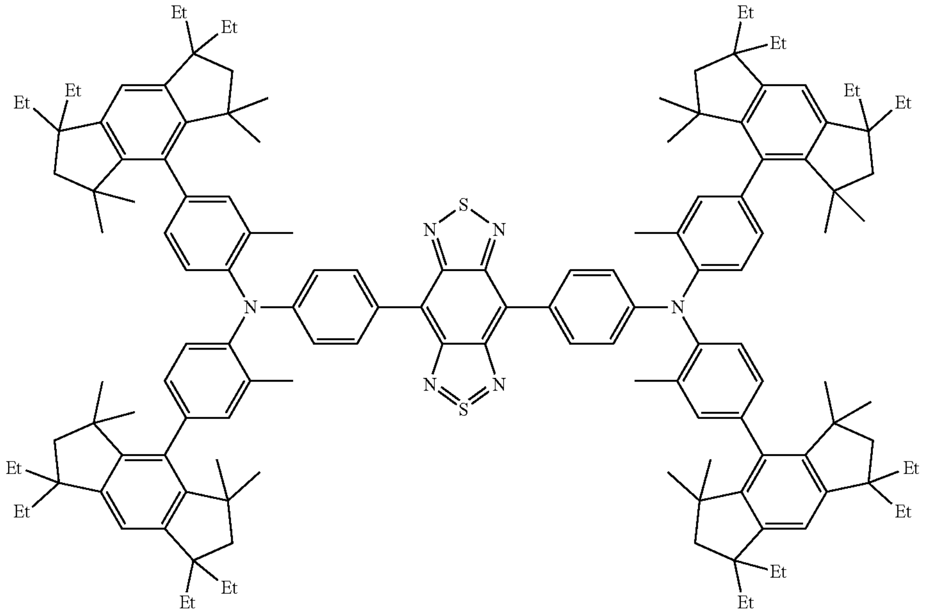

-continued
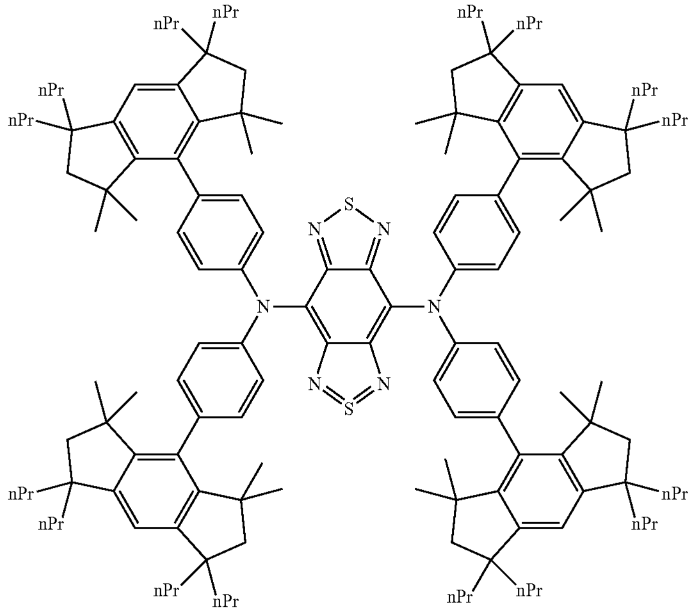
Db-5
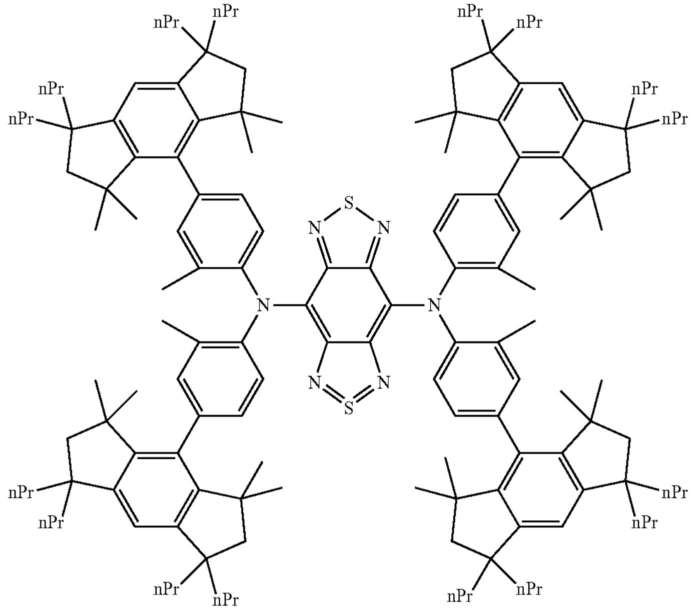
Db-6

-continued
[Formula 43]
Db-7
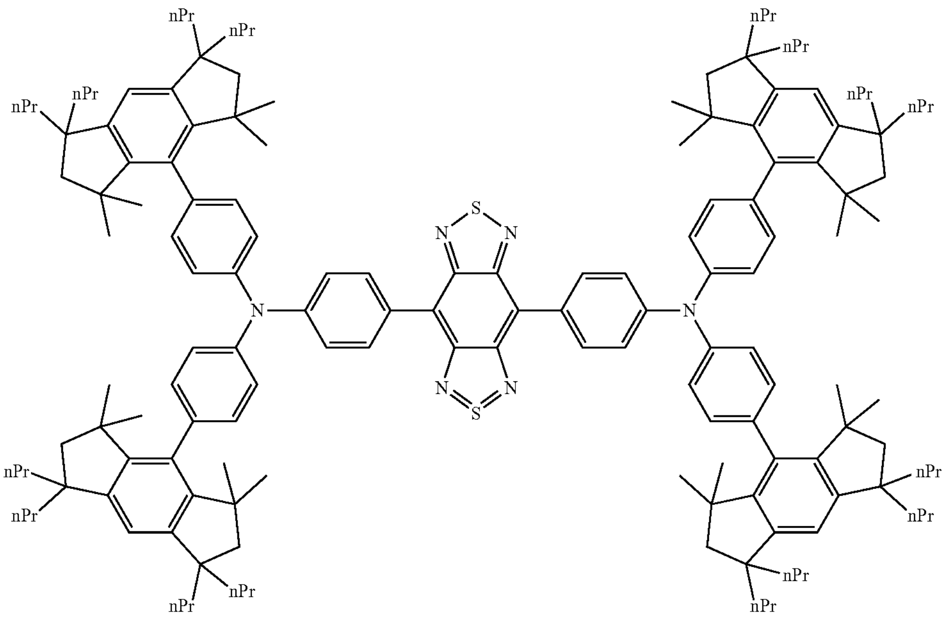
Db-8
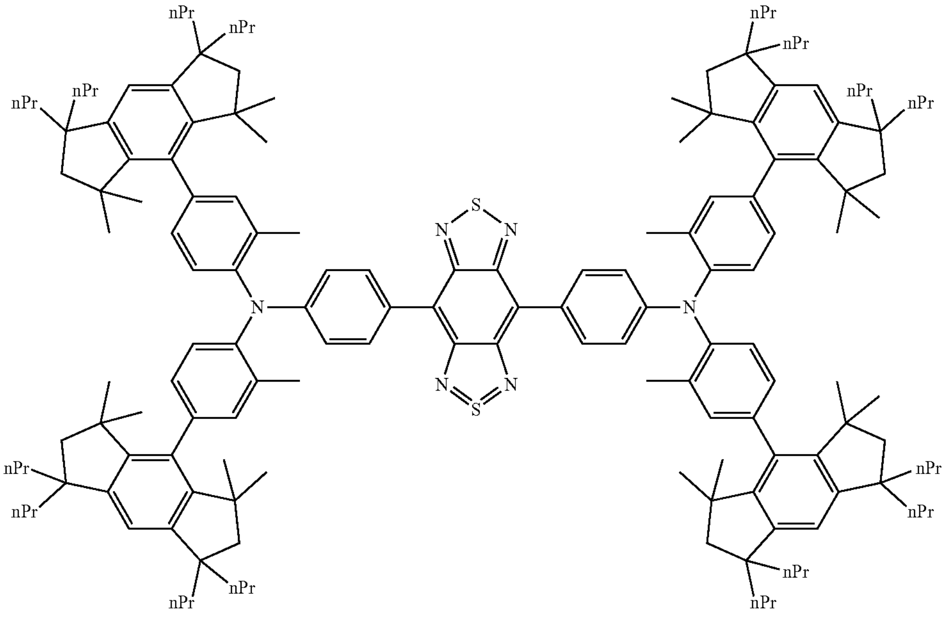

-continued
[Formula 44]
Db-9
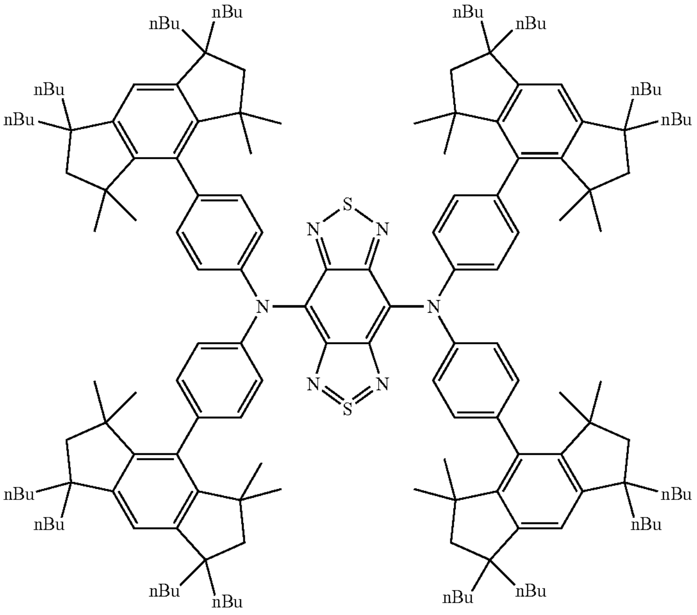
Da-10
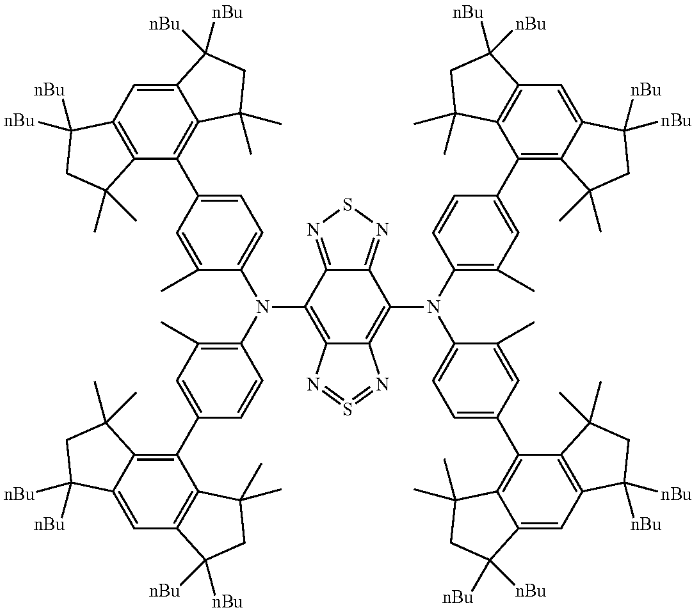

-continued
[Formula 45]
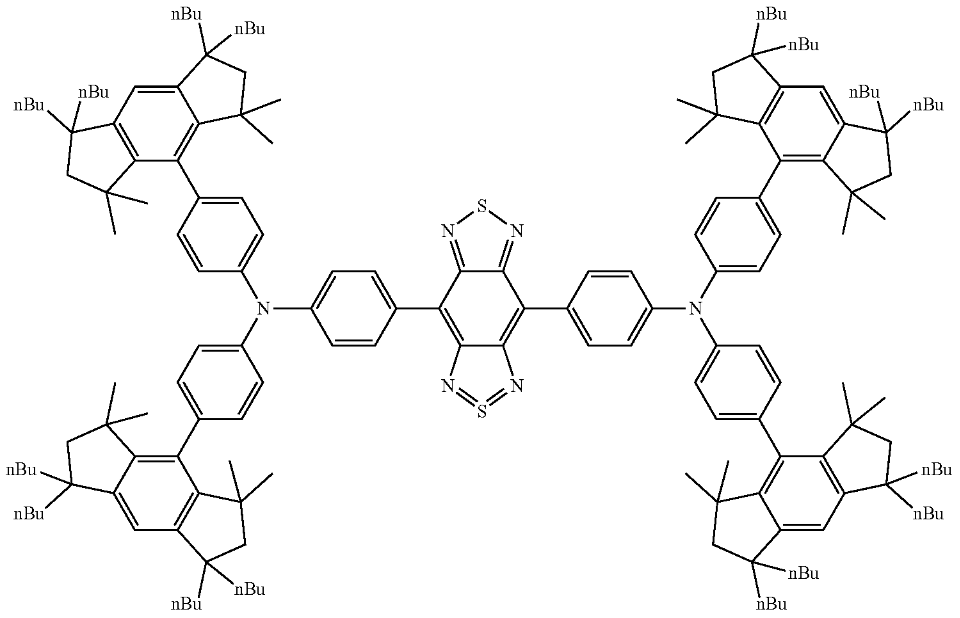
Da-11
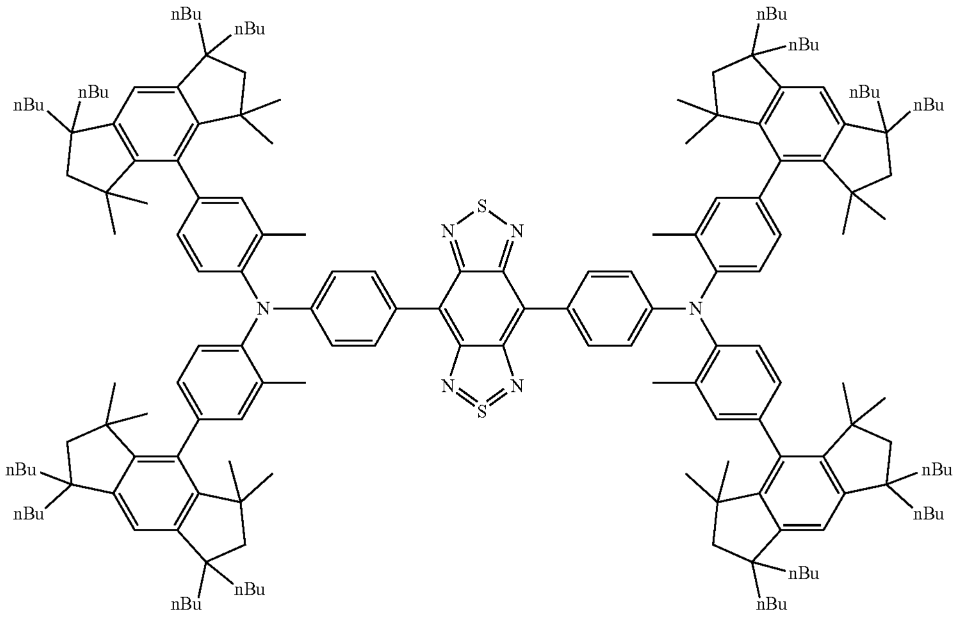
Da-12

-continued
[Formula 46]
Da-13
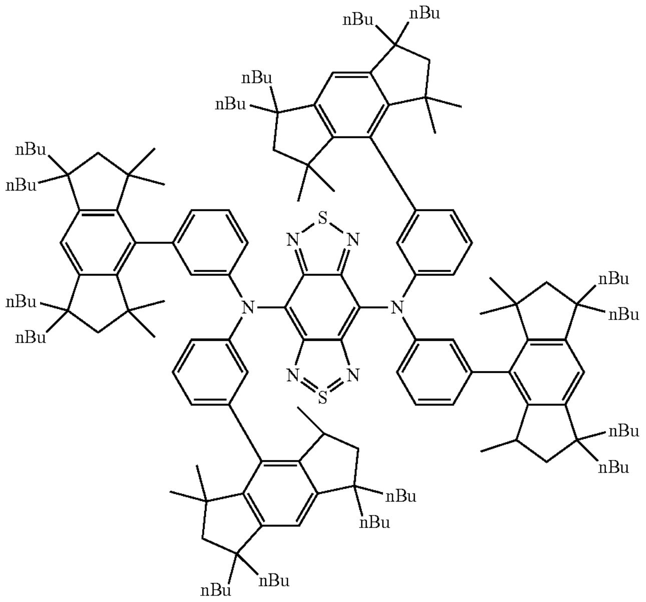
Db-14
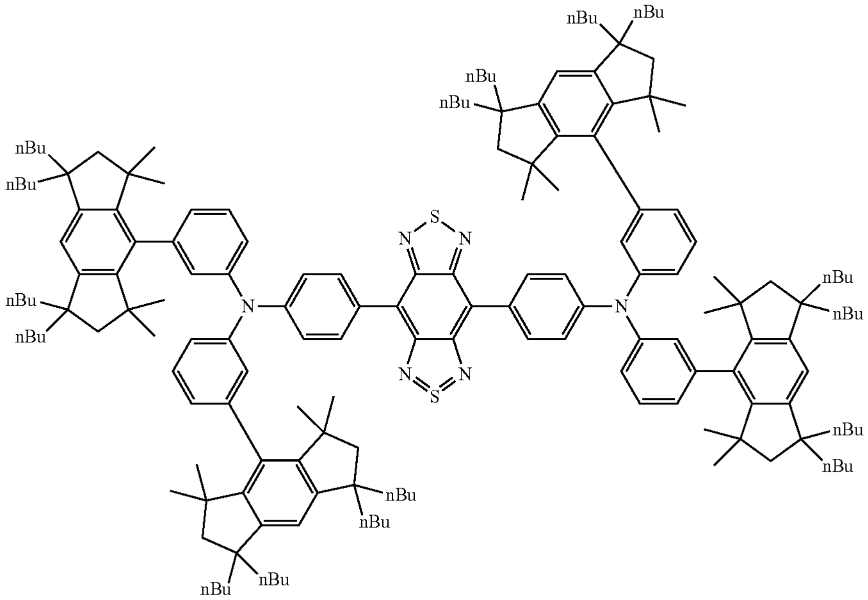

-continued
[Formula 47]
Dc-1
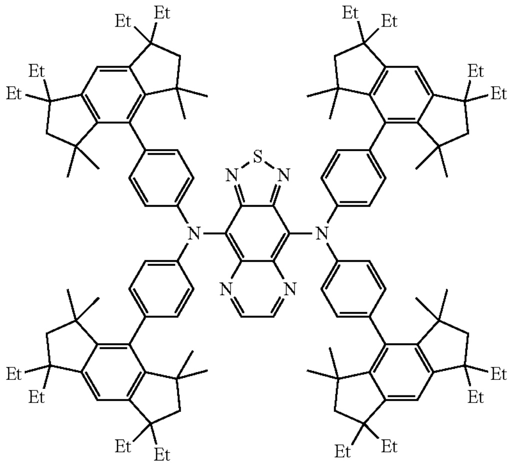
Dc-2
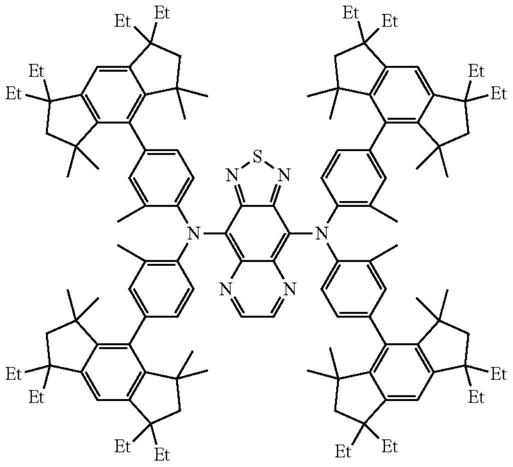
Dc-3
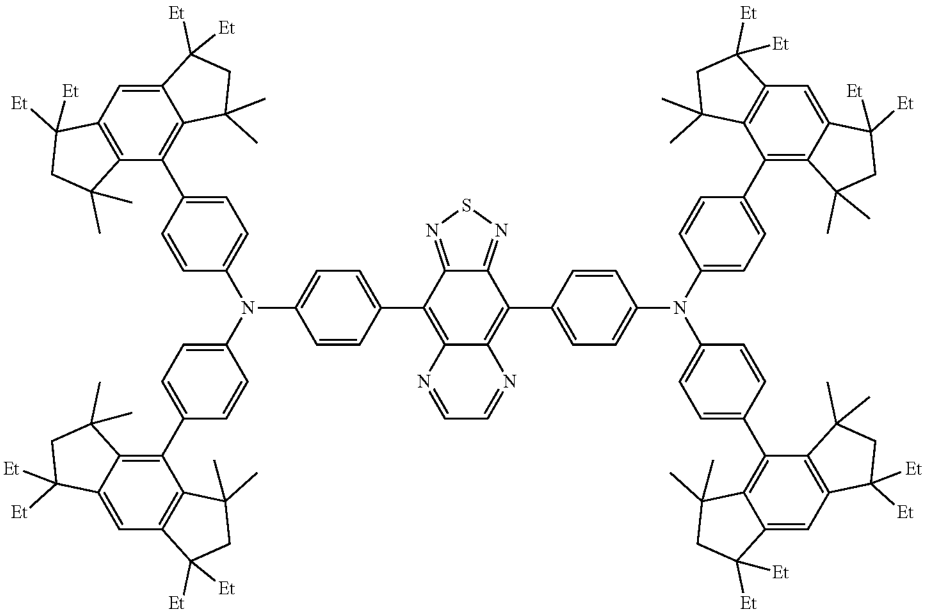

-continued
[Formula 48]
Dc-4
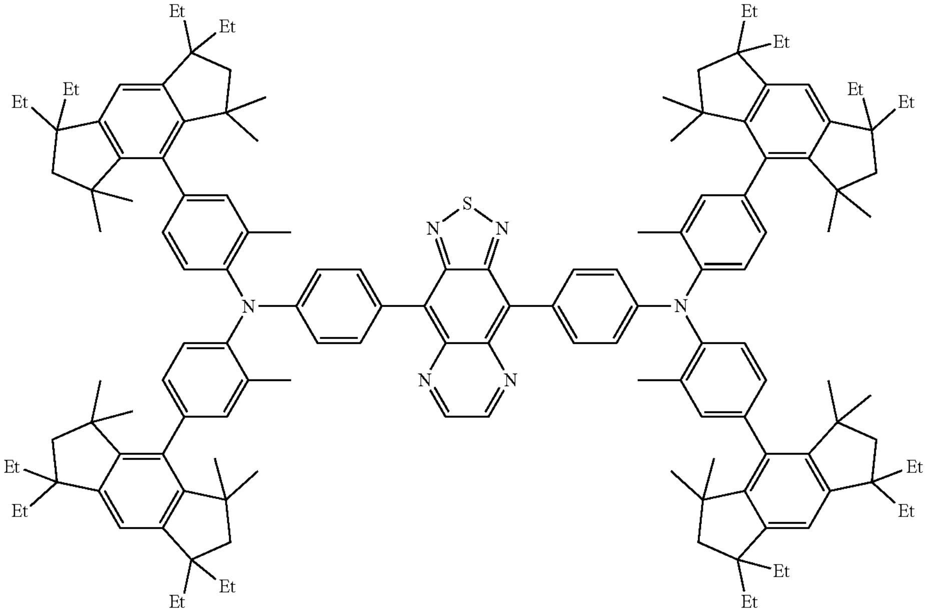
Dc-5
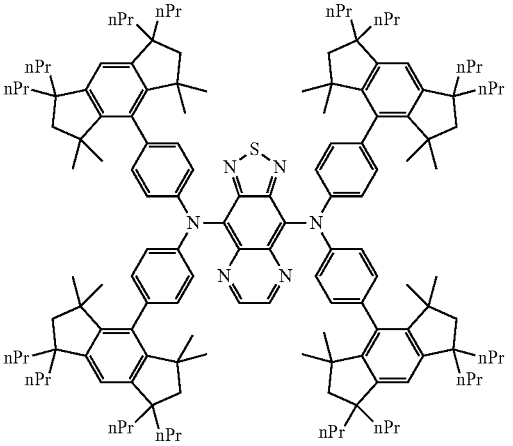
Dc-6
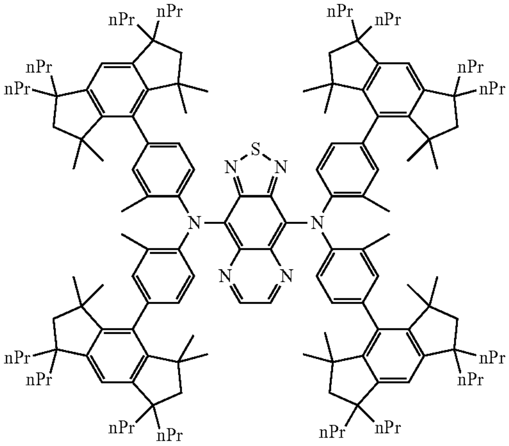

-continued
[Formula 49]
Dc-7
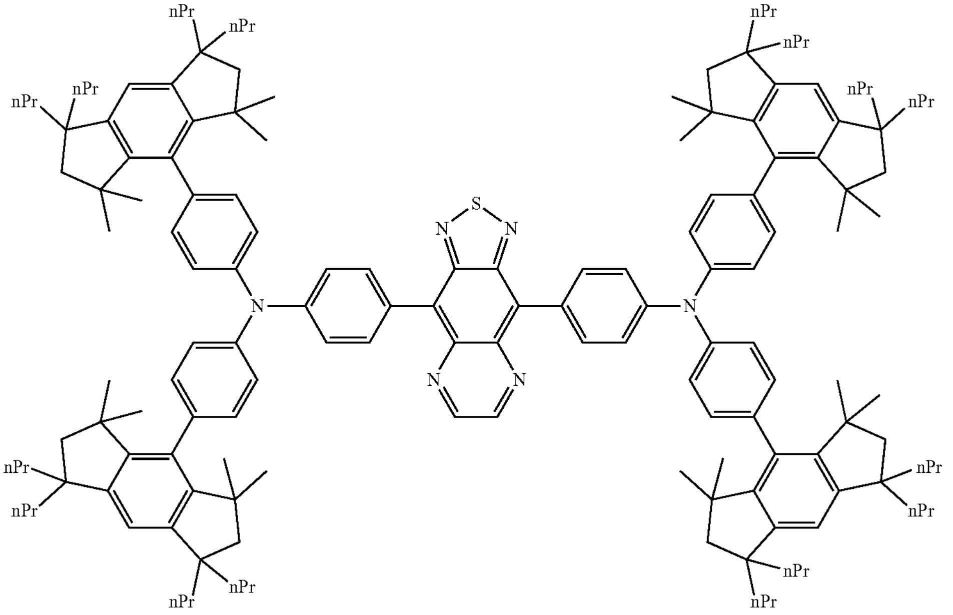
Dc-8
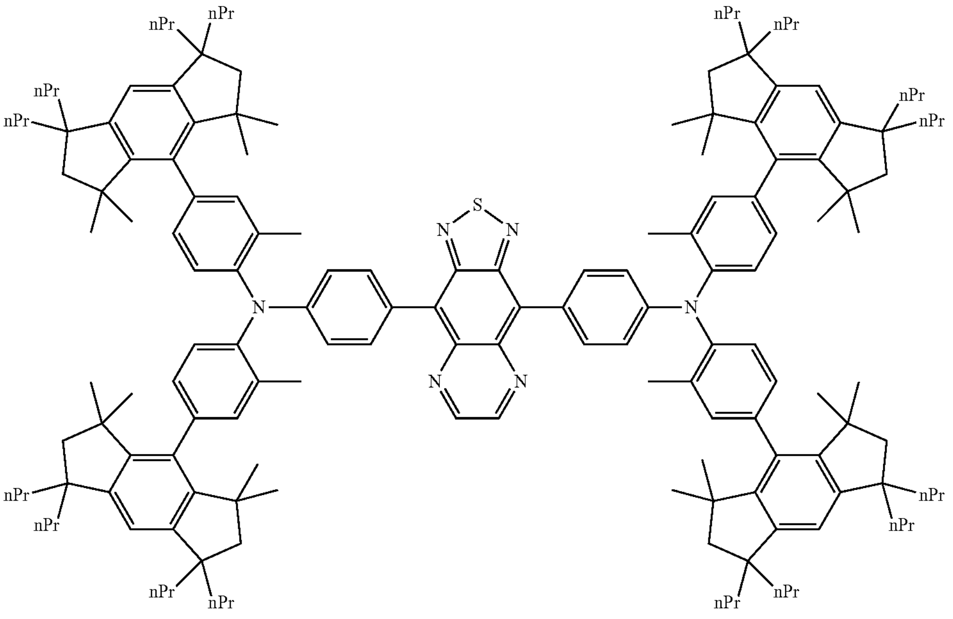

-continued
[Formula 50]
Dc-9
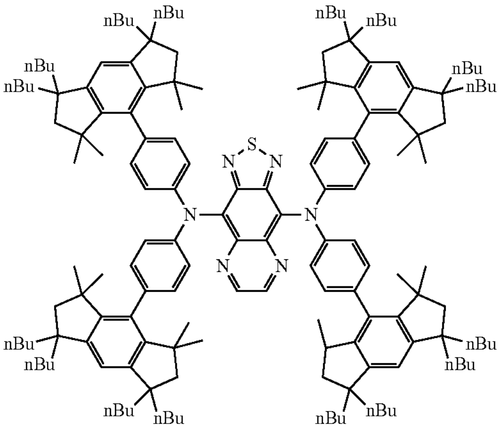
Dc-10
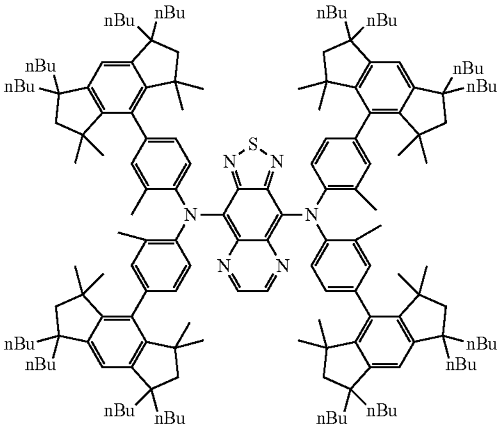
[Formula 51]
Dc-11
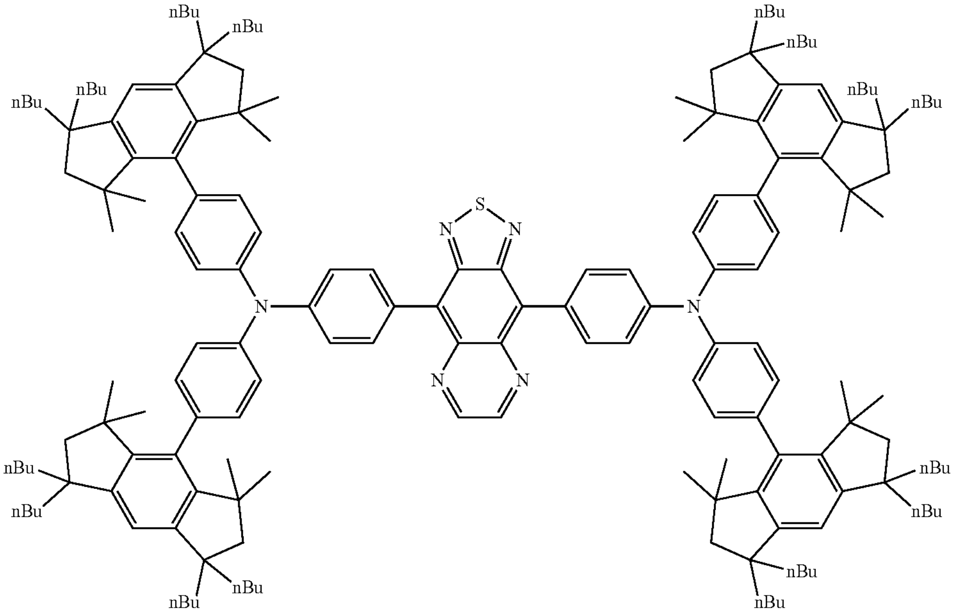

-continued
Dc-12
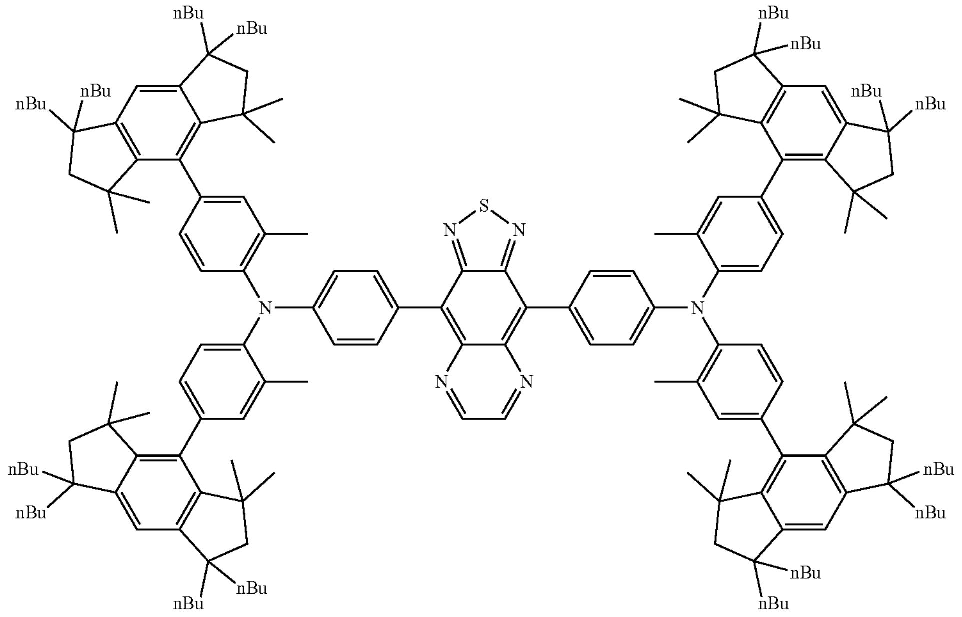
[Formula 52]
Dc-13
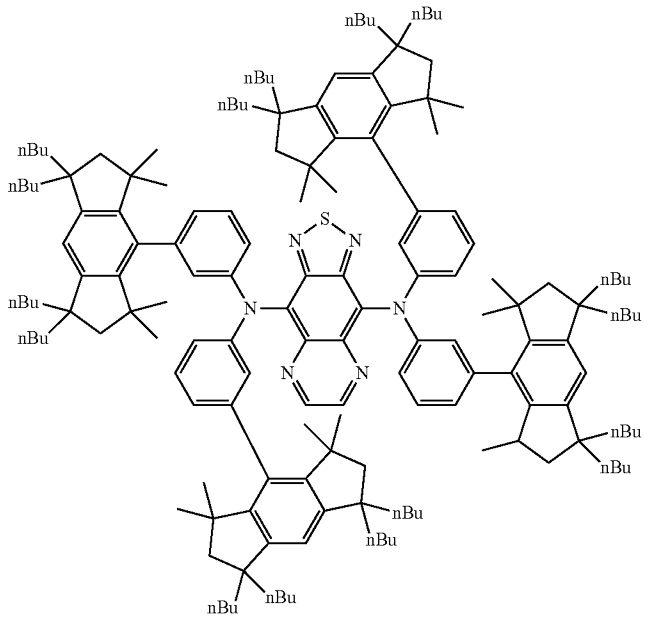

-continued
Dc-14
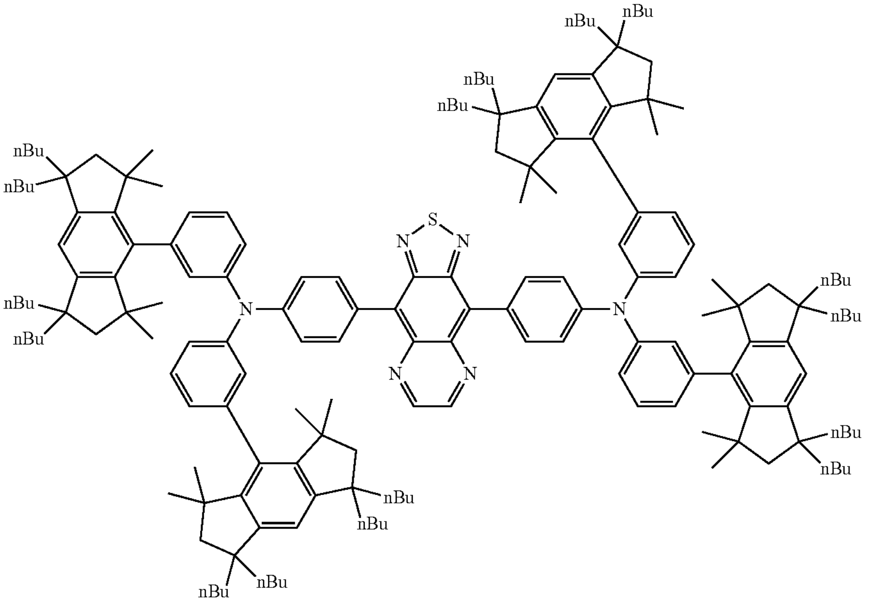
[Formula 53]
Dd-1
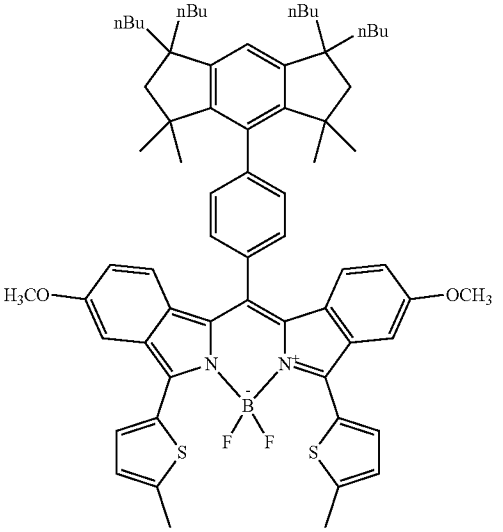
Dd-2
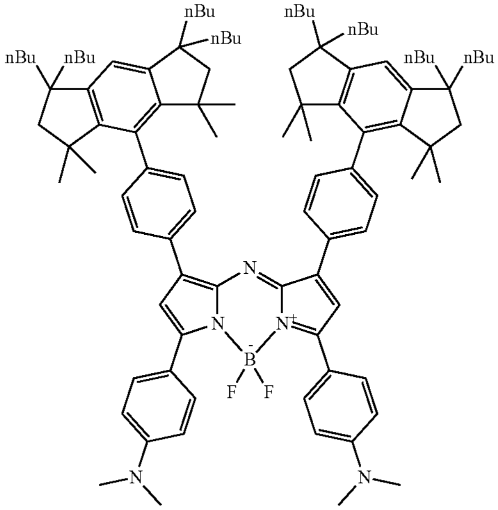
Dd-3
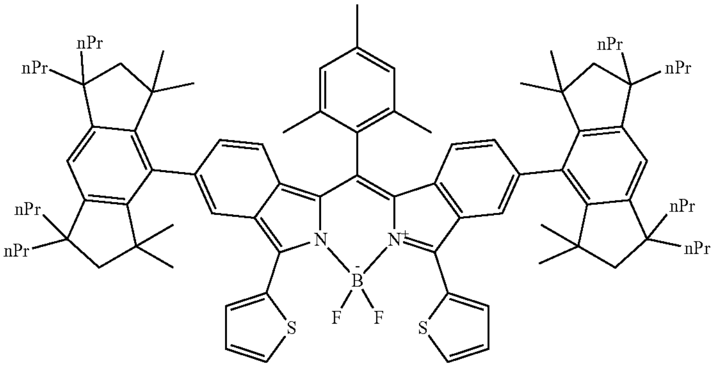

-continued
Dd-4
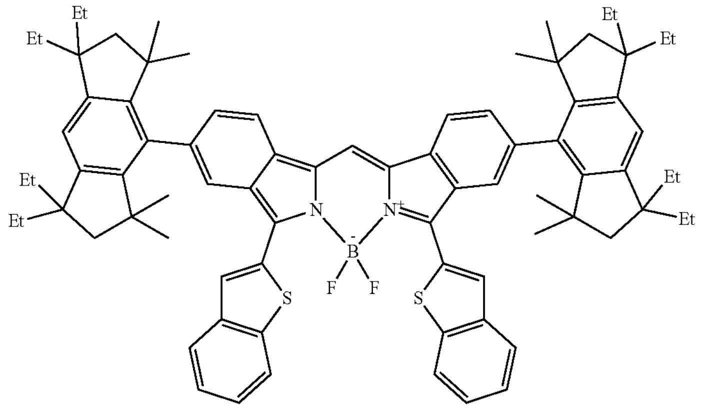
Dd-5
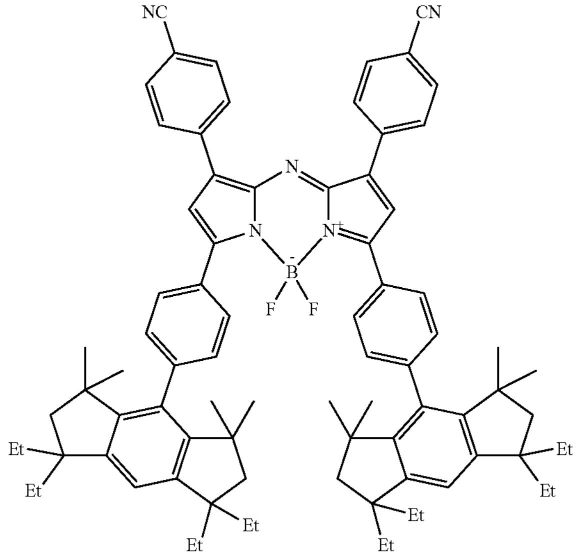
[Formula 54]
De-1
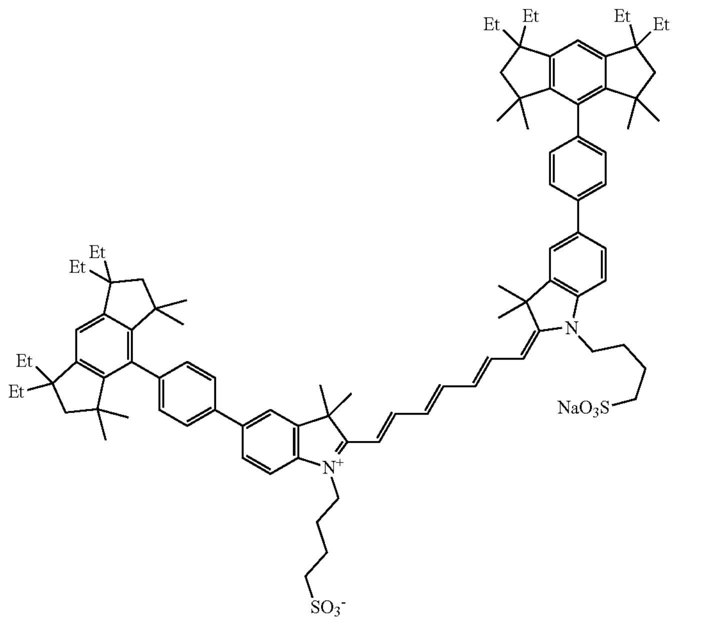

-continued
De-2
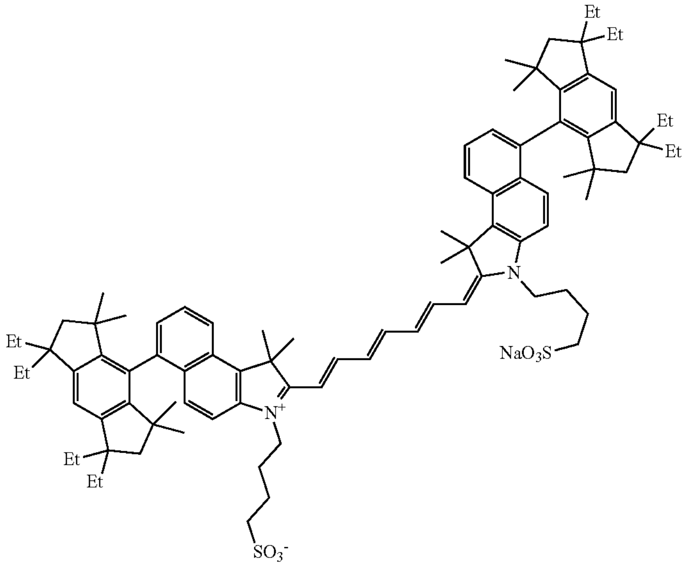
[Formula 55]
De-3
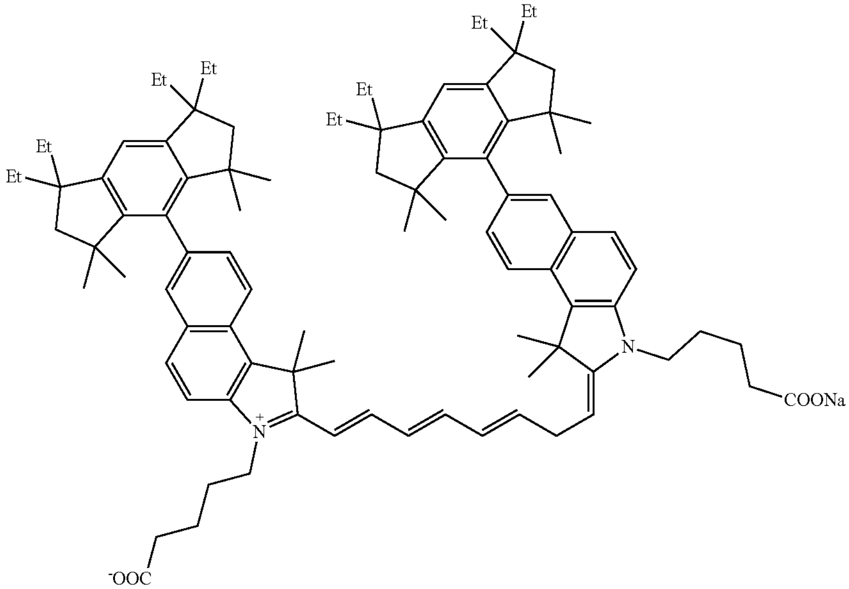

-continued
De-4
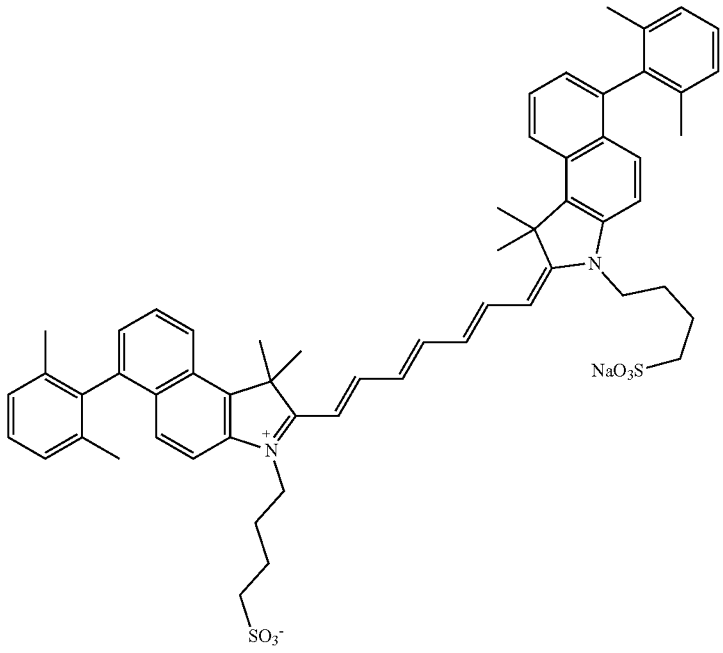
De-5
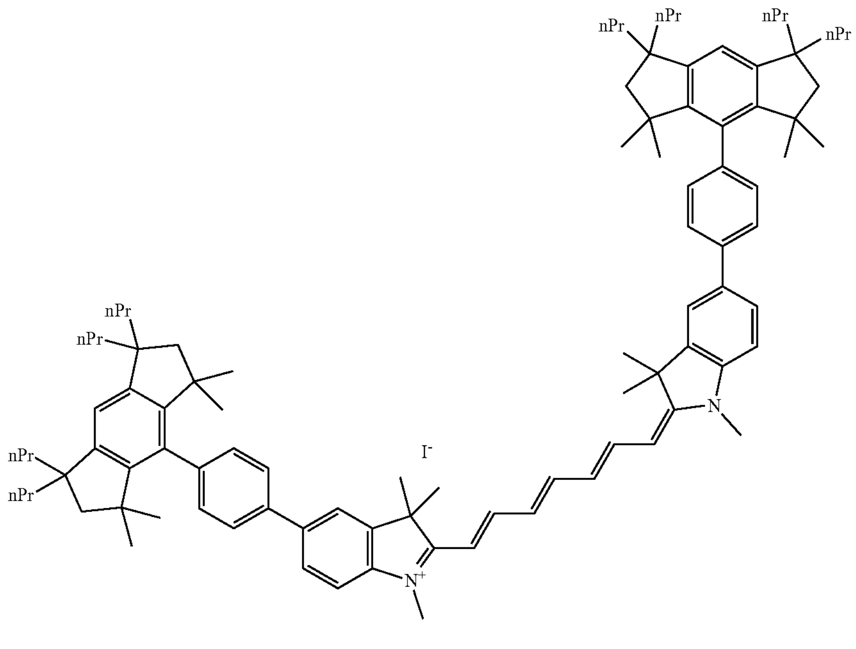

-continued

[Formula 56]

De-6

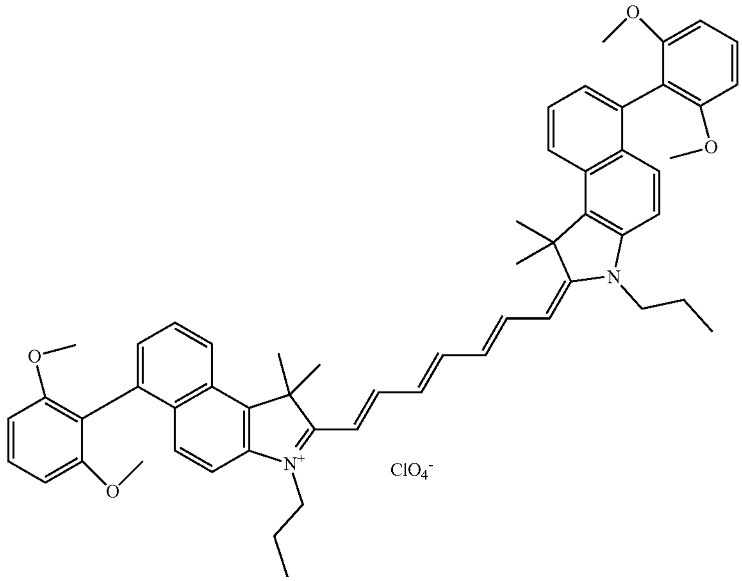

De-7

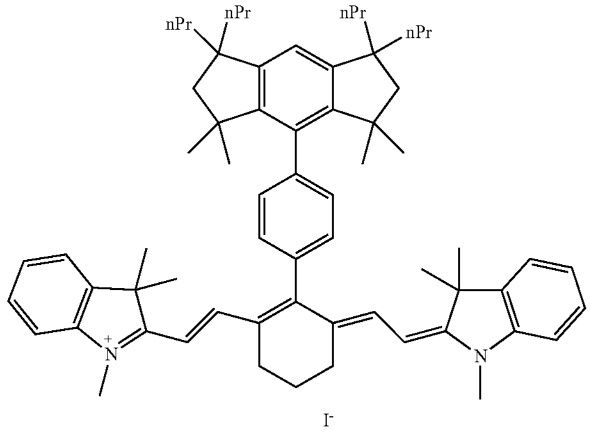

The above exemplary compounds can be used for any of the first and second dyes, and are preferably as follows.

TABLE 13

Table XIII

| Compound group | General formula |
|---|---|
| (1a) | First dye and second dye |
| (1b) | Second dye |
| (1c) | First dye and second dye |
| (1d) | Second dye |
| Classification (4) | First dye and second dye |
| Classification (5) | First dye and second dye |
| Classification (6) | Second dye |
| Classification (7) | Second dye |
| Classification (8) | Second dye |
| Classification (9) | Second dye |
| Classification (10) | Second dye |
| Classification (11) | Second dye |

(Exemplary Compounds Preferably Used as Both First Dye and Second Dye)

Compounds Da-1 to 16, Da-20 to 25, Da-28 to 33, Da-38, Da-39 and Da-41 to 55, and compounds De-1 to 7

(Exemplary Compounds Preferably Used as Second Dye)

Compounds Da-17 to 19, Da-26, Da-27. Da-34 to 37 and Da-40, compounds Db-1 to 14, compounds Dc-1 to 14, and compounds Dd-1 to 5

[Light-Emitting Member]

The light-emitting member of the present invention includes a surface light source that emits red light, and the wavelength conversion film. That is, the light-emitting member includes a surface light source that emits red light, and the wavelength conversion film including the first dye having a maximum absorption wavelength in the red light region and the second dye absorbing light emitted from the first dye to emit light in the near-infrared region.

<Basic Configuration of Light-Emitting Member>

Figure 2:
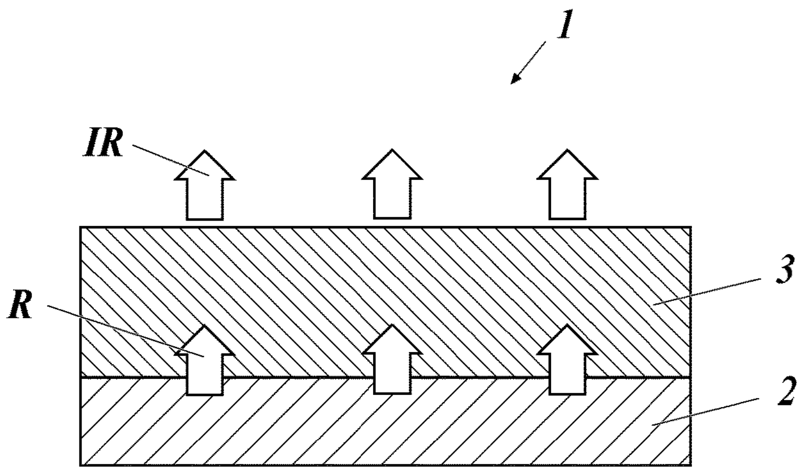
FIG. 2 A schematic cross-sectional view illustrating a configuration example of the light-emitting member of the present invention.

FIG. 2 illustrates a basic configuration of the light-emitting member of the present invention.

A light-emitting member (1) illustrated in FIG. 2 has a configuration in which a wavelength conversion film (3) that converts visible light of a surface light source (2) for red light emission (R), for example, an organic EL element for red light emission (R), to near-infrared light (IR) is disposed on the surface light source (2).

The wavelength conversion film (3) corresponds to the wavelength conversion film of the present invention, and thus the detailed description thereof is here omitted. Only the detail of the surface light source is described below.

<Surface Light Source>

The surface light source in the present invention is a light source having the property of at least emitting red light, and is preferably a surface light source having a luminance uniformity of 70% or more upon uniform light emission, and a specific surface light source is preferably an organic electroluminescence element.

The surface light source mentioned in the present invention is a light source that radiates uniform light from the entire surface expanded, and a contrastive light source is a point light source typified by a light emitting diode (LED) or the like. A surface light source does not vary in emission luminance generally and does not make any shadow as compared with the point light source, and thus it can be suitably used not only in an application of an illumination in an in-cabin space or a backlight of a display or the like, but also in an illumination of an imaging device for biometric authentication. The surface light source is preferably, for example, an organic electroluminescence element or a μLED (microLED) in the case of use in an imaging device for biometric authentication.

The substrate for use in the surface light source in the present invention is more preferably a resin film having flexibility, in view of utilizing flexibility of OLED, and examples thereof include polyesters such as polyethylene terephthalate (abbreviation: PET) and polyethylene naphthalate (abbreviation: PEN), polyethylene, polypropylene, cellophane, cellulose esters such as cellulose diacetate, cellulose triacetate (abbreviation: TAC), cellulose acetate butyrate, cellulose acetate propionate (abbreviation: CAP), cellulose acetate phthalate, cellulose nitrate, or derivatives thereof, polyvinylidene chloride, polyvinyl alcohol, polyethylene vinyl alcohol, syndiotactic polystyrene, polycarbonate, a norbornene resin, polymethylpentene, polyether ketone, poly imide, polyether sulfone (abbreviation: PES), polyphenylene sulfide, polysulfones, polyetherimide, polyether ketone imide, polyamide, a fluororesin, nylon, polymethyl methacrylate, acrylates or polyarylates, and a cycloolefin-based resin typified by Arton (trade name, manufactured by JSR Corporation) or Apel (trade name, manufactured by Mitsui Chemicals, Inc.).

(Organic EL Element)

In a preferable embodiment of the present invention, an organic EL element is applied as the surface light source.

Examples of the organic EL element suitable as the surface light source in the present invention include one having a configuration including an anode and a cathode on a substrate in which configuration a group of organic functional layers including a light emission layer is sandwiched between the anode and the cathode oppositely located. Functional layers such as a sealing member, a gas barrier layer, and a light extraction layer may be further combined appropriately in the configuration depending on the intended use.

Representative configuration examples of the organic EL element in the present invention are listed below, but configuration examples of the organic EL element that can be applied to the present invention are not limited to these configuration examples.

(1) Anode/light emission layer/cathode
(2) Anode/light emission layer/electron transport layer/cathode
(3) Anode/hole transport layer/light emission layer/cathode
(4) Anode/hole transport layer/light emission layer/electron transport layer/cathode
(5) Anode/hole transport layer/light emission layer/electron transport layer/electron injection layer/cathode
(6) Anode/hole injection layer/hole transport layer/light emission layer/electron transport layer/cathode
(7) Anode/hole injection layer/hole transport layer/(electron blocking layer/)light emission layer/(hole blocking layer/)electron transport layer/electron injection layer/cathode The detail and the production method of each of specific constituent layers constituting the organic EL element that can be applied to the present invention are not particularly limited, and any known constituent material and production method can be applied. The contents described in, for example, JP 2013-089608A. JP 2014-120334A, JP 2015-201508A, and WO 2018/51617 can be seen.

(Luminance Uniformity)

When the surface light source uniformly emits light, the surface light source in the present invention preferably exhibits a luminance uniformity of 70% or more, as defined according to the following expression (1).

For example, if a LED is applied as the point light source, it exhibits a luminance uniformity of approximately 50% or less, and, if a LED is applied as a light source for biometric authentication without any treatment, it often causes decrease in the rate of authentication because a nonuniform section (variation) in luminance of the light source is falsely recognized as an image of a measurement object.

The luminance uniformity in the present invention is preferably about 80%, and more preferably 90%, or more, in view of ensuring authentication accuracy of a biometric authentication device.

Regarding the method for measuring the luminance uniformity of the surface light source, for example, the emission luminance distribution of the surface light source is measured using a spectral radiation luminance meter (CS-1000) manufactured by Konica Minolta, Inc., as described in, for example, JP 2007-265850A and JP 2009-21336A.

Specifically, driving/light emission is made in a condition that the emission luminance of the surface light source (for example, organic EL element) is 1000 $cd/cm^2$, a light-emitting surface is divided into micro regions, for example, 2 to 5 mm squares, the luminance in each region is measured to determine the minimum luminance ($cd/cm^2$) and the maximum luminance ($cd/cm^2$), and the luminance uniformity is evaluated using the following expression (1).

Luminance uniformity (%)[=Minimum luminance ($cd/cm^2$) on light-emitting surface/Maximum luminance ($cd/cm^2$) on light-emitting surface]× 100 Expression (1)

Examples of the method for further enhancing the luminance uniformity of the surface light source in the present invention include an increase in number of feeding points in an electrode, formation of an electrode in a grid shape, placement of an anode and a cathode at a location so that the distance therebetween is minimum, and production of the surface light source according to not vapor deposition but a coating method. It is preferable to appropriately select from these techniques or to combine a plurality thereof.

[Authentication Device]

The authentication device of the present invention includes the light-emitting member. The authentication device of the present invention serves as an authentication device that performs authentication of an object by use of various techniques, and examples include an imaging device that reads and authenticates an image, and a mobile apparatus such as a portable phone, an automatic teller machine, a display, a facsimile, a scanner, and a combined machine, each including the imaging device mounted therein. Since a high-accuracy authentication technique has been demanded in a recent information society, studies about biometric authentication (biometrics) have been actively made. Biometric authentication involves recognition of an individual by collecting biological features (any action and a portion of an organism) of the individual, and measuring and determining the degree of similarity as compared with feature data registered in advance.

Examples of biological information include palm and finger veins, fingerprint, a palm shape, iris, retina, face, handwriting, sound, and smell. In particular, authentication using vein (vein authentication device) particularly attracts attention in terms of scotomas, for example, in view of a reduction in size, no risk of theft, and high security.

Vein authentication is an authentication method utilizing the property of absorption of near-infrared light by reduced hemoglobin flowing in the vein, and the light source for use in the authentication device is a near-infrared light source and is more preferably one having a maximum light emission around 850 nm. Vein authentication involves authentication by irradiating the fingertip with rear-infrared light, and matching the resulting image including a shadow of a vein portion to the data registered in advance. A vein authentication system enables high-speed processing because of a small amount of data to be extracted, and it also enables visual confirmation only by irradiation with near-infrared light, and therefore less causes fabrication or theft as compared with fingerprint authentication as a technique in which the same section of an organism is authenticated. Furthermore, such a vein authentication system is excellent also in that a vein pattern, which is information present in an organism, is insusceptible to external influence and is not semipermanently changed, and also in that there are very few misfits.

The vein authentication device specifically includes, for example, alight source that emits near-infrared light, a controller that regulates the light source, an imager that detects transmitted light or reflected light from the fingertip to obtain an image, an authentication member that performs image processing, a memory that stores and registers the data extracted, and a computer that performs matching to the data registered.

Current vein authentication, in which irradiation is generally made using a plurality of point light sources such as light emitting diodes (LEDs), causes the variation in luminance due to arrangement of a plurality of LEDs, which are point light sources loving emitters with spherical shapes, and results in decrease in the rate of recognition of the resulting imaging. Furthermore, the respective amounts of light of LEDs are not originally uniform strictly, and thus a controller that adjusts the amount of irradiation light is demanded to have a complicated system. In a preferable embodiment of the biometric authentication device of the present invention, a surface light source having luminance uniformity, more specifically, an OLED, is used as a light source In a case where such a surface light source is used for the vein authentication device, the surface light source is preferably in a rectangular form of 40 mm×10 mm, for example.

The authentication device of the present invention can be mounted on various apparatuses, and, in ore feature, can be mounted on a wristband-type electronic apparatus.

The wristband-type electronic apparatus of the present invention is an apparatus that can send biometric authentication information by wireless communication, and examples thereof include, not particularly limited to, a bracelet, a wristwatch, a smart watch, and a wristwatch-type smart phone.

In a preferable mode of the wristband-type electronic apparatus of the present invention, the wristband-type electronic apparatus includes a light source and an imager, wherein the light source is in any location on a wristband, and when worn, the location of the light source is on a plane other than the plane on which the imager is located. Since the light source is on any location on a wristband, the location being on a plane other than the plane on which the imager is located when worn, any influence of biological information unnecessary for authentication from reflected light on the surface of an organism can be reduced and biological information with near-infrared light scattered on such an organism can be received, thereby facilitating vein imaging. The site of the wrist to be imaged is not particularly limited, and vein imaging outside or inside of the wrist is suitable for authentication.

The location of the light source is not limited as long as it is any location on a wristband and on a plane other than the plane on which an imager is located when worn. In view of a more reduction in influence of biological information unnecessary for authentication, for example, an angle among three points, specifically, the central point of the imager, the central point of the light source, and the central point of a cross section of the wrist, is preferably in a range from 30 to 180 degrees, further preferably in a range from 45 to 180 degrees, and particularly preferably in a range from 90 to 180 degrees.

The number of the light sources is not particularly limited, and is preferably within a range from 1 to 3 in view of power consumption.

The imager is not particularly limited, and a wide angle camera is preferably used in order to photograph a vein pattern at a wide angle.

<<Biometric Device>>

A biometric device is currently an essential apparatus for use in a daily health care and a medical setting in society. On the other hand, compatibility with QOL (also referred to as "quality of life". "life quality", or "living quality".) is a challenge to be achieved because there is a need for wearing of a sensor on the body.

The light-emitting member of the present invention emits light in a region corresponding to a "biological window", and is suitable for mounting on a biometric device.

A biometric device including the light-emitting member of the present invention is not particularly limited, and examples include a pulse oximeter and a pulse wave sensor. A pulse oximeter enables measurement of the blood oxygen level by use of two wavelengths of near-infrared light and red light.

A pulse oximeter and a pulse wave sensor in a medical setting are each generally worn on the fingertip, resulting in deterioration in QOL of a hospital patient or the like. A pulse oximeter and a pulse wave sensor including the light-emitting member of the present invention each include the surface light source, and it thus enables sensing of a thick bone site (the wrist and/or the finger root), which has been difficult to perform by a conventional point light source, and can remove the burden on the fingertip. The reason for this is not clear, but is presumed as follows.

Figure 5A:
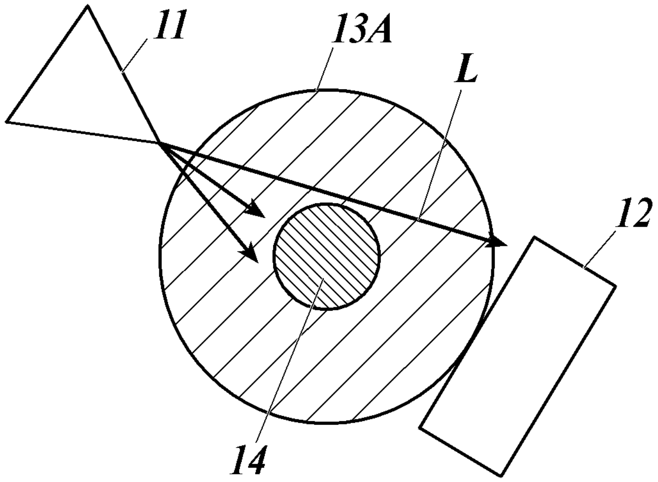
FIG. 5A A schematic view illustrating an example of transmissive sensing on the fingertip by use of a point light source.
Figure 5B:
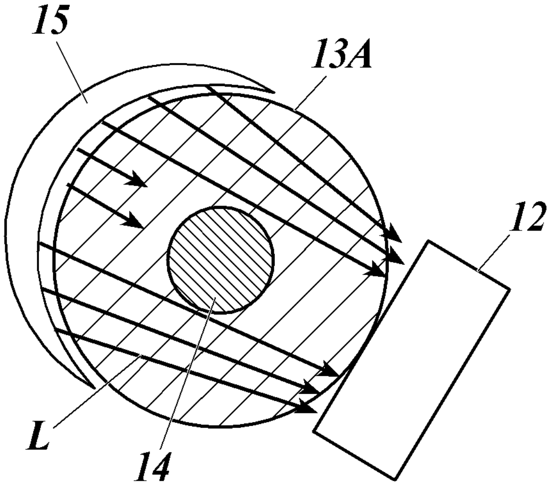
FIG. 5B A schematic view illustrating an example of transmissive sensing on the fingertip by use of a surface light source.
Figure 5C:
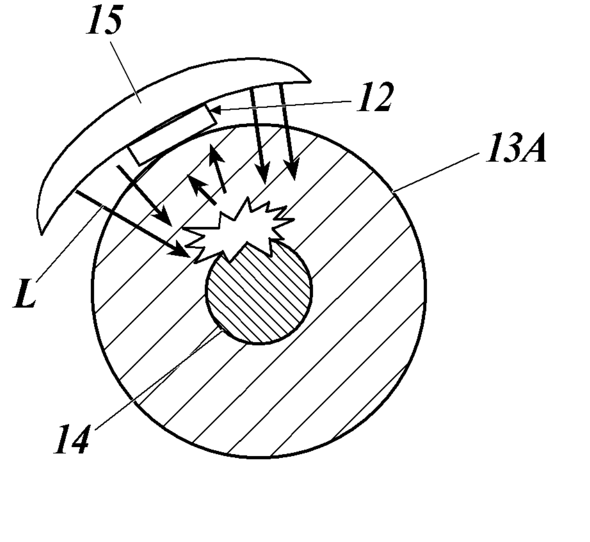
FIG. 5C A schematic view illustrating an example of reflective sensing on the fingertip by use of a surface light source.

FIG. 5A to FIG. 5C am each a schematic view illustrating an example of sensing of the fingertip with the point light source or the surface light source in the light-emitting member.

FIG. 5A illustrates transmissive sensing of the fingertip by a conventional point light source 11. Since a bone 14 of a fingertip 13A is thin, even light L from the point light source 11 passes through an organism and reach a sensor 12.

FIG. 5B illustrates transmissive sensing of the fingertip by a surface light source 15 in the present invention. The surface light source 15 in the present invention is large in light-emitting surface area and is not strong in directionality of light L, and thus restriction of alignment between the surface light source 15 and the sensor 12 is dramatically eased to thereby stably allow light L to pass through an organism and reach the sensor 12.

FIG. 5C illustrates reflective sensing of the fingertip with the surface light source 15 in the present invention. The surface light source 15 in the present invention is large in light-emitting surface area and is not strong in directionality of light L. and thus scattering of light L in an organism is promoted to thereby stably allow light L to be reflected in such an organism and reach the sensor 12.

Figure 6A:
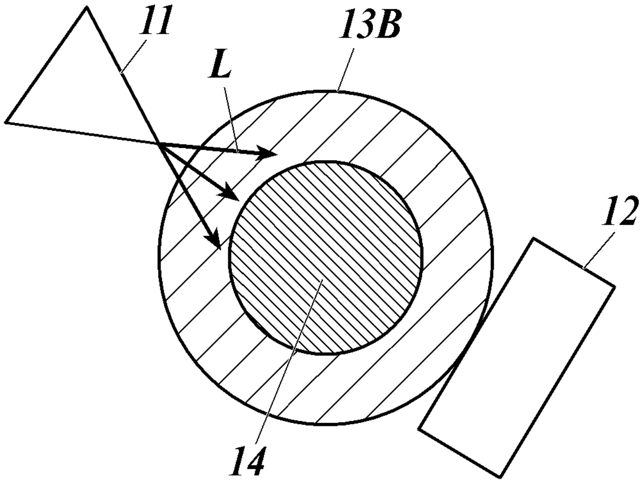
FIG. 6A A schematic view illustrating an example of transmissive sensing on the finger root by use of a point light source.
Figure 6B:
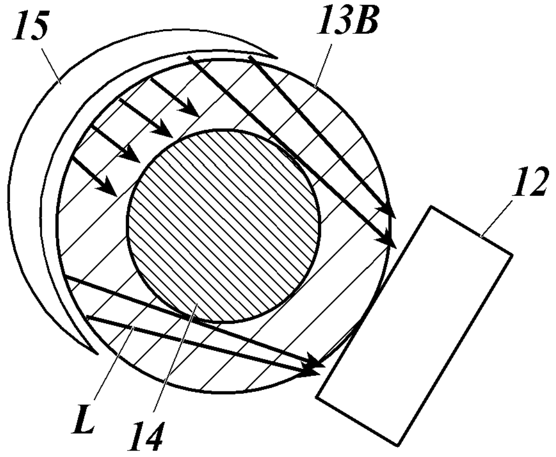
FIG. 6B A schematic view illustrating an example of transmissive sensing on the finger root by use of a surface light source.

FIG. 6A and FIG. 6B are each a schematic view illustrating an example of sensing on the finger root with the point light source or the surface light source in the light-emitting member.

FIG. 6A illustrates sensing using a conventional point light source 11. As illustrated in FIG. 6A, the conventional point light source 11 is not only small in light-emitting surface area, but also strong in directionality of light L, on a finger root 13B. Thus light L is often shielded by a bone 14 and alignment between the point light source 11 and a sensor 12 is restricted in an extremely narrow region, to thereby make stable sensing difficult.

On the other hand, in the case of sensing on the finger root with a surface light source 15 in the present invention, as illustrated in FIG. 6B, the light source is large in light-emitting surface area and is not strong in directionality of light L. and thus restriction of alignment between the surface light source 15 and a sensor 12 is dramatically eased to thereby stably allow light L to pass through an organism and reach the sensor 12.

FIG. 7A to FIG. 7D are each a schematic view illustrating an example of sensing on the wrist with the point light source or the surface light source.

Figure 7A:
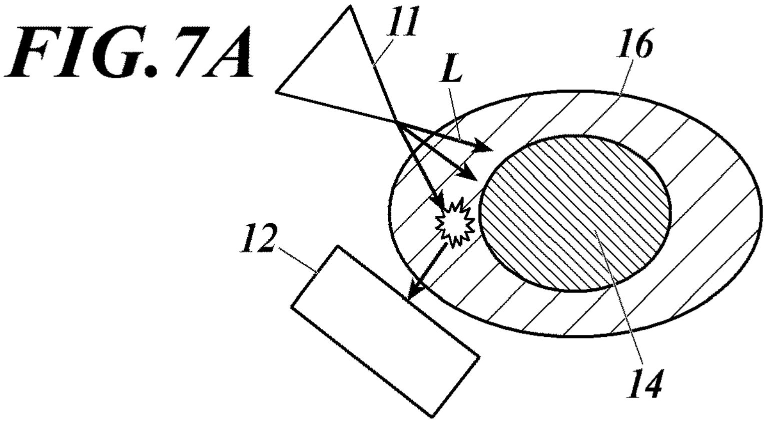
FIG. 7A A schematic view illustrating an example of V-shaped sensing on the wrist by use of a point light source.
Figure 7B:
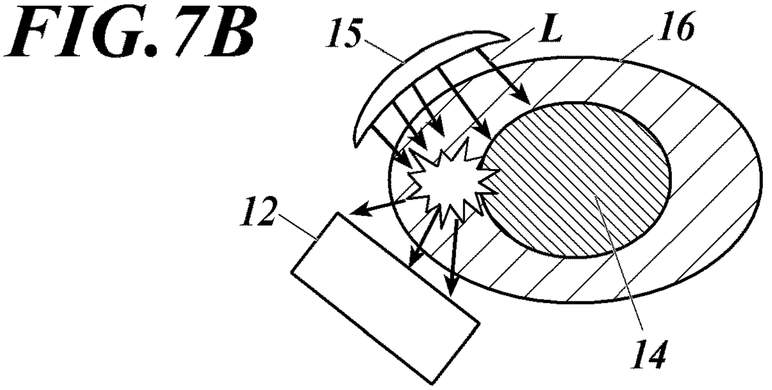
FIG. 7B A schematic view illustrating an example of V-shaped sensing on the wrist by use of a surface light source.
Figure 7C:
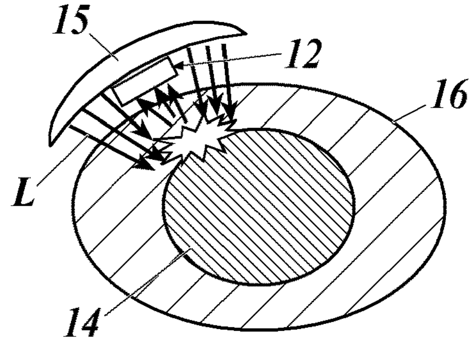
FIG. 7C A schematic view illustrating an example of reflective sensing on the wrist by use of a surface light source.
Figure 7D:
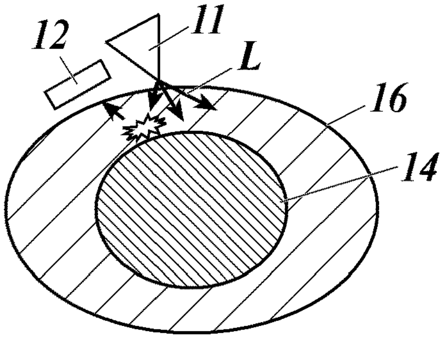
FIG. 7D A schematic view illustrating an example of reflective sensing on the wrist by use of a point light source.

V-shaped sensing of the wrist in FIG. 7A and reflective sensing of the wrist in FIG. 7D each use a conventional point light source 11, and a problem is that directionality of light L is strong and that thus scattering of light L in an organism is insufficient to fail to obtain an amount of light sufficient for sensing. On the other hand, V-shaped sensing of the wrist illustrated in FIG. 7B, which is according to a surface light source 15 as the light-emitting member of the present invention, can allow light L to penetrate into an organism at a large area to thereby activate light scattering in such an organism, thereby allowing biological information to be obtained in an amount of light necessary for sensing. Also reflective sensing of the wrist illustrated in FIG. 7C can again obtain the same effect as in FIG. 7B.

EXAMPLES

Hereinafter, the present invention will be specifically described with reference to Examples, but the present invention is not intended to be limited thereto. Unless particularly noted. "%" and "part(s)" mean "% by mass" and "part(s) by mass", respectively.

Example 1: Wavelength Conversion Film

<Production of Wavelength Conversion Film 1-1>

Figure 3:
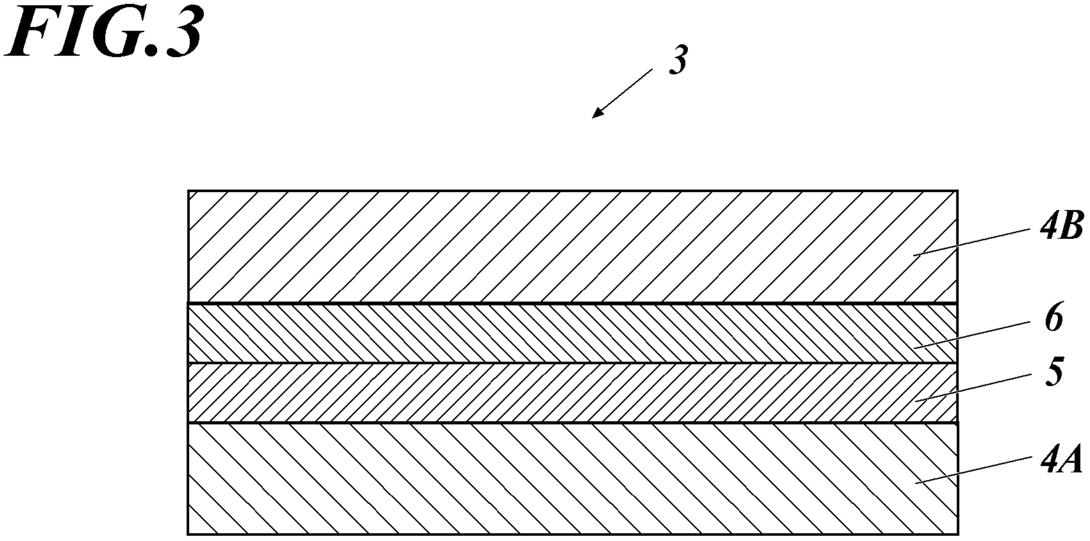
FIG. 3 A schematic cross-sectional view illustrating a configuration example of the wavelength conversion film of the present invention, including a sealed structure.

Wavelength conversion film 1-1 having a configuration illustrated in FIG. 3 was produced according to the following method.

Into a toluene solution in an eggplant flask were added 14.82% of polystyrene (manufactured by ACROS ORGANICS B.V.B.A., weight average molecular weight Mw=260000) and 0.18% of dye A-1 as a first dye (both the percentages were in % by mass in the solution), and the resultant was heated to 80° C. and stirred to be sufficiently dissolved.

Next, the resulting mixed solution was applied onto a gas barrier film with an applicator, dried at room temperature for 10 minutes, and then further heated and dried at 80° C. for 10 minutes to thereby form a light-emitting dye layer. Thereafter, a gas barrier film provided with an adhesive for sealing was provided and attached to the applied surface, and the resultant was subjected to sealing with a vacuum laminator in a heating condition of 90° C. Thereafter, the adhesive was cured by a heating treatment at 110° C. for 30 minutes, thereby producing wavelength conversion film 1-1. The thickness of the resulting film was 40 μm. The concentration of the light-emitting dye in the film after drying was 1.2%.

In FIG. 3, one surface of a light-emitting dye layer (5) is attached to a gas barrier film (4B) with an adhesive layer (6) interposed therebetween, and other surface thereof is attached to a gas barrier film (4A).

<Production of Wavelength Conversion Films 1-2 to 1-7>

Wavelength conversion film 1-2 was produced in the same manner as in the production of wavelength conversion film 1-1 except that dye A-1 as a first dye was changed to exemplary compound 1-1 described above.

Each of wavelength conversion films 1-3 to 1-7 was produced in the same manner as in the production of wavelength conversion film 1-1 except the following: the first dye was changed to each dye in Table I below, a second dye in Table I below was added together with the first dye, and the amounts of the first and second dyes added were 0.03% and 0.15%, respectively, in the solution.

A-1 to A-3 described in Table I are as follows, and respective exemplary compounds are described above. The maximum absorption wavelength of the first dye is shown in the following Table.

[Formula 57]
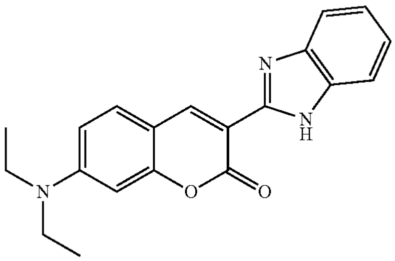
Coumalin 7
A-1
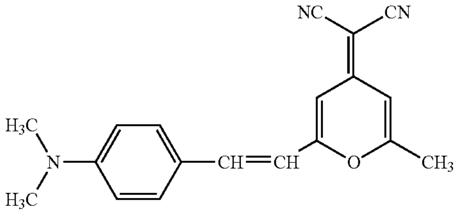
A-2(DCM)
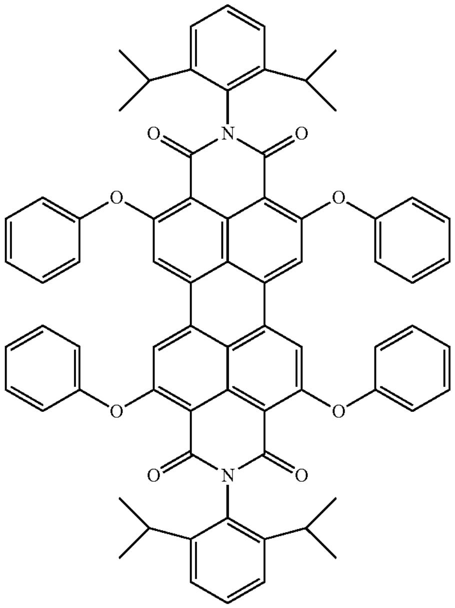
A-3
[Formula 58]
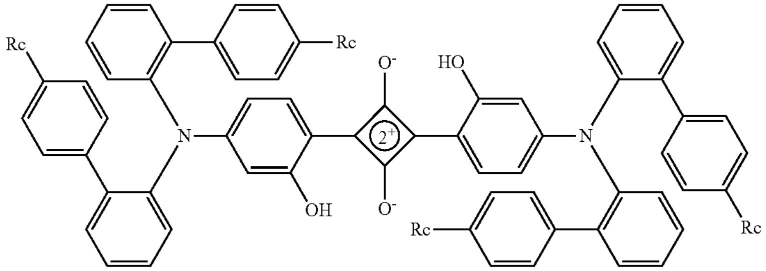
(1a)-1
Rc = n-butyl -continued (1d)-40

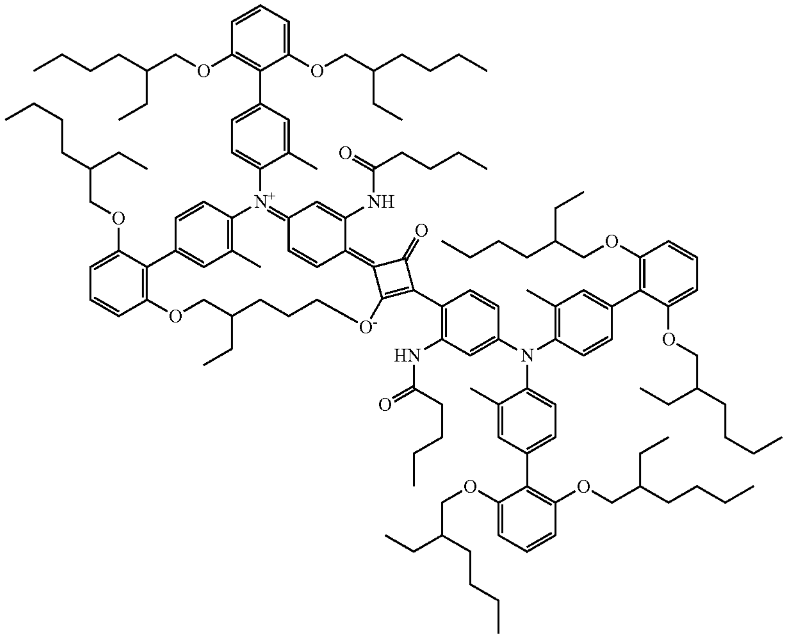

(Preparation of Titanium Oxide Dispersion Liquid)

A titanium oxide dispersion liquid was prepared according to the following method.

Titanium oxide (R-42 manufactured by Sakai Chemical Industry Co., Ltd.) and propylene glycol monomethyl ether were mixed at a mass ratio of 50:50, and stirred using a stirrer, thereby preparing a titanium oxide dispersion liquid.

<Production of Wavelength Conversion Film 1-8>

Wavelength conversion film 1-8 having a configuration illustrated in FIG. 3 was produced according to the following method.

Into a toluene solution in an eggplant flask were added 24.58% of polystyrene (manufactured by ACROS ORGANICS B.V.B.A., weight average molecular weight Mw=260000), 0.13% of exemplary compound (1a)-1 described above as a first dye, 0.05% of exemplary compound (1d)-40 described above as a second dye, and also 0.5% of the titanium oxide dispersion liquid prepared above (all the percentages were in % by mass in the solution), and the resultant was heated to 80° C. and stirred to be sufficiently dissolved.

Next, the resulting mixed solution was applied onto a gas barrier film with an applicator, dried at room temperature for 10 minutes, and then further heated and stirred at 80° C. for 10 minutes to thereby form a light-emitting dye layer. Thereafter, a gas barrier film provided with an adhesive for sealing was provided and attached to the applied surface, and the resultant was subjected to sealing with a vacuum laminator in a heating condition of 90° C. Thereafter, the adhesive was cured by a heating treatment at 110° C. for 30 minutes, thereby producing wavelength conversion film 1-8. The thickness of the resulting film was 80 μm. The concentration of the light-emitting dye in the film after drying was 1.2%.

In FIG. 3, one surface of a light-emitting dye layer (5) is attached to a gas barrier film (4B) with an adhesive layer (6) being interposed therebetween, and other surface thereof is attached to a gas barrier film (4A).

<Production of wavelength conversion film 1-9>

Wavelength conversion film 1-9 was produced in the same manner as in the production of wavelength conversion film 1-8, except that no titanium oxide dispersion liquid was added and that the amount of the polystyrene added was 24.83%.

[Evaluation]

The wavelength conversion films obtained above were subjected to evaluation. The results are shown in Table XIV.

<Maximum Light Emission Wavelength ($\lambda_{max}$)>

The wavelength conversion film was subjected to measurement of a light emission spectrum using a spectrofluorophotometer F-7000 (manufactured by Hitachi High-Tech Science Corporation), and the wavelength (wavelength of a peak top) at which a global maximum intensity of light emission was exhibited was defined as the maximum light emission wavelength ($\lambda_{max}$). Evaluation was made according to the following criteria.

AA: the maximum light emission wavelength ($\lambda_{max}$) was 750 nm or more and 1400 nm or less BB: the maximum light emission wavelength ($\lambda_{max}$) was 700 nm or more and less than 750 nm DD: the maximum light emission wavelength ($\lambda_{max}$) was less than 700 nm <Weather Resistance>

The weather resistance was evaluated on the surface of the wavelength conversion film using a super xenon weather meter (SX120, manufactured by Suga Test Instruments Co., Ltd.) in conditions of an amount of light of 100 W/$m^2$ (300 to 400 nm), a black panel temperature of 63° C., a humidity of 90%, and a test time of 100 hours, and the change in maximum light emission wavelength before and after the test was observed. Evaluation was made according to the following criteria.

BB: no change in intensity of light emission was observed

CC: the rate of reduction in intensity of light emission was within 5%

DD: the rate of reduction in intensity of light emission was more than 5%

TABLE 14

Table XIV

| Wavelength conversion film No. | Light-emitting dye First dye | Second dye | Maximum absorption wavelength [nm] of first dye | Maximum light emission wavelength $\lambda_{max}$ | Weather resistance | Note |
|---|---|---|---|---|---|---|
| 1-1 | A-1 | — | 440 | DD | DD | Comparative Example |
| 1-2 | 1-1 | — | 680 | BB | CC | Comparative Example |
| 1-3 | A-2 | A-3 | 460 | DD | CC | Comparative Example |
| 1-4 | 1-2 | 2-4 | 655 | AA | BB | Inventive Example |
| 1-5 | 1-2 | 2-6 | 655 | AA | BB | Inventive Example |
| 1-6 | 1-1 | 2-4 | 680 | AA | BB | Inventive Example |
| 1-7 | 1-3 | 2-4 | 640 | AA | BB | Inventive Example |
| 1-8 | (1a)-1 | (1d)-40 | 680 | AA | BB | Inventive Example |
| 1-9 | (1a)-1 | (1d)-40 | 680 | AA | BB | Inventive Example |

As shown in the above results, it was found that the wavelength conversion films of Inventive Examples were excellent in weather resistance as compared with the wavelength conversion films of Comparative Examples.

Example 2: Light-Emitting Member

<Production of Organic EL Element A>

Bottle emission type organic EL element A was produced by layering anode/hole injection layer/hole transport layer/light emission layer/electron transport layer/electron injection layer/cathode on a substrate and performing sealing, according to the following procedure.

(Formation of Anode)

First, a gas barrier layer of an inorganic substance $SiO_x$ was formed so as to have a thickness of 500 m on the entire surface of a polyethylene naphthalate film (manufactured by Teijin DuPont Films Inc., hereinafter, abbreviated as "PEN".), the surface being a surface on which an anode was to be formed, using an atmospheric pressure plasma discharge treatment device configured as described in JP 2004-68143A. Thus, a flexible substrate (gas barrier film) was produced which had gas barrier properties, and specifically, had a rate of oxygen permeability of 0.001 mL/($m^2$·24 h·atm) or less and a rate of water vapor permeability of 0.001 g/($m^2$·24 h) or less.

Thereafter, a film of ITO ($In_2O_3$:$SnO_2$=90:10 (ratio in % by mass)) was formed according to a sputtering method so as to have a thickness of 150 nm, and patterning was performed, thereby forming an anode. The pattern was made so that the area of a light-emitting region was 10 mm×40 mm. Subsequently, the resultant was subjected to ultrasonic cleaning with isopropyl alcohol, then dried with dry nitrogen gas, and subjected to UV ozone cleaning for 5 minutes.

(Formation of Organic Functional Layer Group)

The anode produced according to the above method was dried in a glove box at a dew point of −80° C. or less and an oxygen level of 1 ppm or less, and then transferred into a vacuum evaporation device. The constituent material for each organic functional layer described below was packed in an amount necessary for production of an organic EL element, into a crucible (made of a material for resistive heating, made of molybdenum or tungsten) of the vacuum evaporation device.

<Formation of Hole Injection Layer>

The inside of the vacuum evaporation device was depressurized to $1\times10^{-4}$ Pa, and compound HIL-1 (MTDATA) was deposited at a rate of deposition of 0.1 nm/sec, thereby forming a hole injection layer (hereinafter, designated as HIL) having a thickness of 15 nm on the anode.

<Formation of Hole Transport Layer>

Next, compound HTL-1 (α-NPD) described below was deposited on HIL, thereby forming a hole transport layer (HTL) having thickness of 30 nm.

<Formation of Red Phosphorescent Emission Layer>

Subsequently, respective heating boats receiving compound H-1 as a light-emitting host and compound DP-1 as a dopant were independently energized to adjust the ratio between the deposition rates of H-1 and DP-1 at 100:6, thereby forming a red phosphorescent emission layer (EML) having a thickness of 20 nm.

<Formation of Electron Transport Layer>

Next, the heating boat receiving tris(8-hydroxyquinolinate)aluminum ($Alq_3$) was energized and heated, and deposition was made at a rate of deposition of 0.1 nm/sec, thereby forming an electron transport layer (ETL) having a thickness of 25 nm on EML.

<Formation of Electron Injection Layer>

Next, LiF was deposited at a rate of deposition of 0.1 nm/sec, thereby forming an electron injection layer (EIL) having a thickness of 1 nm.

(Formation of Cathode)

Subsequently, aluminum was deposited to a thickness of 70 nm, thereby forming a cathode.

(Formation of sealed structure)

Next, a sealing substrate was adhered onto the cathode of the obtained layered article including the anode to the cathode, using a commercially available roll lamination device. The sealing substrate was produced by forming an adhesive layer having a thickness of 1.5 μm from a two-packed, reaction-type urethane-based adhesive for dry lamination on aluminum foil having flexibility and having a thickness of 30 μm (manufactured by Toyo Aluminum K.K.), and laminating a polyethylene terephthalate (PET) film having a thickness of 12 μm.

A thermosetting adhesive was uniformly applied with a dispenser onto an adhesion surface (gloss surface) of the aluminum foil of the sealing substrate, thereby forming an adhesion layer having a thickness of 20 μm. The adhesion layer was dried at a reduced pressure of 100 Pa or less for 12 hours. The thermosetting adhesive here used was obtained by mixing the following constituent components (A) to (C).

(A) bisphenol A diglycidyl ether (DGEBA)

(B) dicyandiamide (DICY)

(C) epoxy adduct-based curing accelerator

Next, the sealing substrate was transferred into a nitrogen atmosphere at a dew point temperature of −80° C. or less and an oxygen level of 0.8 ppm, and dried for 12 hours or more, to adjust the water content of the adhesive for sealing to 100 ppm or less.

Finally, the sealing substrate was closely attached to and disposed on the layered article, and the article was closely sealed with the sealing substrate using a pressure roll in conditions of a temperature of 100° C., a pressure of 0.5 MPa, and a device rate of 0.3 m/min, and thereafter subjected to a heating treatment at 110° C. for 30 minutes to thereby cure the adhesive, thereby providing organic EL element A.

The detail of each constituent material for use in production of organic EL element A is as follows.

[Formula 59]

HIL-1

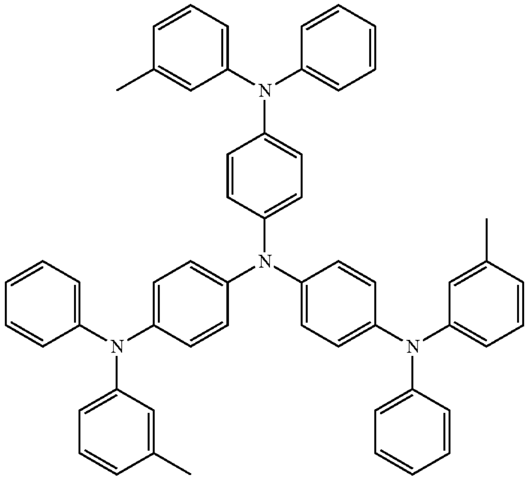

HTL-1

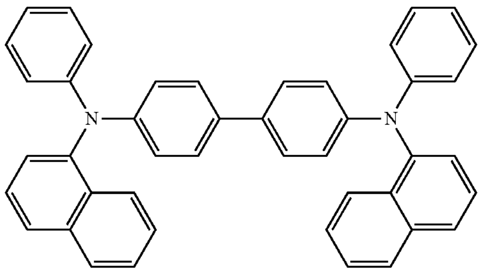

-continued

DP-1

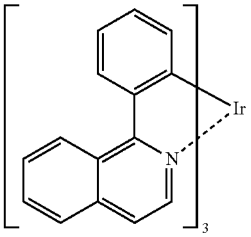

H-1

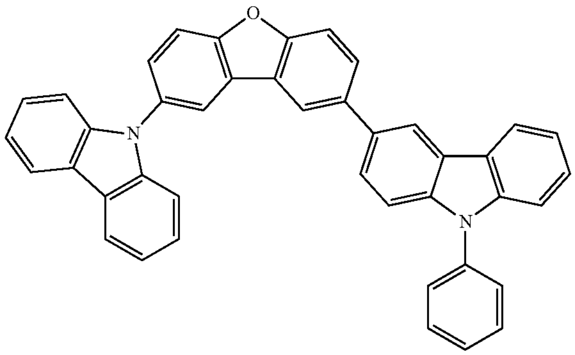

<Production of Light-Emitting Member 2-1>

A member consisting of the surface light source (organic EL element A) produced above was used as light-emitting member 2-1.

<Production of Light-Emitting Members 2-2 to 2-8>

Each of light-emitting members 2-2 to 2-8 configured as illustrated in FIG. 2 was produced by closely attaching the light-emitting surface of organic EL element A as a surface light source, produced above, to a wavelength conversion film described in Table XV below.

[Evaluation]

Light-emitting members 2-1 to 248 obtained above were each subjected to evaluations. The results are shown in Table XV.

<Intensity of Light Emission (Relative Value)>

The light-emitting member was allowed to emit light by application of a current of 10 mA/cm$^2$, a light emission spectrum was measured with the spectrofluorophotometer F-7000 (manufactured by Hitachi High-Tech Science Corporation), and thereafter the intensity of light emission of the light-emitting member at a wavelength of emission of 800 nm was determined. The relative value thereof to the intensity of light emission of light-emitting member 2-3, which was defined as 100, was determined.

TABLE 15

Table XV

| Light-emitting member No. | Light-emitting dye: First dye | Light-emitting dye: Second dye | Maximum absorption wavelength [nm] of first dye | Wavelength conversion film No. | Intensity of light emission (relative value) | Note |
|---|---|---|---|---|---|---|
| 2-1 | — | — | — | — | 0 | Comparative Example |
| 2-2 | A-1 | — | 440 | 1-1 | 0 | Comparative Example |
| 2-3 | 1-1 | — | 680 | 1-2 | 100 | Comparative Example |
| 2-4 | A-2 | A-3 | 460 | 1-3 | 0 | Comparative Example |
| 2-5 | 1-2 | 2-6 | 655 | 1-5 | 180 | Inventive Example |
| 2-6 | 1-3 | 2-4 | 640 | 1-7 | 250 | Inventive Example |
| 2-7 | (1a)-1 | (1d)-40 | 680 | 1-8 | 400 | Inventive Example |
| 2-8 | (1a)-1 | (1d)-40 | 680 | 1-9 | 250 | Inventive Example |

As shown in the above results, it was found that the light-emitting members 2-5 to 2-8 including the wavelength conversion films of Inventive Examples were excellent in intensity of light emission as compared with respective light-emitting members including the wavelength conversion films of Comparative Examples. In particular, it was found that the effect by light-emitting member 2-7 including a titanium oxide particle in the wavelength conversion film was remarkably exerted.

Example 3: Wristband-Type Electronic Apparatus Including Biometric Authentication Devic <Production of Wristband-Type Electronic Apparatus Including Biometric Authentication Device>

Figure 8:
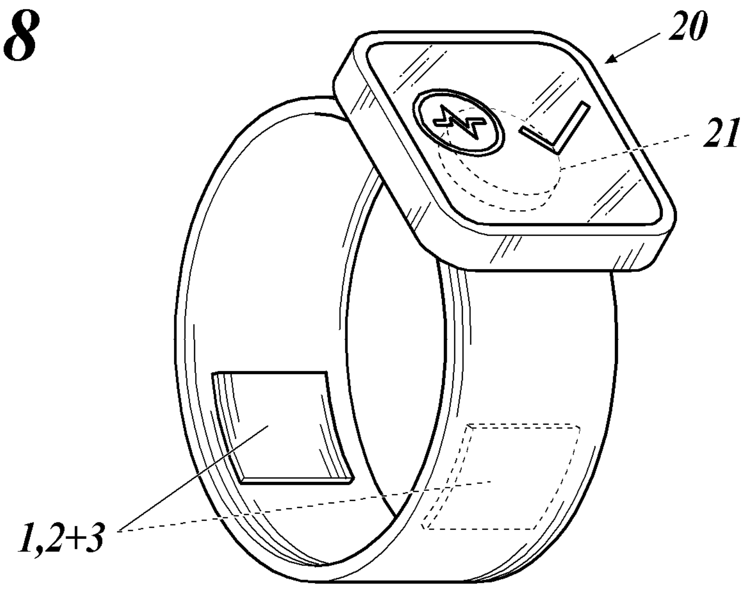
FIG. 8 A perspective view illustrating a configuration example of a wristband-type electronic apparatus.

As illustrated in FIG. 8, a wristband-type electronic apparatus 20 was produced on which a biometric authentication function with wrist vein imaging was mounted. This apparatus included an imager 21 including a camera and a wide-angle lens, which was to be located outside of the wrist, and two light-emitting members 2-7 produced in Example 2 in a location on a wristband, the location being on a plane other than the plane on which the imager was located when worn.

<Imaging with Wristband-Type Electronic Apparatus Including Biometric Authentication Device>

The wristband-type electronic apparatus 20 illustrated in FIG. 8 was worn on the wrist, and a clear vein pattern inherent for an individual was imaged.

Example 4: Biometric Authentication Device Using Fingertip Vein Imaging

<Production of Biometric Authentication Device Using Fingertip Vein Imaging>

A surface light source 15 and a sensor (imager) 12 were disposed so as to face each other with a finger 13A sandwiched therebetween, as illustrated in FIG. 5B, and a device was thus produced which enabled biometric authentication by fingertip vein imaging.

<Imaging with Biometric Authentication Device Using Fingertip Vein Imaging>

The produced biometric authentication device as illustrated in FIG. 5B was used to perform fingertip vein imaging, thereby imaging a vein pattern inherent for an individual.

Example 5: Pulse Oximeter

<Production of wavelength conversion film 1-9>

Wavelength conversion film 1-9 was produced in the same manner as in the production of wavelength conversion film 1-8 except that a red light cut filter 7 was further provided between a light-emitting dye layer 5 and an adhesive layer 6, as illustrated in FIG. 4.

<Production of Light-Emitting Member 2-8>

Light-emitting member 2-8 configured as illustrated in FIG. 1 was produced by closely attaching the light-emitting surface of organic EL element A as a surface light source, which was produced in Example 1, to wavelength conversion film 2-1 produced above.

It was confirmed that light-emitting member 2-8 produced did not radiate red light from organic EL element A and corresponded to an inventive light-emitting member, which emitted light in the near-infrared region.

<Production of Pulse Oximeter>

Light-emitting members 2-1 and 2-8 (disposed at a location indicated by symbol 15) produced in Example 2 were each disposed so that light which penetrated from the light source into the wrist and was scattered was received by a sensor 12 as illustrated in FIG. 7B, thereby producing a pulse oximeter.

(Measurement of Oxygen Saturation with Pulse Oximeter)

The pulse oximeter produced was worn on the wrist, and the oxygen saturation could be measured.

As shown in the above results, the wavelength conversion film of the present invention can be used in combination with the surface light source, thereby providing a light-emitting member that emits light in the near-infrared region. Furthermore, the light-emitting member can also be used as a light source for various authentication devices including the biometric authentication device.

INDUSTRIAL APPLICABILITY

The present invention can be utilized in a wavelength conversion film excellent in light emission in the near-infrared region and in resistance of the film against light and heat, namely, weather resistance. The wavelength conversion film can be utilized in a light-emitting member excellent in weather resistance and excellent in intensity of light emission, as well as an authentication device, a wristband-type electronic apparatus and a biometric device each including the light-emitting member, for example.

REFERENCE SIGNS LIST

1 light-emitting member
2 surface light source
3 wavelength conversion film
4A, 4B gas barrier film
5 light-emitting dye layer
6 adhesive layer
7 red light cut filter
11 point light source
12 sensor
13A fingertip
13B finger root
14 bone
15 surface light source
16 wrist
20 wristband-type electronic apparatus
21 imager
IR near-infrared light
R red light emission
L light

The invention claimed is:

1. A wavelength conversion film comprising at least two or more dyes and absorbing irradiation light to emit light at a longer wavelength than that of the irradiation light, wherein the wavelength conversion film comprises a first dye having a maximum absorption wavelength in a red light region, and a second dye absorbing excitation energy of the first dye to emit light in a near-infrared region.

2. The wavelength conversion film according to claim 1, wherein a maximum light emission wavelength of light in the near-infrared region emitted from the wavelength conversion film is in a range from 700 to 1500 nm.

3. The wavelength conversion film according to claim 1, wherein a maximum light emission wavelength of light in the near-infrared region emitted from the wavelength conversion film is in a range from 750 to 1400 nm.

4. The wavelength conversion film according to claim 1, wherein the first and second dyes are each a squarylium compound.

5. A light-emitting member comprising a surface light source that emits red light, and the wavelength conversion film according to claim 1.

6. The light-emitting member according to claim 5, wherein the surface light source is an organic electroluminescence element.

7. An authentication device comprising the light-emitting member according to claim 5.

8. A wristband-type electronic apparatus comprising the authentication device according to claim 7, wherein the apparatus performs biometric authentication by imaging a wrist vein.

9. The wristband-type electronic apparatus according to claim 8, comprising a light source and an imager, wherein the light source is in any location on a wristband, and when worn, the location is on a plane other than a plane on which the imager is located.

10. A biometric device comprising the light-emitting member according to claim 5.

11. The biometric device according to claim 10, wherein the biometric device is a pulse oximeter for measurement on the wrist or the finger root.

12. The biometric device according to claim 10, wherein the biometric device is a pulse wave sensor for measurement on the wrist or the finger root.

* * * * *